(12) United States Patent
Hatakeyama et al.

(10) Patent No.: US 9,366,963 B2
(45) Date of Patent: Jun. 14, 2016

(54) RESIST COMPOSITION AND PATTERN FORMING PROCESS

(71) Applicant: SHIN-ETSU CHEMICAL CO., LTD., Tokyo (JP)

(72) Inventors: Jun Hatakeyama, Joetsu (JP); Masayoshi Sagehashi, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/552,715

(22) Filed: Nov. 25, 2014

(65) Prior Publication Data
US 2015/0147697 A1 May 28, 2015

(30) Foreign Application Priority Data
Nov. 28, 2013 (JP) ................................. 2013-245663

(51) Int. Cl.
*G03F 7/004* (2006.01)
*G03F 7/039* (2006.01)
(Continued)

(52) U.S. Cl.
CPC ............. *G03F 7/0397* (2013.01); *C08F 12/20* (2013.01); *C08F 12/22* (2013.01); *C08F 12/24* (2013.01);
(Continued)

(58) Field of Classification Search
CPC ......... C08L 24/04; C08L 35/00; C08L 35/06; C08L 2/04; C08L 35/063; G03F 7/0045; G03F 7/0046; G03F 7/0388; H01L 21/0271; H01L 21/0274; C08F 220/12; C08F 220/18; C08F 220/26; C08F 220/30; C08F 220/24; C08F 2220/301; C08F 2220/302; C08F 2220/303; C08F 212/08; C08F 222/08
USPC ................. 430/270.1, 913, 322, 325, 329
See application file for complete search history.

(56) References Cited

U.S. PATENT DOCUMENTS 3,626,049 A * 12/1971 Yamamoto et al. ............ 264/182
4,734,453 A *  3/1988 Mullins et al. ................. 524/555
(Continued)

FOREIGN PATENT DOCUMENTS

JP 10-104834 A 4/1998
JP 2003-5353 A 1/2003
(Continued)

OTHER PUBLICATIONS
Translation of JP 2011-237477 (no date).*
(Continued)

*Primary Examiner* — Amanda C Walke
(74) *Attorney, Agent, or Firm* — Westerman, Hattori, Daniels & Adrian, LLP

(57) ABSTRACT

A resist composition comprising a polymer comprising recurring units (a) of formula (1) and having a Mw of 1,000-500,000 as base resin is provided. $R^1$ is H or methyl, X is a single bond or $-C(=O)-O-R^5-$, $R^2$ is a single bond or $C_1-C_4$ alkylene, $R^3$ is $C_2-C_8$ alkylene, $R^4$ is an acid labile group, $R^5$ is a single bond or $C_1-C_4$ alkylene, and $0<a\leq 1.0$. The composition is of dual-tone type in that an intermediate dose region of resist film is dissolved in a developer, but unexposed and over-exposed regions of resist film are insoluble.

(1)

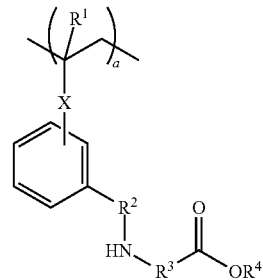

14 Claims, 7 Drawing Sheets

(51) Int. Cl.

| | | |
|---|---|---|
| *G03F 7/20* | (2006.01) | |
| *G03F 7/038* | (2006.01) | |
| *C08F 212/14* | (2006.01) | |
| *C08F 222/12* | (2006.01) | |
| *C08F 222/20* | (2006.01) | |
| *C08F 220/38* | (2006.01) | |
| *C08L 35/00* | (2006.01) | |
| *H01L 21/027* | (2006.01) | |
| *C08F 12/20* | (2006.01) | |
| *C08F 12/22* | (2006.01) | |
| *C08F 12/24* | (2006.01) | |
| *C08F 12/26* | (2006.01) | |
| *C08F 12/32* | (2006.01) | |
| *C09D 125/18* | (2006.01) | |

(52) U.S. Cl.
CPC .............. *C08F 12/26* (2013.01); *C08F 12/32* (2013.01); *C08F 212/14* (2013.01); *C08F 212/145* (2013.01); *C08F 220/38* (2013.01); *C08F 222/12* (2013.01); *C08F 222/20* (2013.01); *C08L 35/00* (2013.01); *C09D 125/18* (2013.01); *G03F 7/0388* (2013.01); *G03F 7/0392* (2013.01); *G03F 7/2002* (2013.01); *G03F 7/2037* (2013.01); *H01L 21/0274* (2013.01); *C08F 2220/387* (2013.01)

(56) References Cited

U.S. PATENT DOCUMENTS

| | | | |
|---|---|---|---|
| 5,442,021 A * | 8/1995 | Heiliger | 526/241 |
| 5,962,185 A * | 10/1999 | Park et al. | 430/270.1 |
| 6,114,082 A | 9/2000 | Hakey et al. | |
| 6,727,034 B1 * | 4/2004 | Ogiso et al. | 430/176 |
| 6,743,565 B2 * | 6/2004 | Mizutani et al. | 430/270.1 |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 7,745,077 B2 * | 6/2010 | Thiyagarajan et al. | 430/14 |
| 7,771,914 B2 | 8/2010 | Hatakeyama et al. | |
| 9,006,381 B2 * | 4/2015 | Imanishi et al. | 528/310 |
| 2008/0020290 A1 * | 1/2008 | Hatakeyama et al. | 430/4 |
| 2008/0090172 A1 | 4/2008 | Hatakeyama et al. | |
| 2011/0247516 A1 * | 10/2011 | Loccufier et al. | 101/483 |
| 2012/0219887 A1 * | 8/2012 | Masunaga et al. | 430/5 |
| 2012/0219888 A1 * | 8/2012 | Masunaga et al. | 430/5 |
| 2012/0282632 A1 | 11/2012 | Chiu et al. | 435/7.23 |
| 2013/0022911 A1 * | 1/2013 | Utsumi et al. | 430/270.1 |
| 2013/0084529 A1 * | 4/2013 | Hatakeyama et al. | 430/285.1 |
| 2013/0302726 A1 * | 11/2013 | Tsuchimura et al. | 430/5 |
| 2014/0212810 A1 * | 7/2014 | Hatakeyama et al. | 430/285.1 |
| 2015/0030983 A1 * | 1/2015 | Hatakeyama et al. | 430/287.1 |

FOREIGN PATENT DOCUMENTS

| | | | |
|---|---|---|---|
| JP | 3429592 B2 | | 7/2003 |
| JP | 2006-45311 A | | 2/2006 |
| JP | 2006-178317 A | | 7/2006 |
| JP | 2008-111103 A | | 5/2008 |
| JP | 2008-122932 A | | 5/2008 |
| JP | 2008-239918 A | | 10/2008 |
| JP | 2011006557 A | * | 1/2011 |
| JP | 2011-102974 A | | 5/2011 |
| JP | 2011237477 A | * | 11/2011 |
| JP | 2012084904 A | * | 4/2012 |
| JP | 2012162728 A | * | 8/2012 |

OTHER PUBLICATIONS

Hsu et al., "Double Exposure Technique for 45nm node and Beyond", Proc. of SPIE, 2005, pp. 59921Q-1-59921Q-16, vol. 5992.

Shibuya et al., "Performance of Resolution Enhancement Technique Using Both Multiple Exposure and Nonlinear Resist", Jpn. J. Appl. Phy., Dec. 1994, pp. 6874-6877, vol. 33, Part 1, No. 12B.

Holmes et al., "Edge Lithography as a Means of Extending the Limits of Optical and Non-Optical Lithographic Resolution", Proc. of SPIE, Mar. 1999, pp. 348-357, vol. 3678.

* cited by examiner

RESIST COMPOSITION AND PATTERN FORMING PROCESS

CROSS-REFERENCE TO RELATED APPLICATION

This non-provisional application claims priority under 35 U.S.C. §119(a) on Patent Application No. 2013-245663 filed in Japan on Nov. 28, 2013, the entire contents of which are hereby incorporated by reference.

TECHNICAL FIELD

This invention relates to a dual-tone resist composition displaying both positive and negative tone responses, more particularly to a chemically amplified dual-tone resist composition comprising a specific polymer, and a pattern forming process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, a self-aligned double patterning (SADP) process involving the steps of forming a resist pattern by ArF lithography, growing a film on opposite sides of pattern features, and forming two pattern features with a half line width from one resist pattern feature is utilized to manufacture 20-nm node devices on a mass scale. One candidate for the microprocessing technology for manufacturing 10-nm node devices of the next generation is a self-aligned quadruple patterning (SAQP) process involving repeating twice the SADP process of ArF lithography patterning. However, the SAQP process is believed very expensive in that formation of sidewall film by CVD and subsequent processing by dry etching must be repeated many times. The EUV lithography of wavelength 13.5 nm is capable of forming a pattern with a 10-nm size via a single exposure step, but suffers from low productivity because the laser power is yet low. As a way out of the deadlock of the miniaturization technology, the development of 3D devices such as vertically stacked flash memories typically BiCS is in progress, but this process is also expensive.

Toward the goal of double resolution, studies are made on the exposure technology and resist material. If first exposure is followed by second exposure at a half-pitch shifted position, the optical energy of second exposure offsets the optical energy of first exposure so that the contrast becomes zero. If a contrast enhancement layer (CEL) is formed on the resist film, the incident light to the resist film becomes nonlinear so that the first and second exposures do not offset each other. Thus an image having a half pitch is formed. See Non-Patent Document 2. It is expected that similar effects are produced by using an acid generator capable of two photon absorption to provide a nonlinear contrast. Using this double imaging method, the resolution can be doubled through two exposure steps and a single development.

A resist material having both positive and negative properties has been proposed. This resist material displays the positive tone response that it is substantially insoluble in alkaline developer where it receives a low exposure dose, but increases its alkaline dissolution rate as the exposure dose is increased, and the negative tone response that it starts reducing its alkaline dissolution rate as the exposure dose is further increased. Lithographic processing of such a positive/negative resist material can produce a resolution twice that of the mask pattern since those portions of resist film having received low and high exposure doses are left after development. Known positive/negative resist materials include a positive/negative hybrid resist composition obtained by adding a crosslinker to a positive resist material as described in Patent Document 1 and Non-Patent Document 3, and a positive/negative hybrid resist composition utilizing competitive positive and negative reactions in the co-presence of a benzyl alcohol and an acetal acid labile group as described in Patent Document 2. Patent Document 3 discloses a positive/negative hybrid resist composition having both an acid generator and a base generator added thereto. As the exposure dose increases, the acid generator having a high generation efficiency generates acid so that positive response manifests via deprotection, whereas a region receiving an increased exposure dose displays negative response because the base generator having a low generation efficiency generates an amount of base surpassing the amount of acid so that deprotection reaction may not occur.

The positive/negative hybrid dual-tone resist composition permits a pattern to be formed at a double resolution by an ordinary process involving single exposure and single development.

CITATION LIST

Patent Document 1: U.S. Pat. No. 6,114,082 (JP-A H10-104834)
Patent Document 2: JP-A 2003-005353
Patent Document 3: JP-A 2011-102974
Non-Patent Document 1: Proc. SPIE Vol. 5992, 59921Q-1-16 (2005)
Non-Patent Document 2: Jpn. J. Appl. Phy. Vol. 33 (1994) p 6874-6877
Non-Patent Document 3: Proc. SPIE Vol. 3678, p 348 (1999)

SUMMARY OF INVENTION

An object of the invention is to provide a resist composition which is an effective dual-tone resist material having both positive and negative tone responses, and forms, after exposure and development, a pattern at a high resolution surpassing prior art dual-tone resist materials, with minimal edge roughness (LER, LWR), and of good profile, especially a resist composition comprising a polymer which is an appropriate base resin for chemically amplified dual-tone resist material, and a pattern forming process using the same.

Seeking for a dual-tone resist material featuring a high sensitivity, high resolution and minimal edge roughness, the inventors have found that better results are obtained when a polymer comprising recurring units that increases solubility in alkaline developer as a result of formation of carboxyl groups via acid-induced deprotection reaction, but decreases an alkaline dissolution rate as a result of extinction of carboxyl groups via acid-aided lactam cyclization is used as a base resin in a dual-tone resist material, especially a chemically amplified dual-tone resist material.

For the purpose of suppressing acid diffusion to improve dissolution contrast, it is effective to use a polymer comprising recurring units having the general formula (1), defined below, as a base resin in a dual-tone resist material, especially a chemically amplified dual-tone resist material. The resulting dual-tone resist material, especially chemically amplified dual-tone resist material has many advantages including a significantly high contrast of alkaline dissolution rate before and after exposure, acid diffusion suppressing effect, high resolution, and pattern formation of satisfactory profile and edge roughness after exposure, and is thus best suited as a micropatterning material for the fabrication of VLSI and photomasks.

The dual-tone resist composition of the invention has a satisfactory effect of suppressing acid diffusion and a high resolution, lends itself to the lithography process, and forms a pattern of good profile and minimal edge roughness after exposure. Because of these advantages, the composition is readily implemented in practice and best suited as a VLSI-forming resist material and mask pattern forming material.

In one aspect, the invention provides a resist composition comprising a polymer comprising recurring units (a) of the general formula (1) and having a weight average molecular weight of 1,000 to 500,000 as base resin.

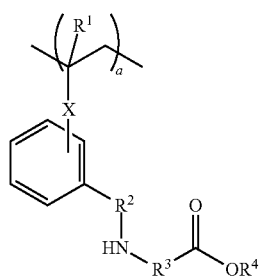

(1)

Herein $R^1$ is hydrogen or methyl, X is a single bond or —C(=O)—O—$R^5$—, $R^2$ is a single bond or $C_1$-$C_4$ alkylene group, $R^3$ is a linear $C_2$-$C_8$ alkylene group, $R^4$ is an acid labile group, $R^5$ is a single bond or $C_1$-$C_4$ alkylene group, and a is in the range: $0 < a \leq 1.0$.

In a preferred embodiment, the polymer further comprises recurring units of at least one type selected from the group consisting of a vinylnaphthalene (b1), indene (b2), acenaphthylene (b3), chromone (b4), coumarin (b5), norbornadiene (b6), and vinylcarbazole (b7), as represented by the general formula (2).

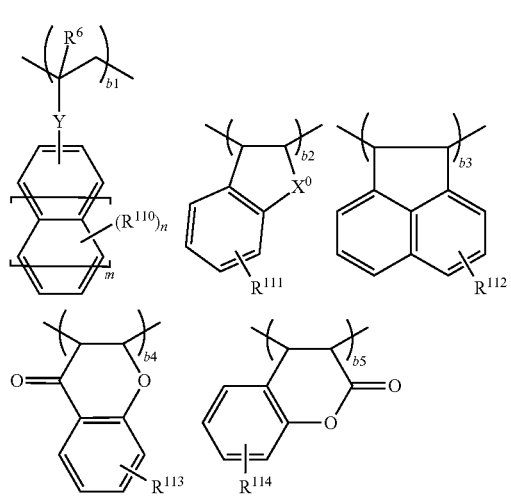

(2)

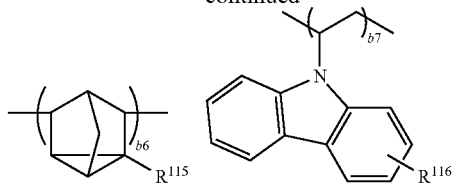

Herein $R^6$ is hydrogen or methyl, m is an integer of 0 to 2, n is an integer of 0 to 5, $R^{110}$ to $R^{116}$ are each independently hydrogen, $C_1$-$C_{30}$ alkyl, partially or entirely halo-substituted alkyl (the alkyl and halo-substituted alkyl optionally having an alkyl-substituted or unsubstituted hydroxyl or carboxyl group), hydroxyl, $C_1$-$C_4$ alkoxy, acyl, acyloxy, alkoxycarbonyl, $C_6$-$C_{10}$ aryl, halogen, or 1,1,1,3,3,3-hexafluoro-2-propanol group, Y is a single bond, —O—, —S—, —C(=O)—O—$R^7$—, or —C(=O)—NH—$R^7$—, $R^7$ is a single bond or $C_1$-$C_4$ alkylene group, $X^0$ is methylene, oxygen or sulfur atom; b1 to b7 are numbers in the range: $0 \leq b1 < 1.0$, $0 \leq b2 < 1.0$, $0 \leq b3 < 1.0$, $0 \leq b4 < 1.0$, $0 \leq b5 < 1.0$, $0 \leq b6 < 1.0$, $0 \leq b7 < 1.0$, $0 < b1+b2+b3+b4+b5+b6+b7 < 1.0$, $0 < a < 1.0$, and $0 < a+b1+b2+b3+b4+b5+b6+b7 \leq 1.0$.

The resist composition may further comprise an organic solvent and an acid generator, the composition being a chemically amplified resist composition. The resist composition may further comprise a basic compound and/or a surfactant.

In a preferred embodiment, the resist composition forms a resist film which is subjected to exposure and development, the composition displaying both positive and negative tone responses, that is, being of dual-tone type in that an intermediate dose region of the resist film is dissolved in a developer, but low and high dose regions of the resist film are left after development.

In another aspect, the invention provides a pattern forming process comprising the steps of applying the resist composition defined above onto a substrate, prebaking the composition to form a resist film, exposing the resist film to high-energy radiation, and developing in a developer.

In a preferred embodiment, the high-energy radiation is g-line of wavelength 430 nm, i-line of 365 nm, KrF excimer laser of 248 nm, electron beam (EB), or soft X-ray in a wavelength range of 3 to 15 nm. Typically, the developer is an alkaline developer.

The dual-tone resist compositions, especially chemically amplified dual-tone resist compositions are used not only in the lithography for semiconductor circuit formation, but also in the formation of mask circuit patterns, micro-machines, and thin-film magnetic head circuits.

Advantageous Effects of Invention

The resist composition of the invention has such characteristics that an unexposed region and an over-exposed region are not dissolved in alkaline developer, and only an intermediate exposure dose region is dissolved in alkaline developer. With this pattern forming process, the resolution is doubled via single exposure and single development by splitting a single line into two lines. Further, the resist composition is less likely to swell in the developer than the dual-tone resist materials of crosslinking type, and is thus less likely to pattern collapse. A satisfactory effect of suppressing acid diffusion leads to a high resolution. The dual-tone resist composition, typically chemically amplified dual-tone resist composition is best suited as a micropatterning material by lithography processes using radiation or EB for the microfabrication of VLSI or photomasks.

BRIEF DESCRIPTION OF DRAWINGS

FIG. 1A shows a laminate of substrate, processable layer, hard mask and resist film, FIG. 1B shows the resist film being exposed, FIG. 1C shows the resist film being developed, FIG. 1D shows the hard mask being etched, and FIG. 1E shows the processable layer being etched.

DESCRIPTION OF EMBODIMENTS

Figure 1A:
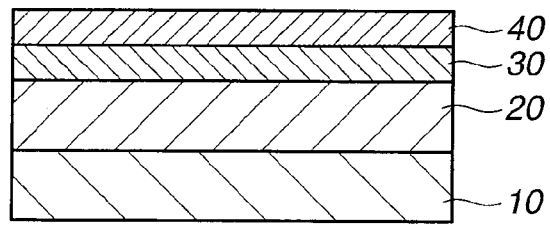
FIG. 1A-FIG. 1E are cross-sectional views of a patterning process according one embodiment of the invention.
Figure 1B:
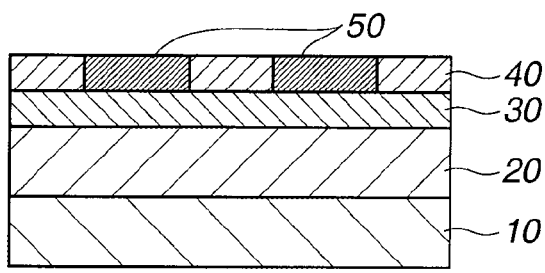
Figure 1C:
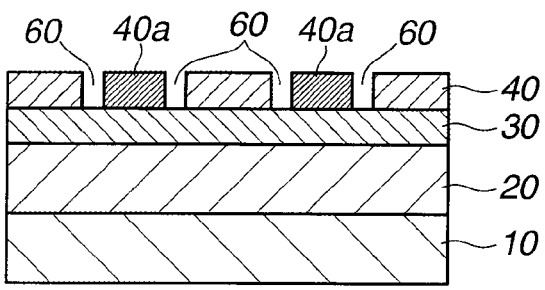
Figure 1D:
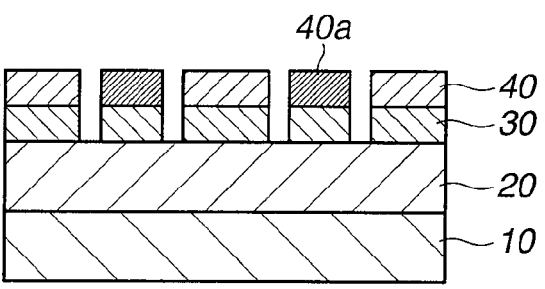
Figure 1E:
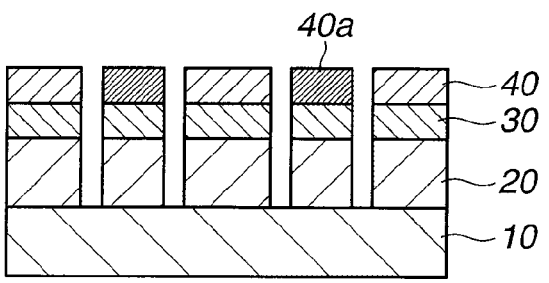

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The term "film" is used interchangeably with "coating" or "layer." The term "processable layer" is interchangeable with patternable layer and refers to a layer that can be processed such as by etching to form a pattern therein.

The abbreviations and acronyms have the following meaning.

PAG: photoacid generator
Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide One embodiment of the invention is a resist composition comprising a polymer comprising recurring units (a) of the general formula (1) as base resin.

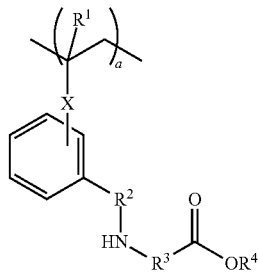

(1)

Herein $R^1$ is hydrogen or methyl, X is a single bond or $-C(=O)-O-R^5-$, $R^2$ is a single bond or $C_1$-$C_4$ alkylene group, $R^3$ is a linear $C_2$-$C_8$ alkylene group, $R^4$ is an acid labile group, $R^5$ is a single bond or $C_1$-$C_4$ alkylene group, and a is in the range: $0<a\leq1.0$.

As shown by the reaction scheme below, the recurring unit (a) ensures that the acid labile group $R^4$ is deprotected under the action of acid to generate a carboxyl group. In the sense that the dissolution rate in alkaline developer is increased by this deprotection reaction, the resist film becomes of positive tone. Subsequently, the acid causes cyclization to form lactam. In the sense that the alkaline dissolution rate is reduced by this cyclization, the resist film becomes of negative tone.

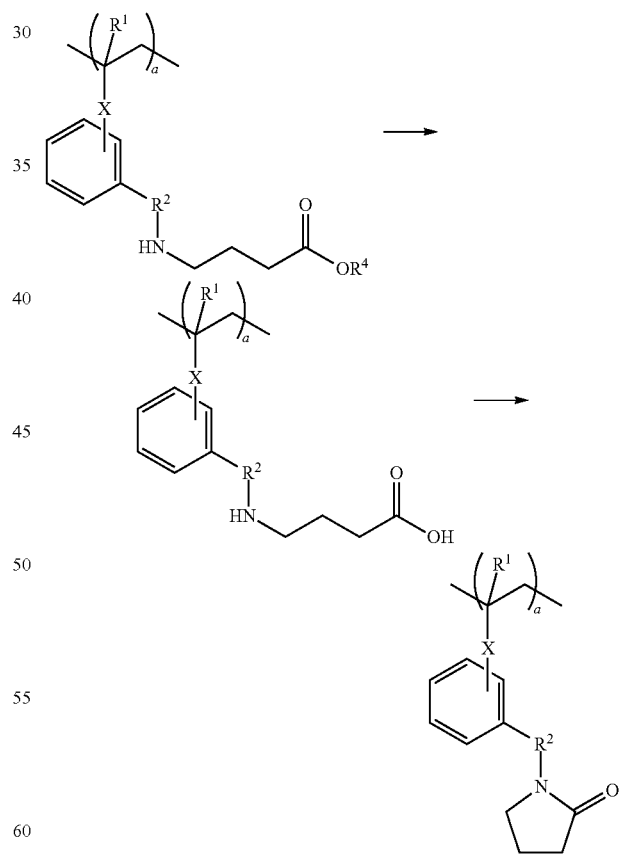

The rate of cyclization reaction may be controlled by the length of alkylene group $R^3$. In case where the alkylene group $R^3$ is propylene, a 5-membered ring is formed, and the reaction rate is the fastest. In case where the alkylene group $R^3$ is ethylene, a 4-membered ring is formed, and in case where the alkylene group $R^3$ is butylene, a 6-membered ring is formed, and in these cases, the reaction rate is slower than the 5-membered ring case. A higher rate of cyclization reaction gives a higher contrast whereas a lower rate leads to the advantage of storage stability. As the length of alkylene group $R^3$, ethylene, propylene, butylene and pentylene are preferred.

The monomer from which the recurring unit (a) of formula (1) is derived may be obtained by reaction of aminostyrene with a halide having a carboxyl group as shown below. The carboxyl group may have been substituted, and in such a case, the substituent may be deprotected after monomer synthesis or polymerization.

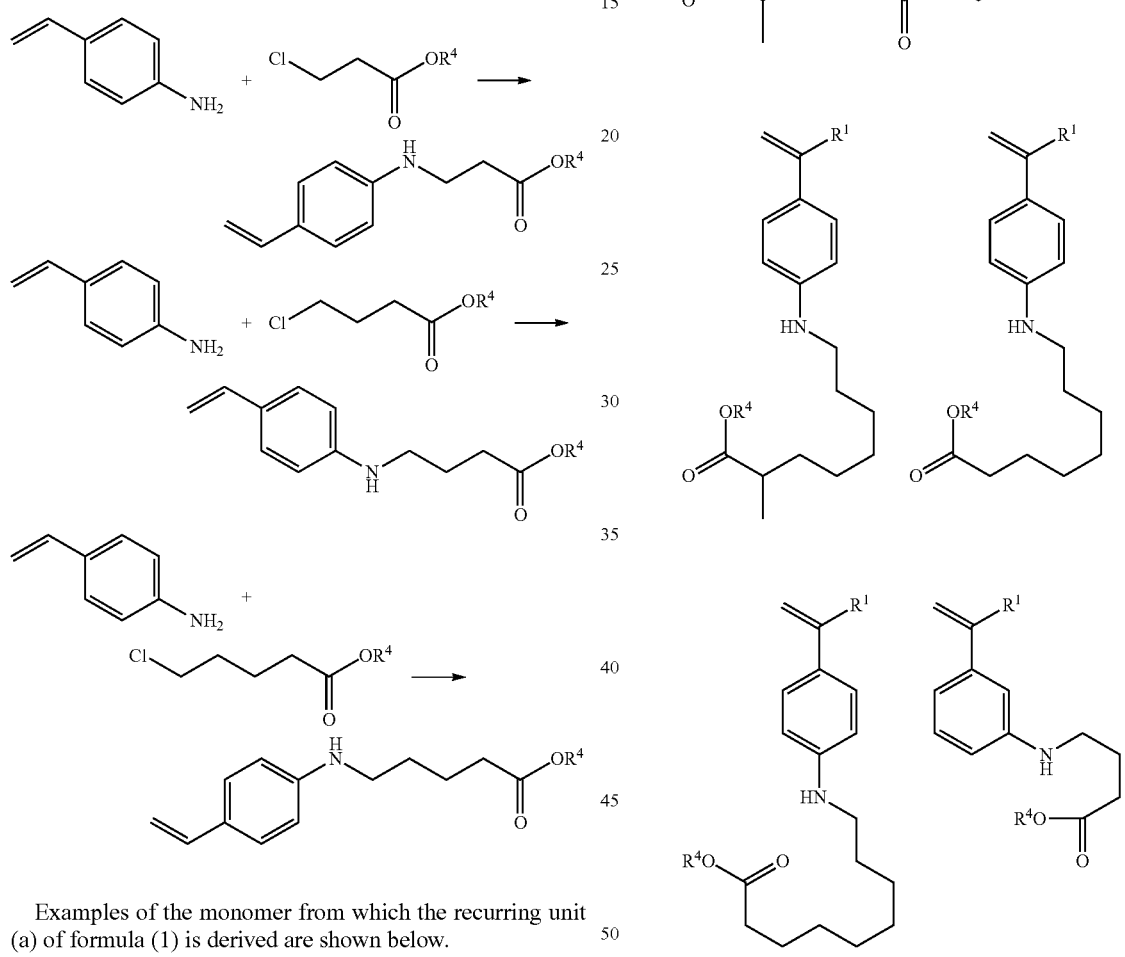

Examples of the monomer from which the recurring unit (a) of formula (1) is derived are shown below.

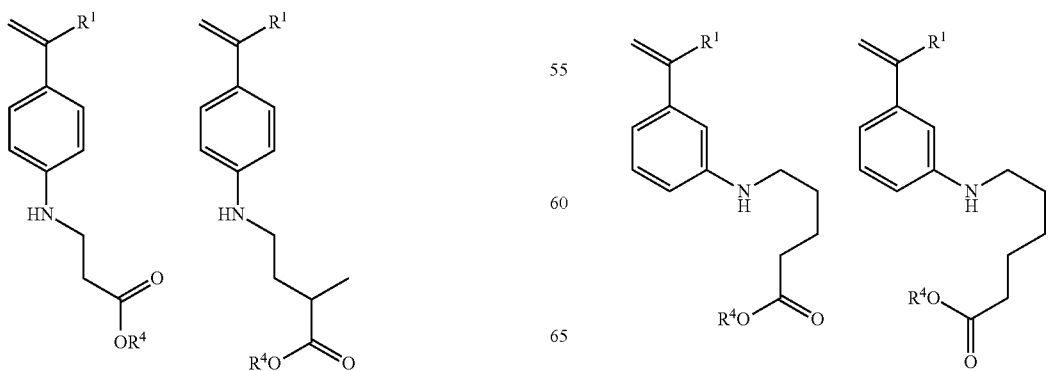

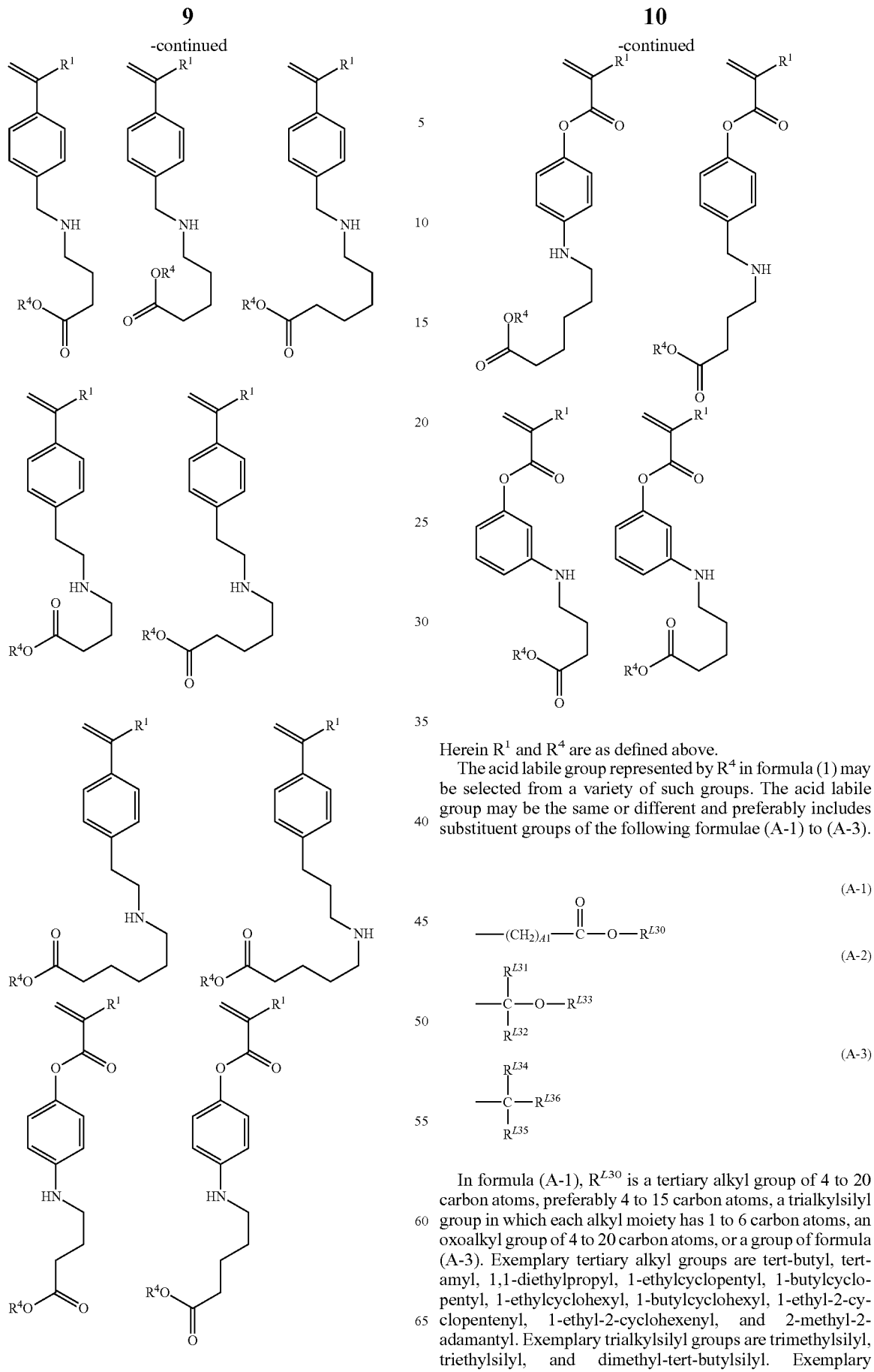

Herein $R^1$ and $R^4$ are as defined above.

The acid labile group represented by $R^4$ in formula (1) may be selected from a variety of such groups. The acid labile group may be the same or different and preferably includes substituent groups of the following formulae (A-1) to (A-3).

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

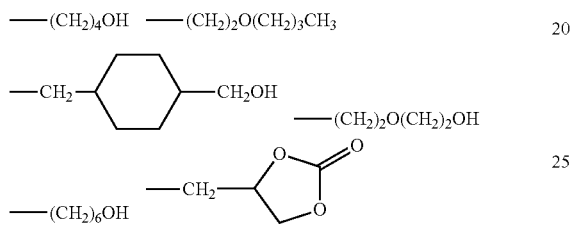

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile group of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Also included are substituent groups having the formulae (A-1)-1 to (A-1)-10.

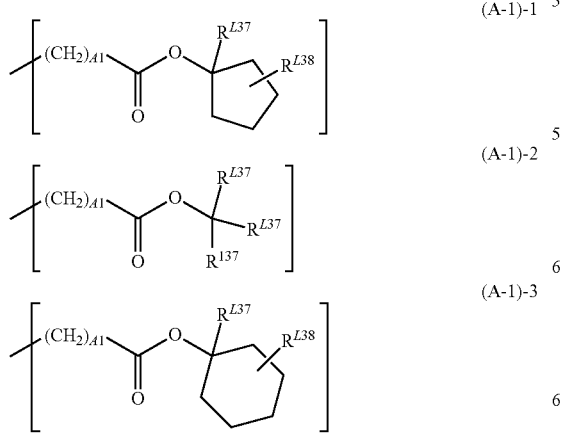

(A-1)-1

(A-1)-2

(A-1)-3

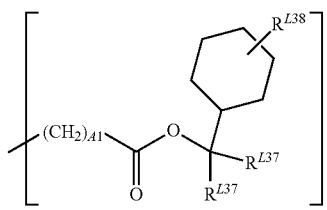

(A-1)-4

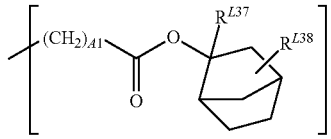

(A-1)-5

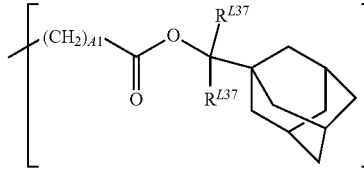

(A-1)-6

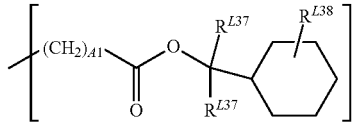

(A-1)-7

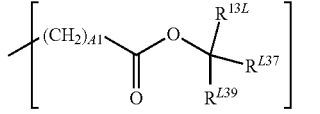

(A-1)-8

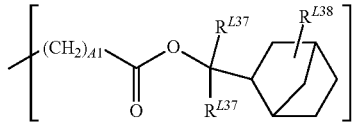

(A-1)-9

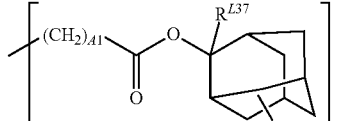

(A-1)-10

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group, and A1 is as defined above.

Of the acid labile groups of formula (A-2), the straight and branched ones are exemplified by the following groups having formulae (A-2)-1 to (A-2)-69.

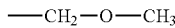 (A-2)-1

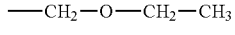 (A-2)-2

 (A-2)-3

 (A-2)-4

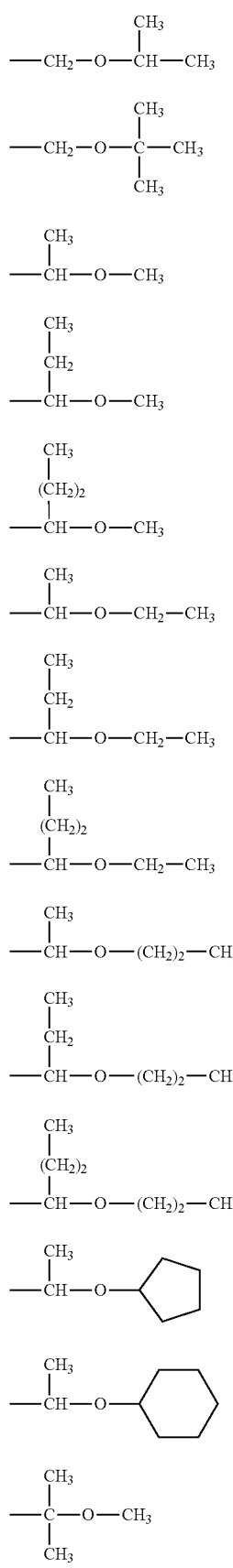
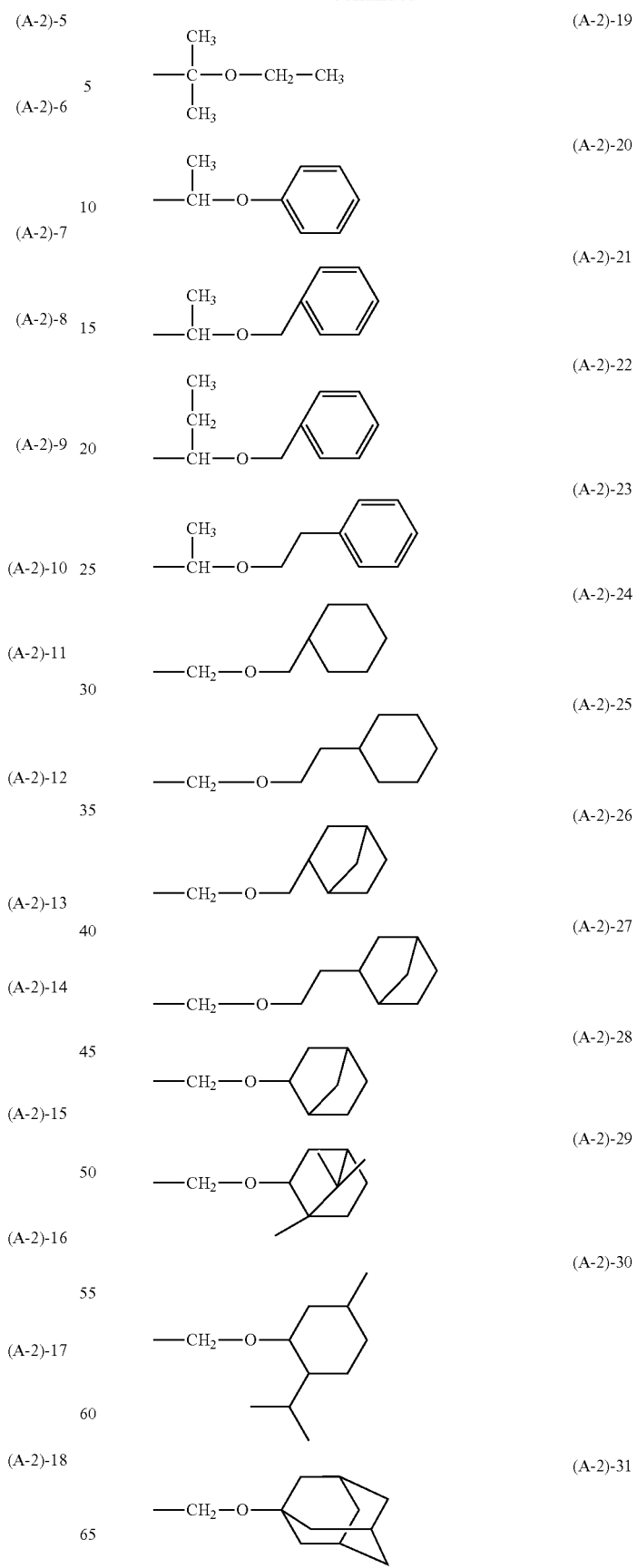

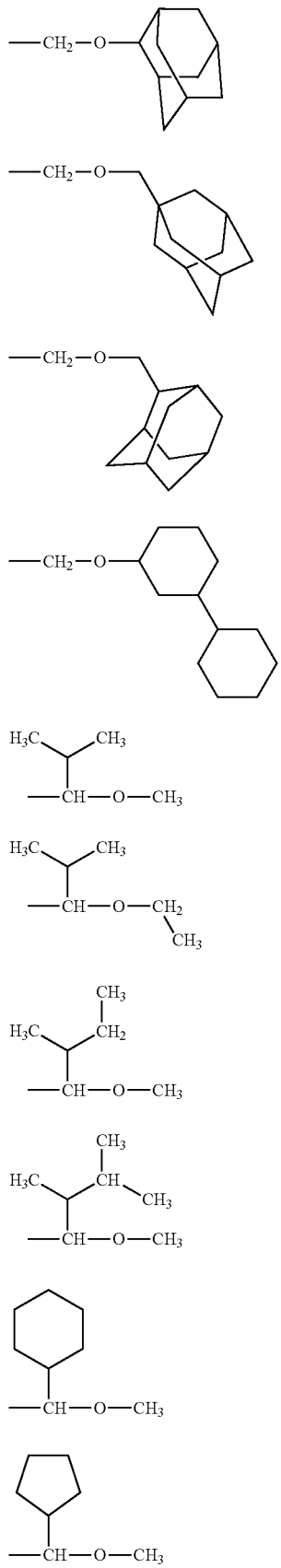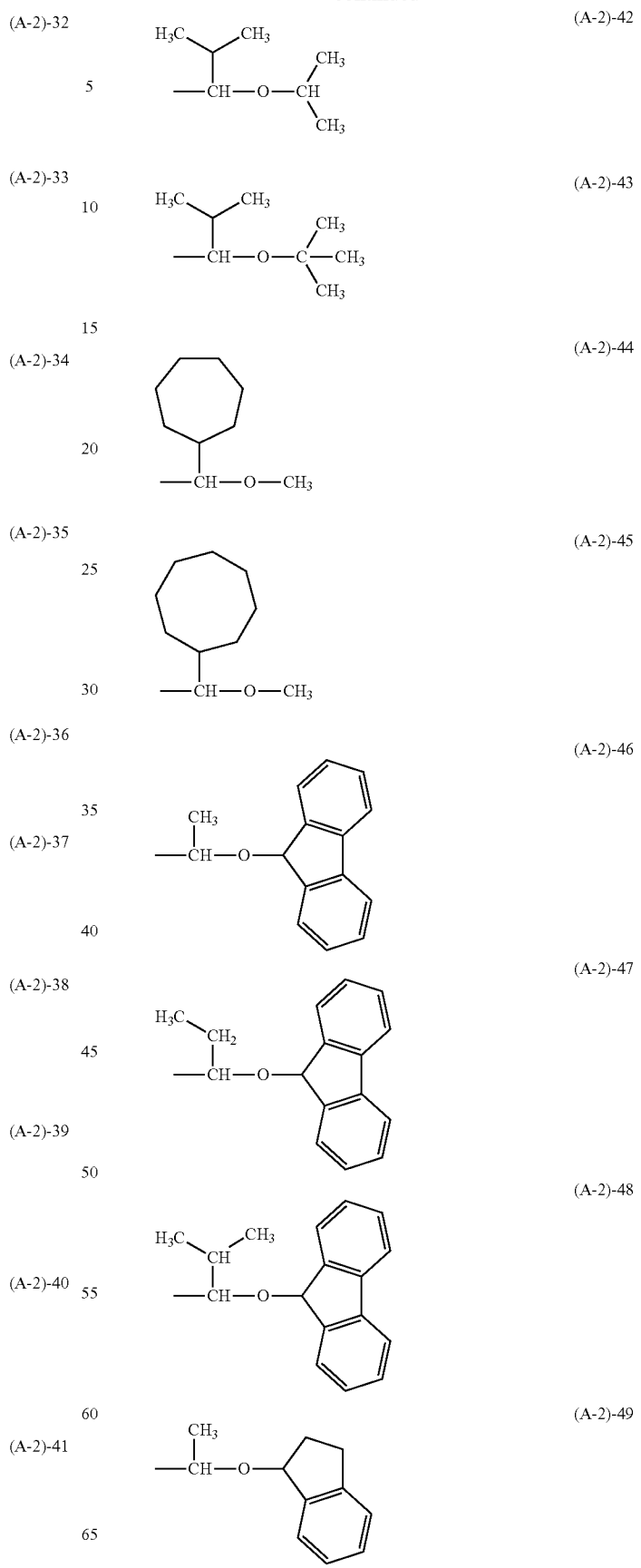

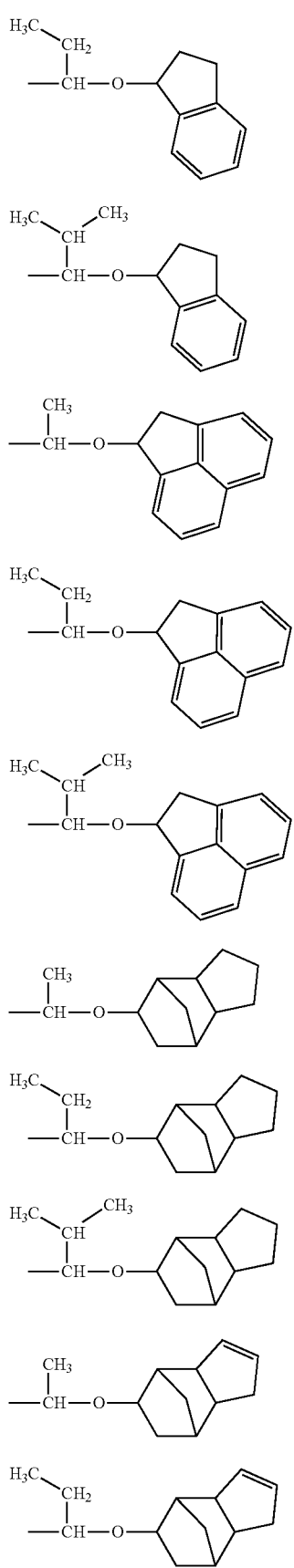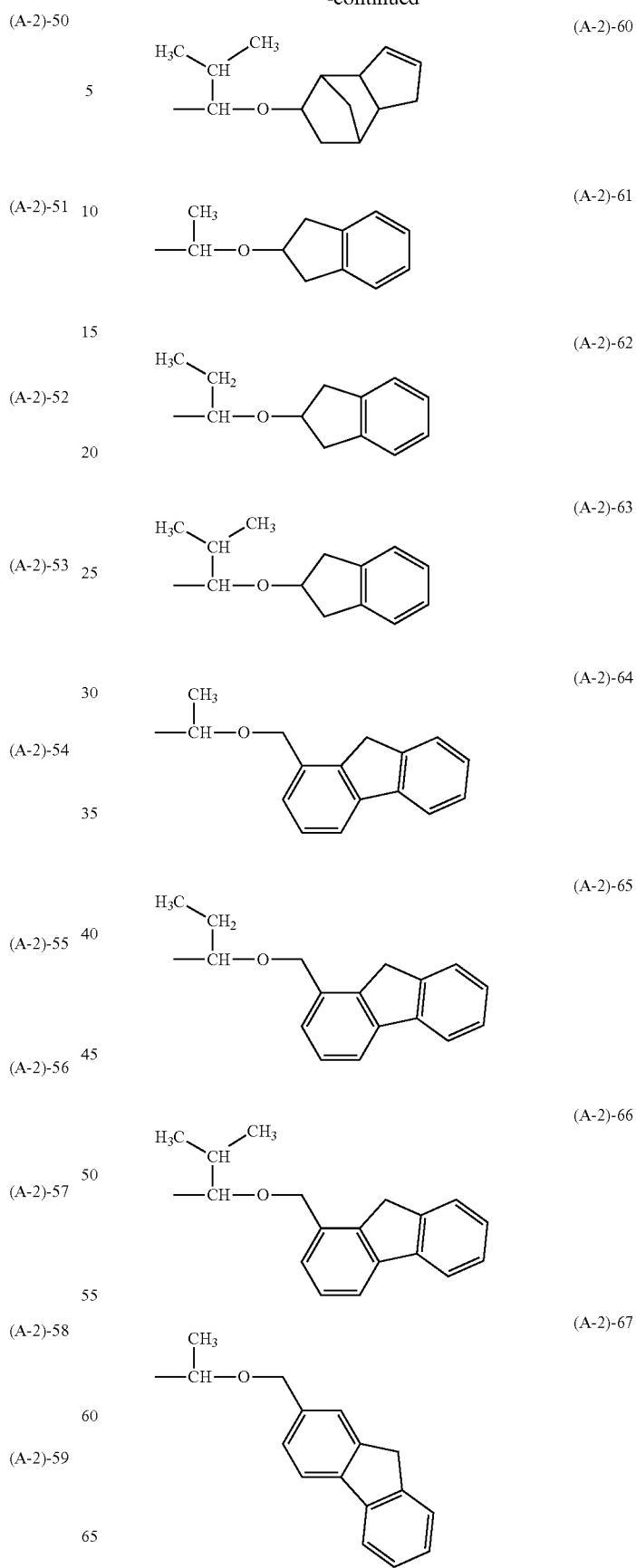

-continued (A-2)-68

[chemical structure: —CH(CH₂CH₃)—O—CH₂-fluorenyl]

(A-2)-69

[chemical structure: —CH(CH(CH₃)₂)—O—CH₂-fluorenyl]

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the general formula (A-2a) or (A-2b) while the polymer may be crosslinked within the molecule or between molecules with these acid labile groups.

(A-2a)

$$-\underset{R^{L41}}{\overset{R^{L40}}{\underset{|}{C}}}-(O-R^{L42})_{B1}-O-A-[O-(R^{L42}-O)_{D1}-\underset{R^{L41}}{\overset{R^{L40}}{\underset{|}{C}}}-]_{C1}$$

(A-2b)

$$-\underset{R^{L41}}{\overset{R^{L40}}{\underset{|}{C}}}-O-R^{L42}-B-A-[B-(R^{L42}-O)_{D1}-\underset{R^{L41}}{\overset{R^{L40}}{\underset{|}{C}}}-]_{C1}$$

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom or in which some of the hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-70 through (A-2)-77.

(A-2)-70

—CH(CH₃)—O—CH₂CH₂—O—CH(CH₃)—

(A-2)-71

—CH(CH₃)—O—(cyclohexyl-1,4-diyl)—O—CH(CH₃)—

(A-2)-72

—CH(CH₃)—O—CH₂CH₂CH₂CH₂—O—CH(CH₃)—

(A-2)-73

—CH(CH₃)—O—CH₂CH₂OCH₂CH₂OCH₂CH₂—O—CH(CH₃)—

(A-2)-74

—CH(CH₃)—O—CH₂CH₂O—(1,3-phenylene)—OCH₂CH₂—O—CH(CH₃)—

(A-2)-75

—CH(CH₃)—O—CH₂CH₂O—(furan-3,4-diyl)—OCH₂CH₂—O—CH(CH₃)—

(A-2)-76

—CH(CH₃)—O—CH₂CH₂O—(1,3,5-benzenetriyl with OCH₂CH₂—O—CH(CH₃))—OCH₂CH₂—O—CH(CH₃)—

(A-2)-77

—CH(CH₃)—O—CH₂CH₂O—(phenyl)—C(CH₃)₂—(phenyl)—OCH₂CH₂O—CH(CH₃)—

In formula (A-3), $R^{L34}$, $R^{L35}$ and $R^{L36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

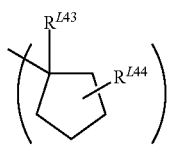 (A-3)-1
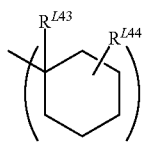 (A-3)-2
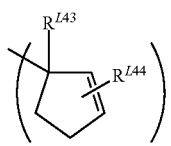 (A-3)-3
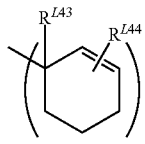 (A-3)-4
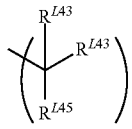 (A-3)-5
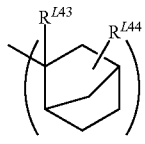 (A-3)-6
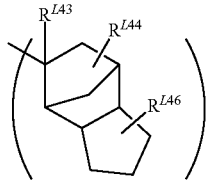 (A-3)-7
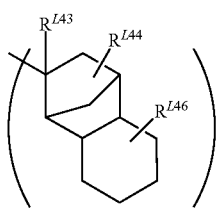 (A-3)-8
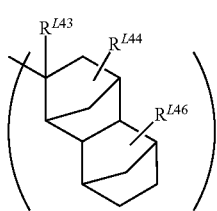 (A-3)-9
-continued
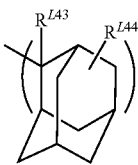 (A-3)-10
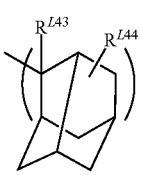 (A-3)-11
 (A-3)-12
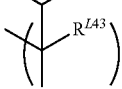 (A-3)-13
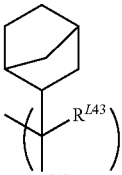 (A-3)-14
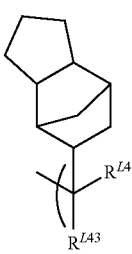 (A-3)-15
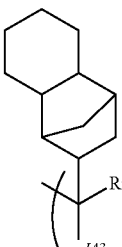 (A-3)-16
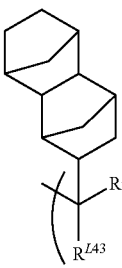

-continued

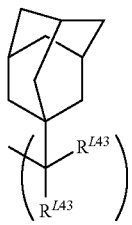
(A-3)-17

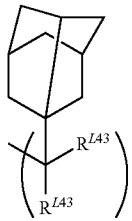
(A-3)-18

Herein $R^{L43}$ is each independently a straight, branched or cyclic $C_1$-$C_8$ alkyl group or $C_6$-$C_{20}$ aryl group, typically phenyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

In addition to the recurring units (a) of formula (1), the polymer as base resin may have further copolymerized therein recurring units of at least one type selected from recurring units (b1) to (b7) as represented by the general formula (2). A polymer having these units incorporated has an increased carbon density and hence, higher dry etch resistance.

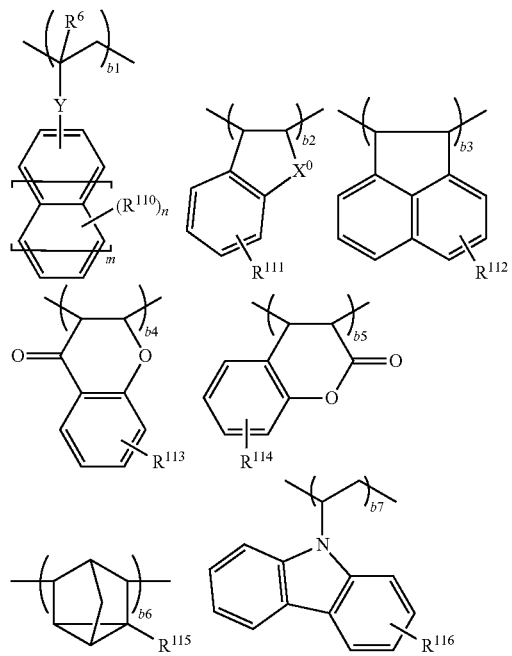
(2)

Herein $R^6$ is hydrogen or methyl, m is an integer of 0 to 2, and n is an integer of 0 to 5. $R^{110}$ to $R^{116}$ are each independently hydrogen, $C_1$-$C_{30}$ alkyl, partially or entirely halo-substituted alkyl (the alkyl and halo-substituted alkyl optionally having an alkyl-substituted or unsubstituted hydroxyl or carboxyl group), hydroxyl, $C_1$-$C_4$ alkoxy, acyl, acyloxy, alkoxycarbonyl, $C_6$-$C_{10}$ aryl, halogen, or 1,1,1,3,3,3-hexafluoro-2-propanol group. Y is a single bond, —O—, —S—, —C(=O)—O—$R^7$—, or —C(=O)—NH—$R^7$—, wherein $R^7$ is a single bond or $C_1$-$C_4$ alkylene group. $X^0$ is methylene, oxygen or sulfur atom; b1 to b7 are numbers in the range: $0 \le b1 < 1.0$, $0 \le b2 < 1.0$, $0 \le b3 < 1.0$, $0 \le b4 < 1.0$, $0 \le b5 < 1.0$, $0 \le b6 < 1.0$, $0 \le b7 < 1.0$, and $0 \le b1+b2+b3+b4+b5+b6+b7 < 1.0$.

Examples of the monomer from which recurring units (b1) are derived are shown below.

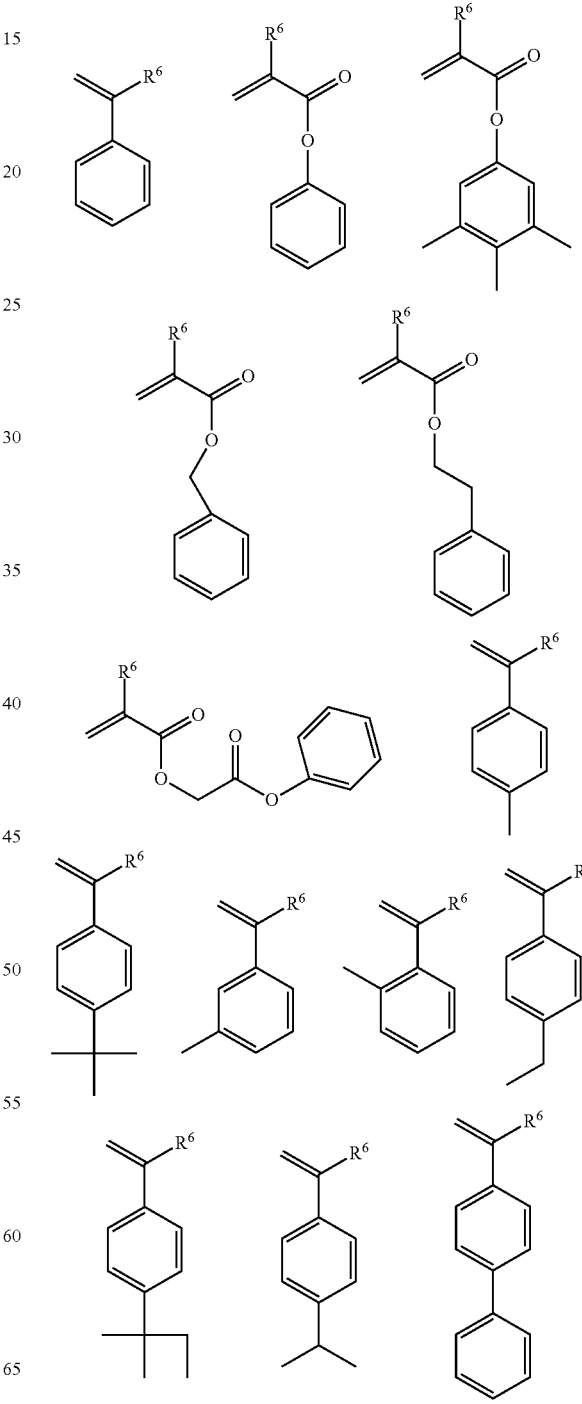

-continued
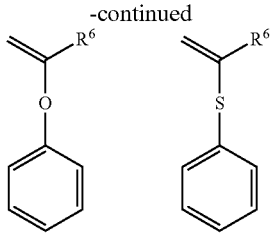
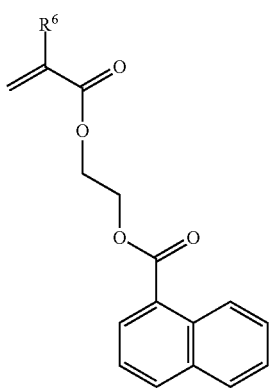
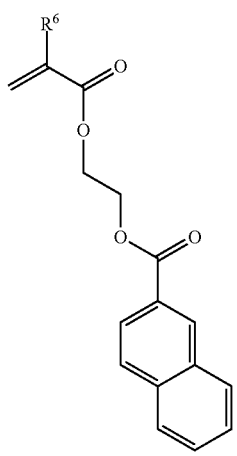
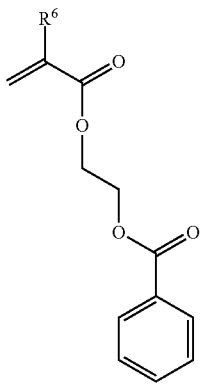
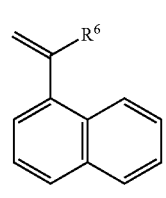
-continued
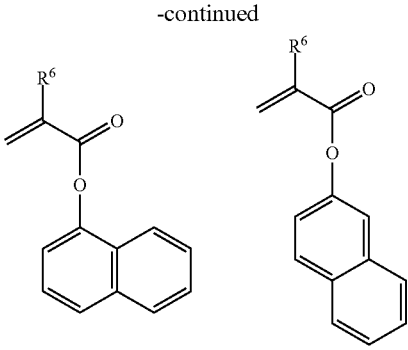
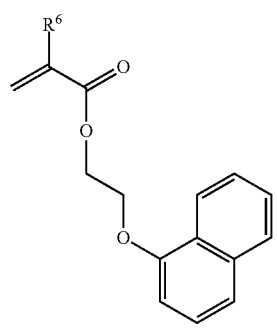
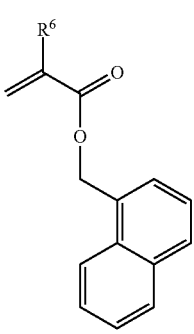
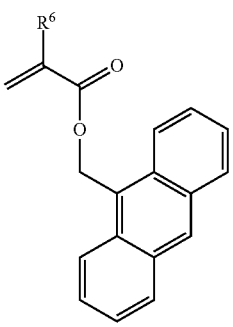
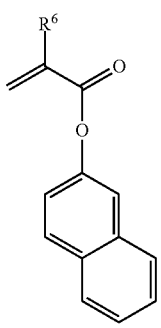
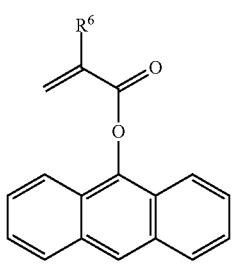
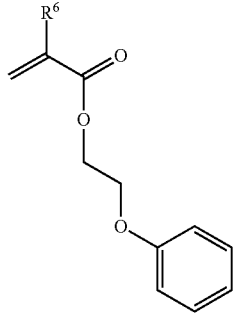
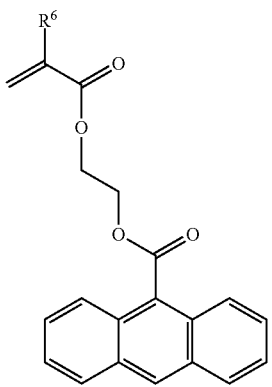
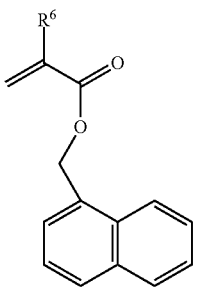
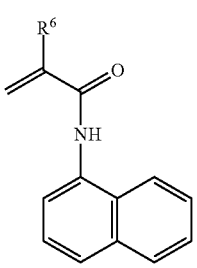

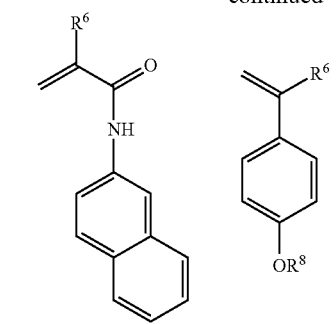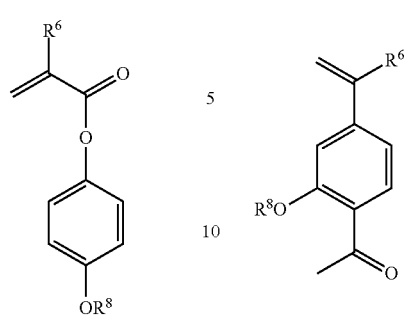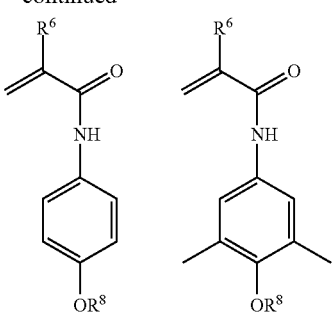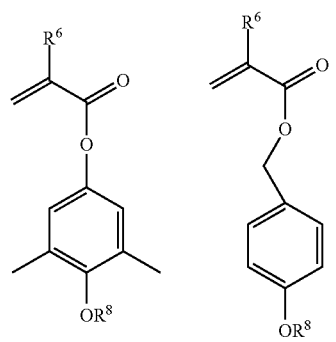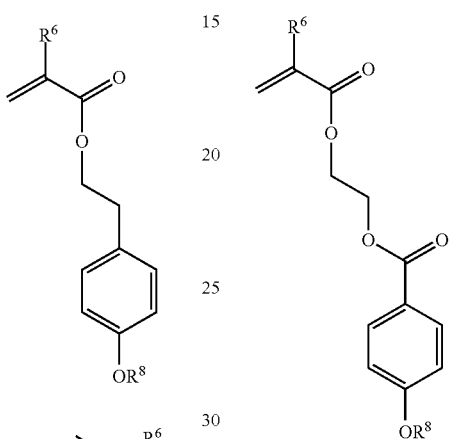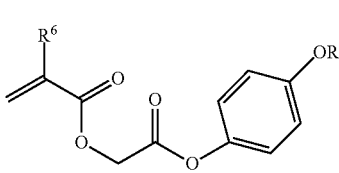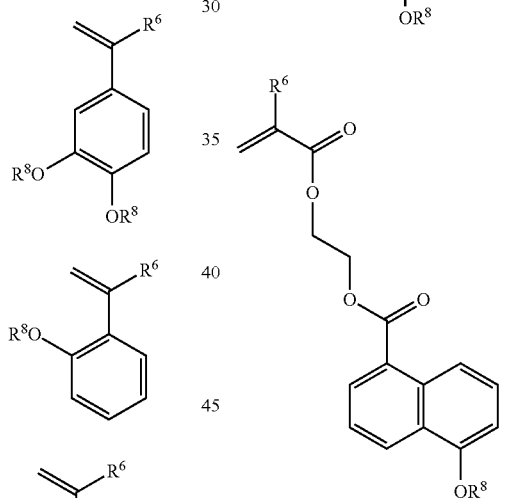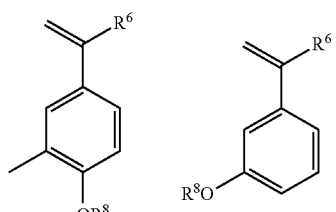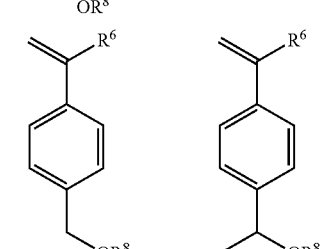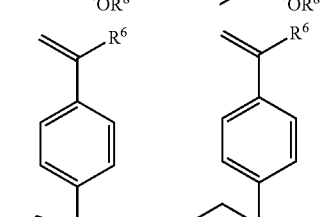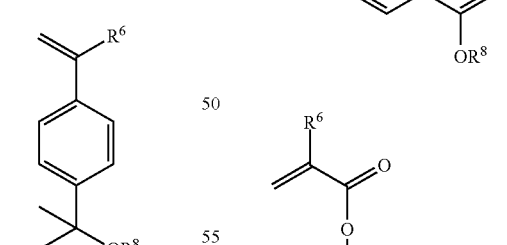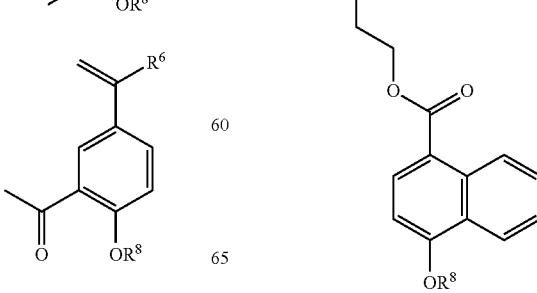

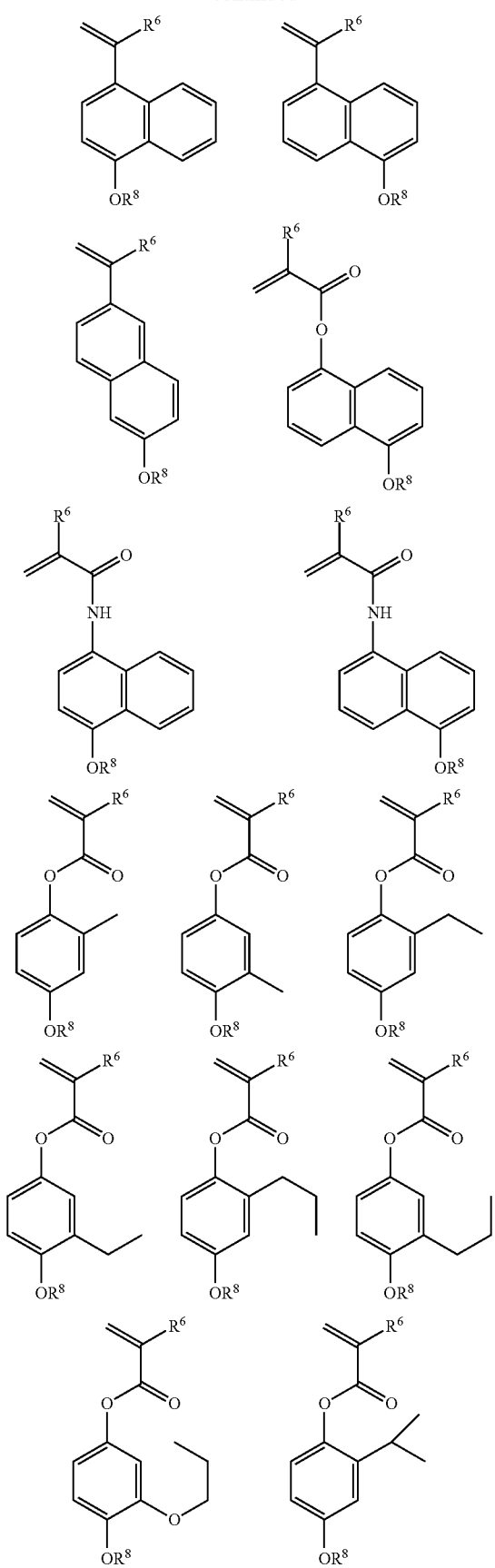
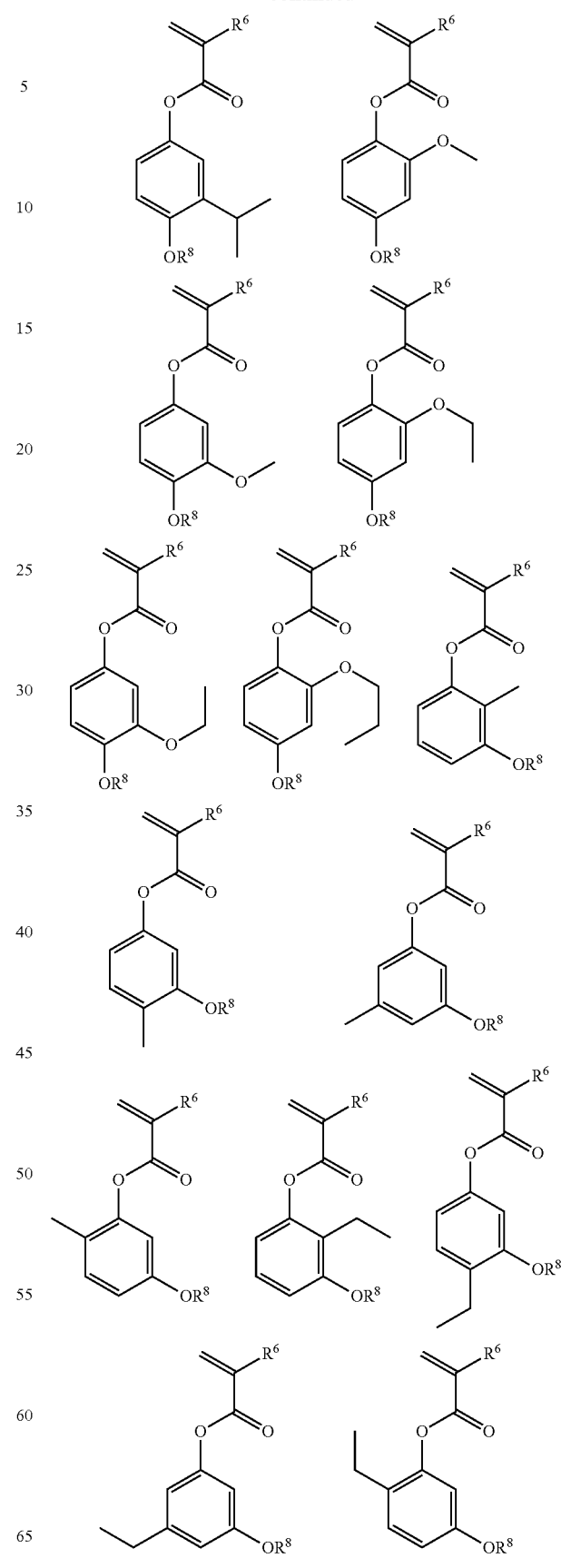

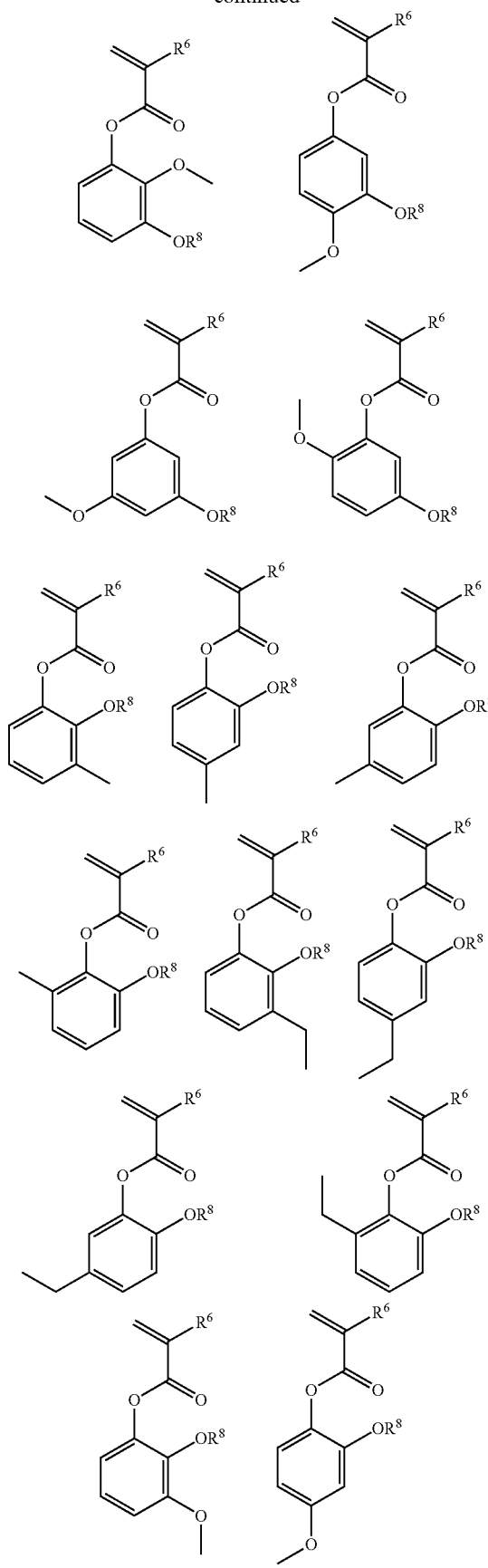
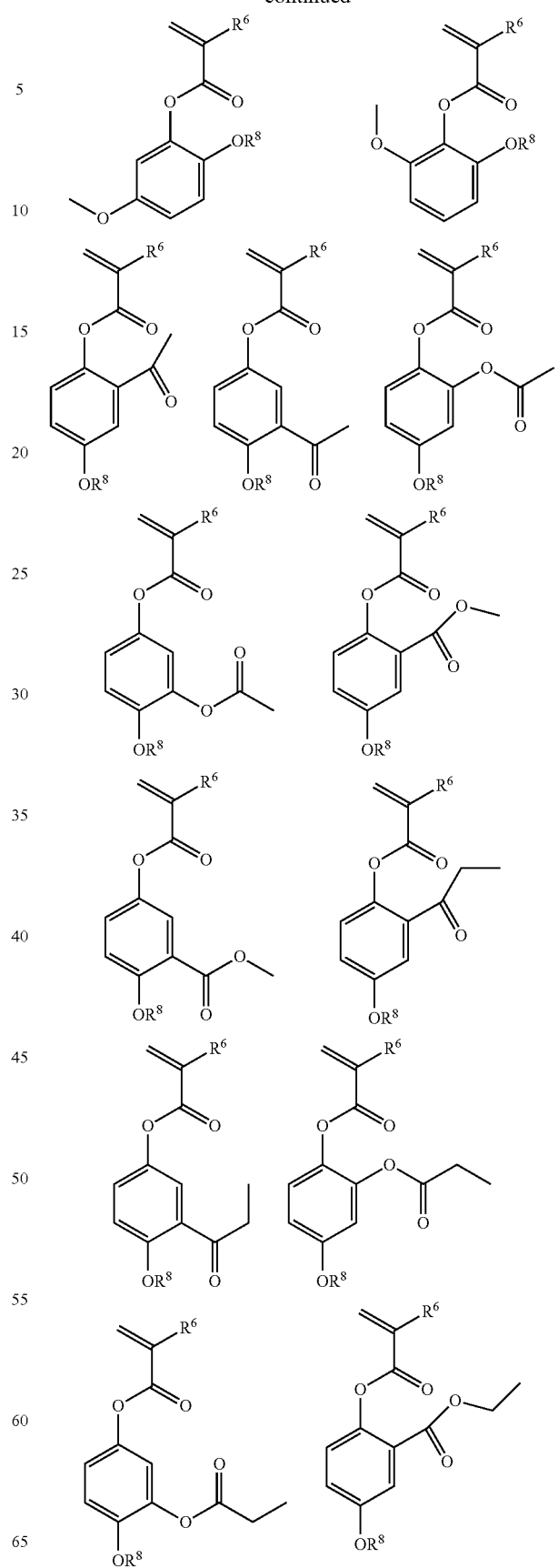

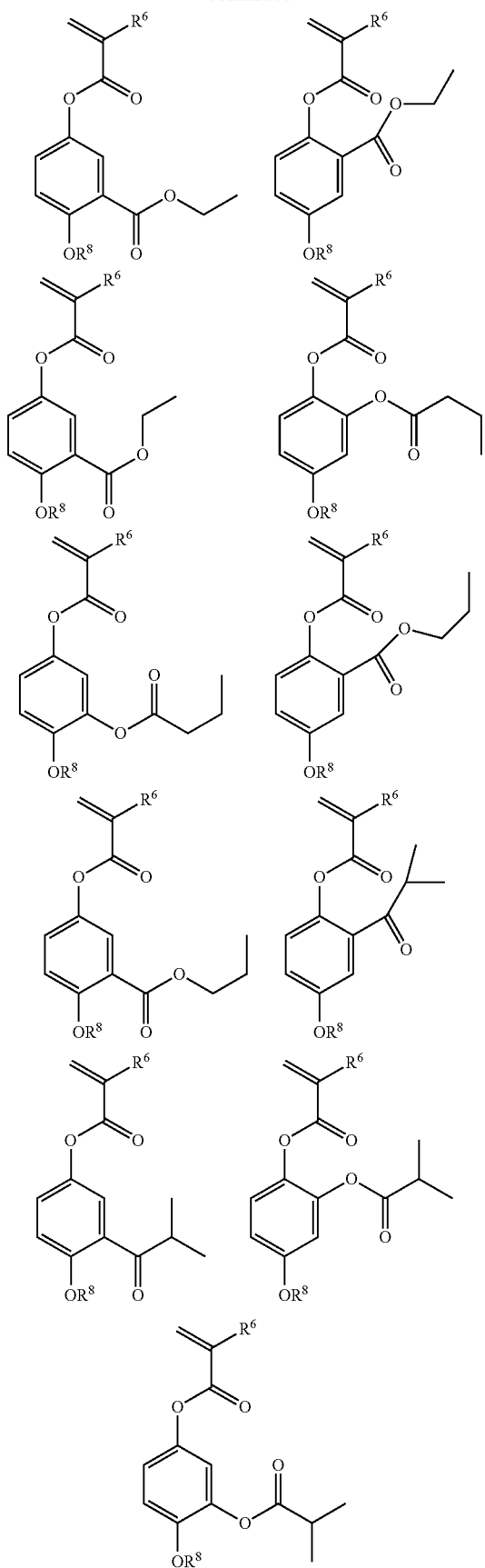
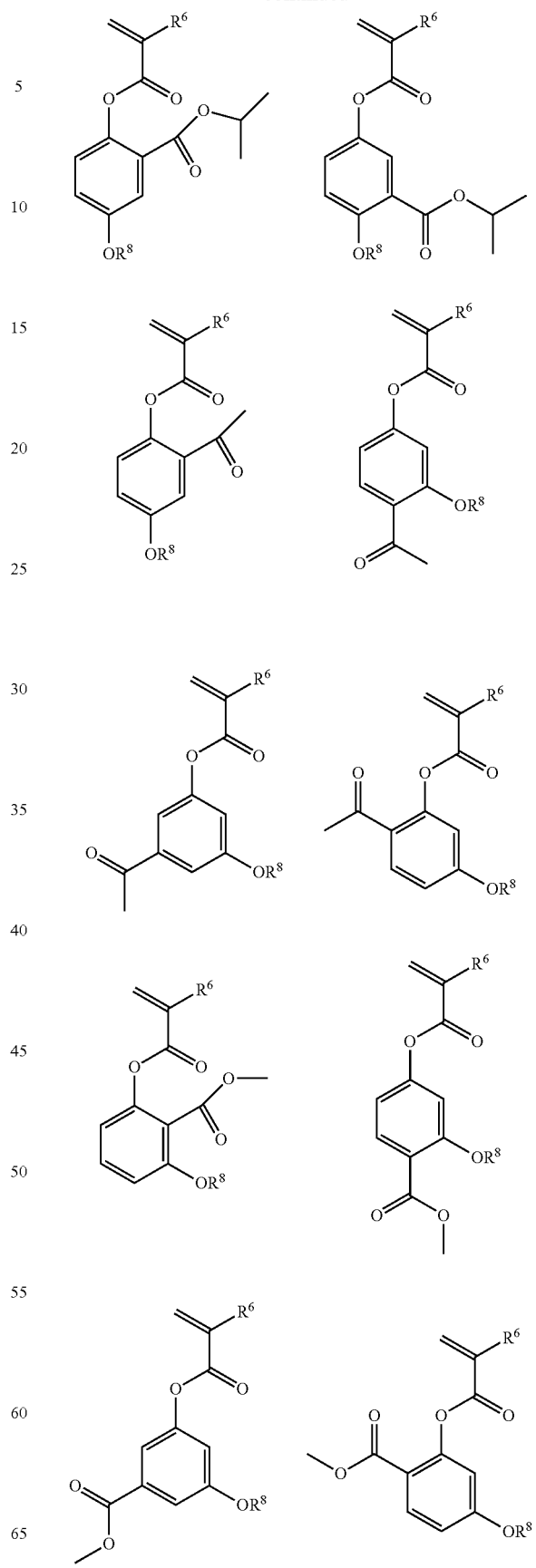

-continued

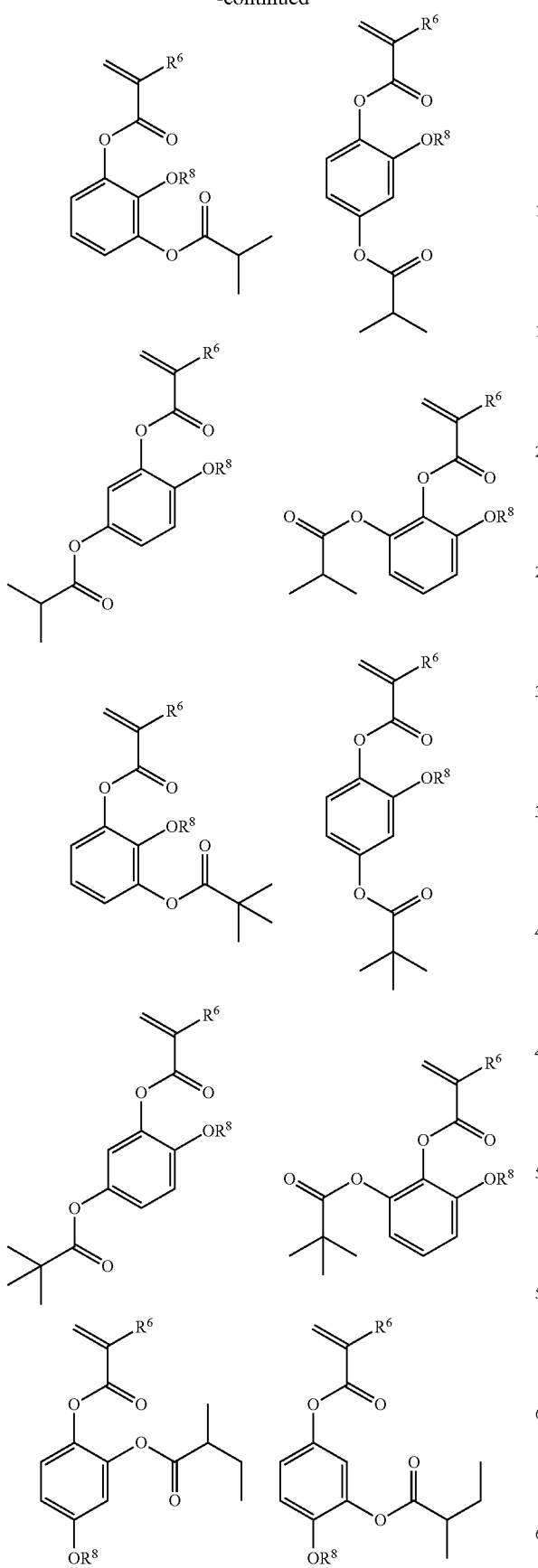
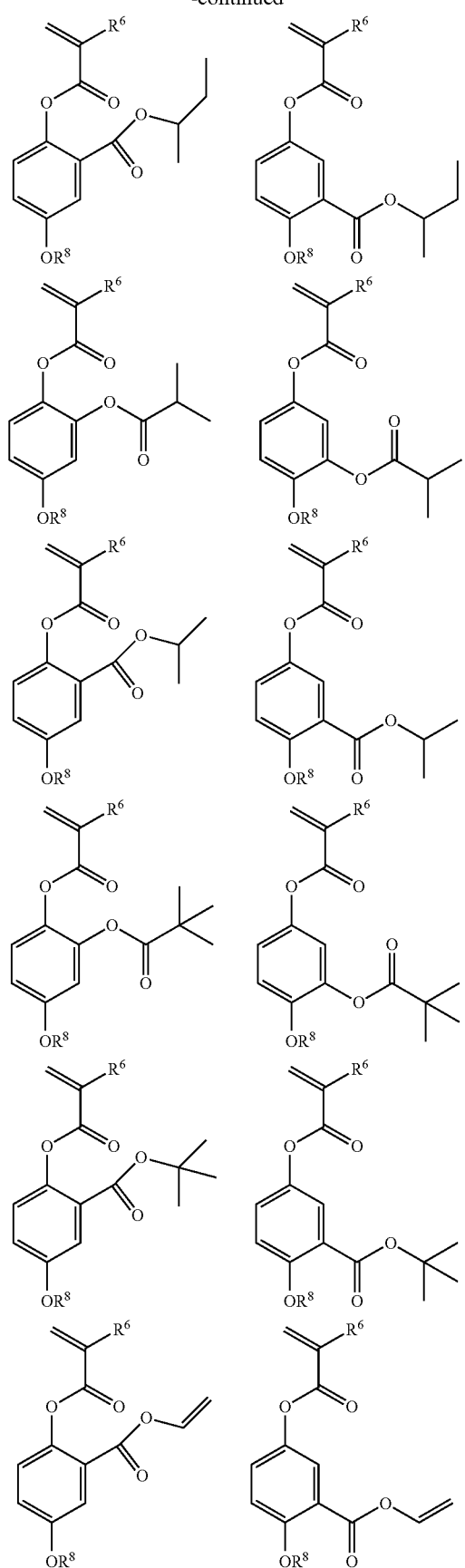

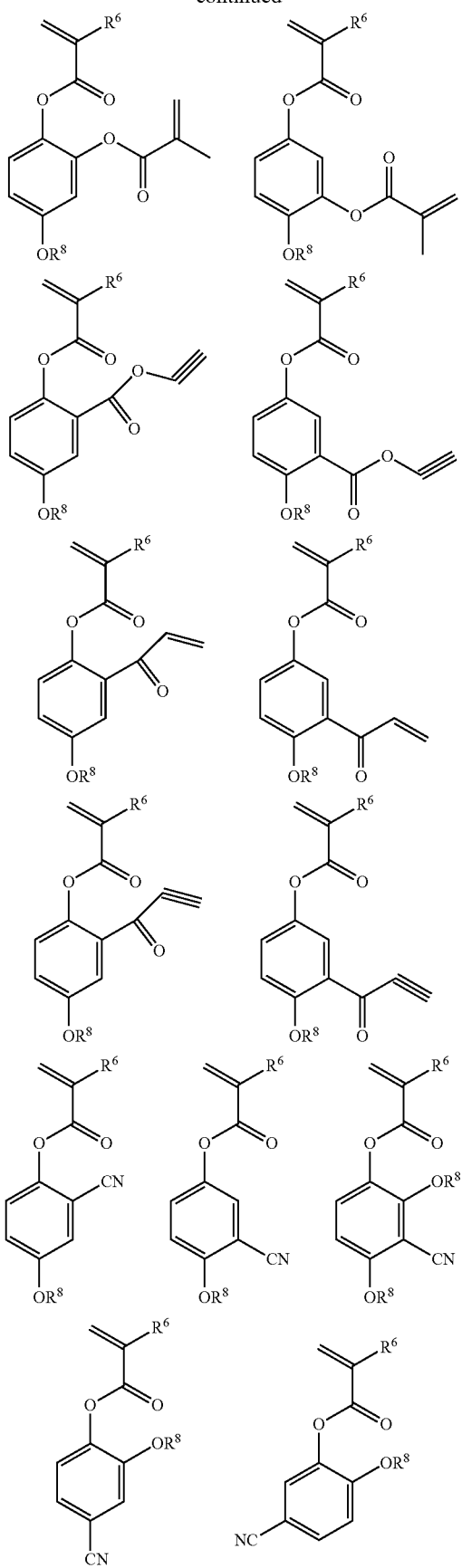
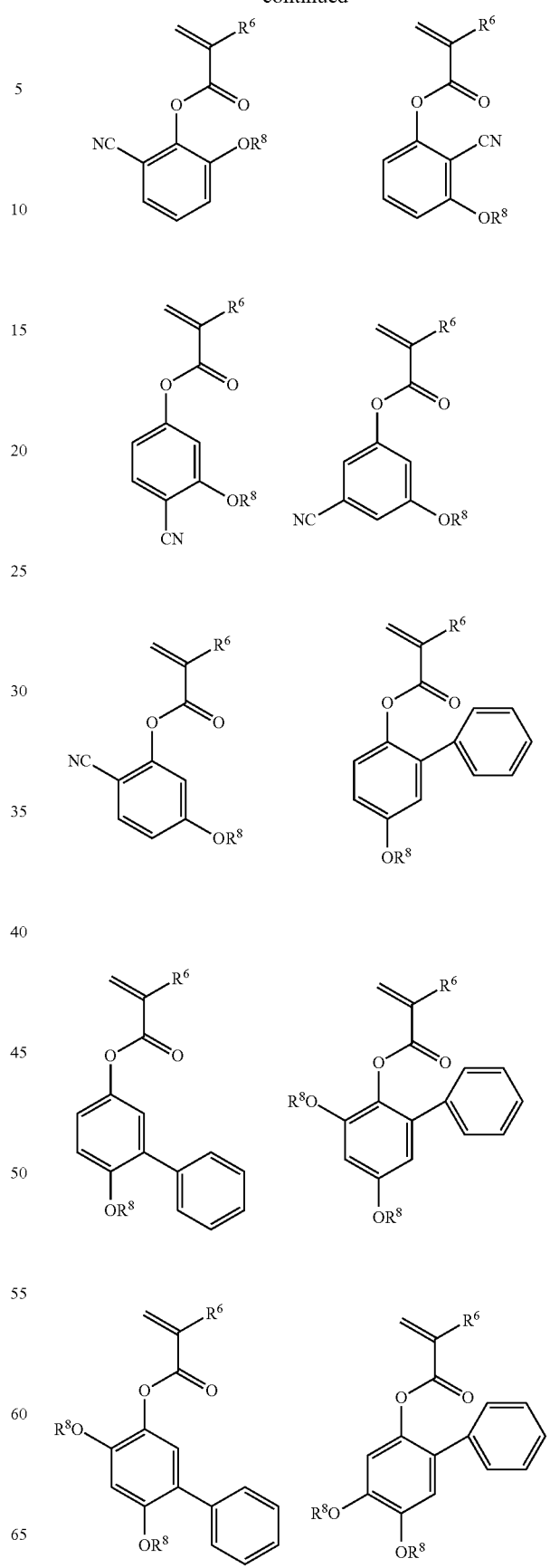

-continued
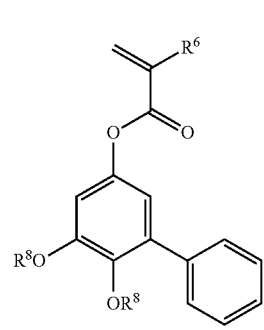 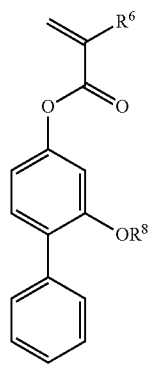 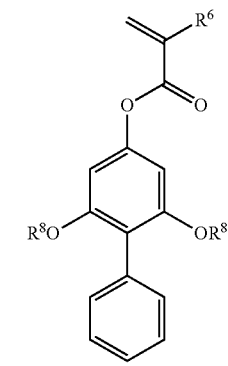 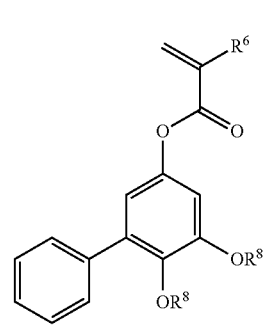
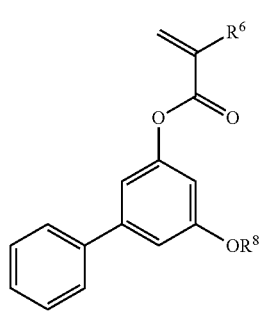 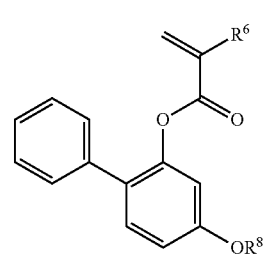 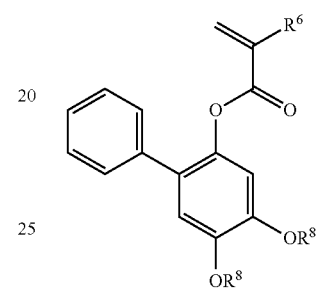 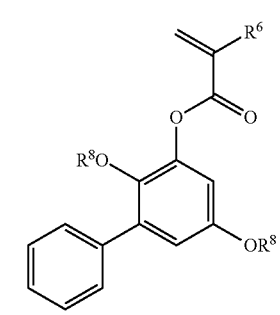
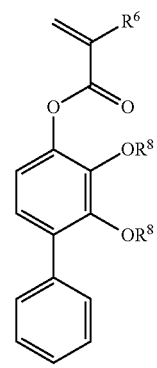 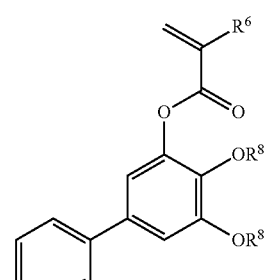 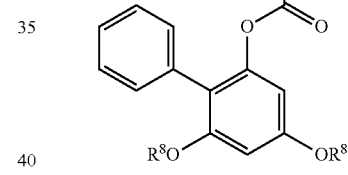 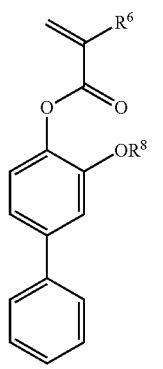
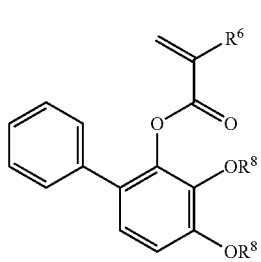 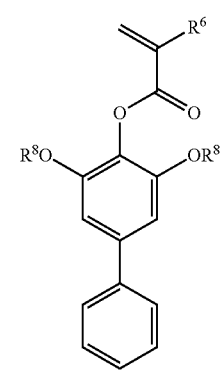 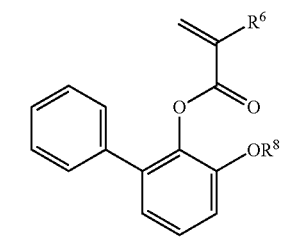 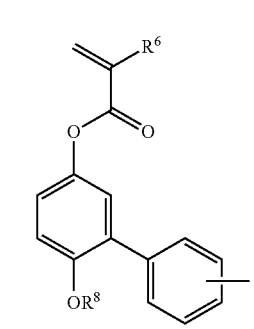

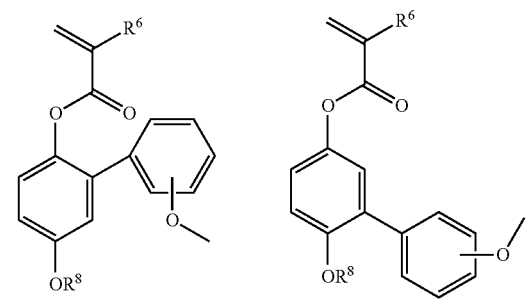
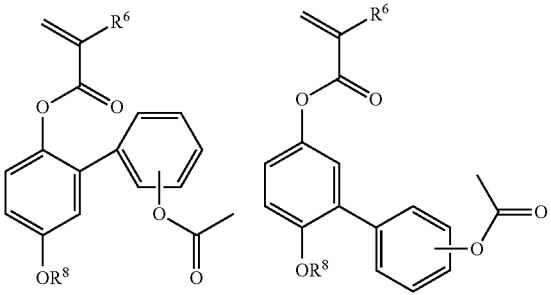
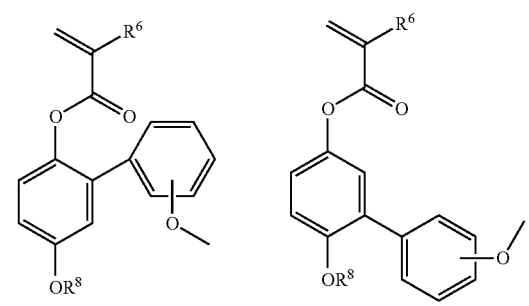
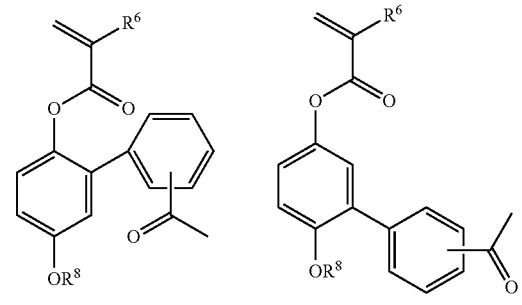
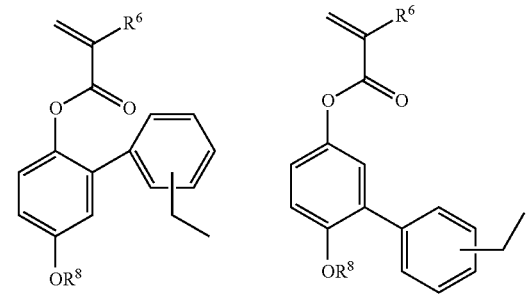
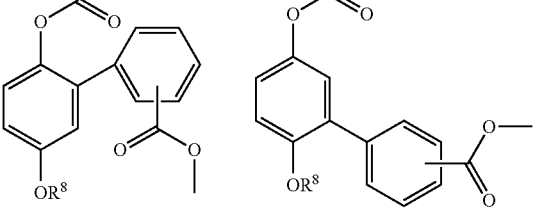
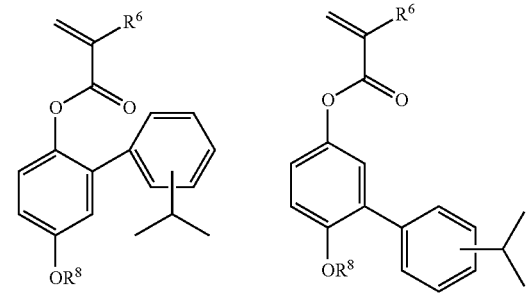
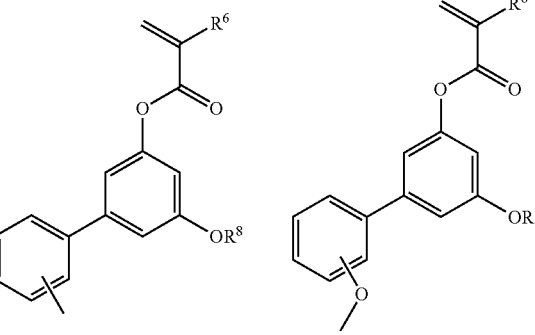
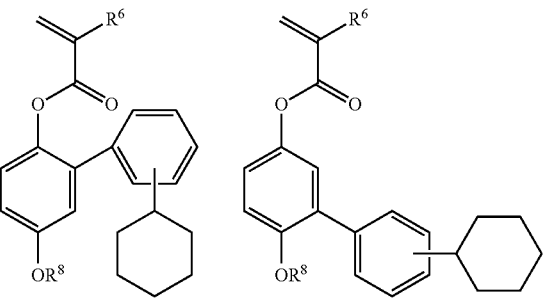
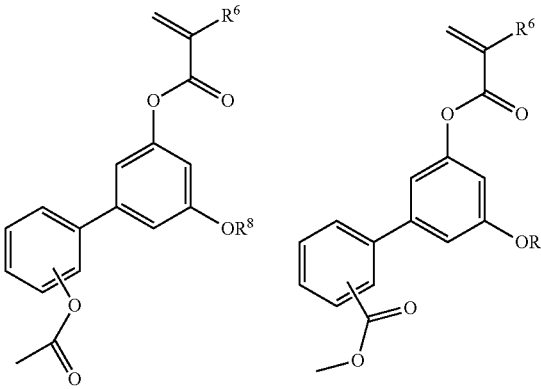

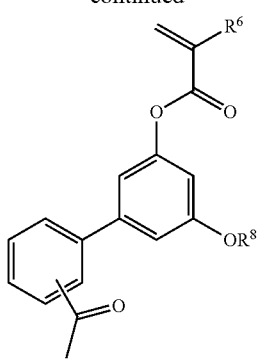
Herein R⁶ is as defined above, and $R^8$ is hydrogen or $C_1$-$C_4$ alkyl.
Examples of the monomers from which recurring units (b2) to (b7) are derived are shown below.
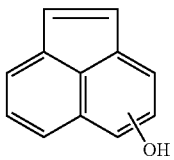
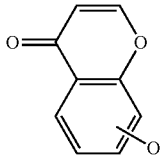
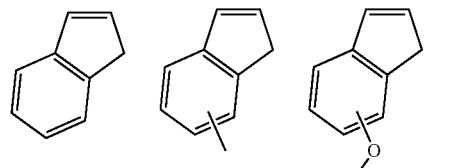
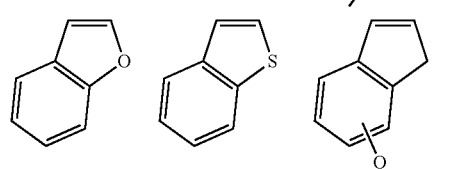
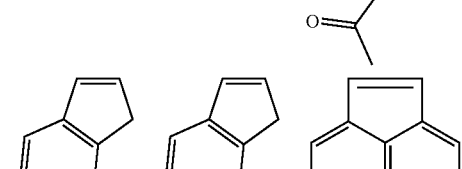
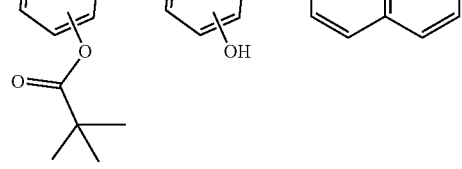
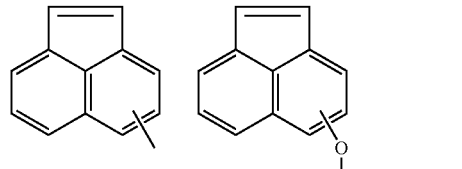
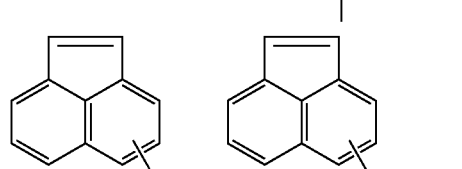
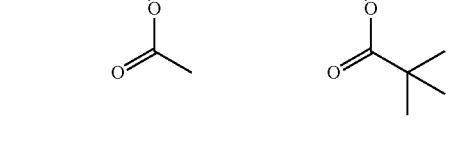
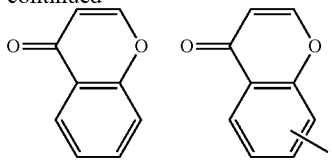
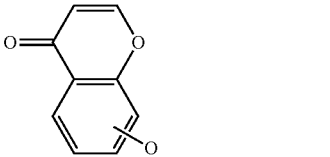
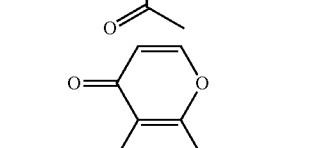
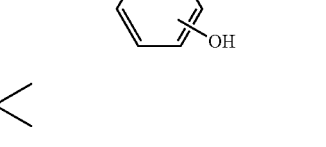
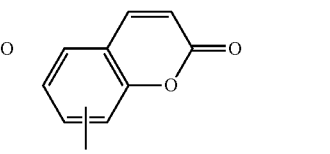
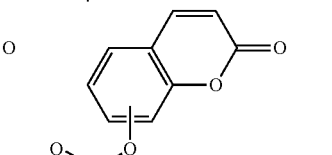
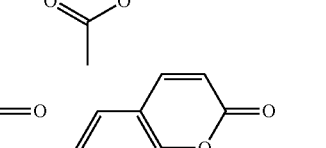
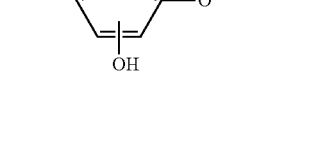
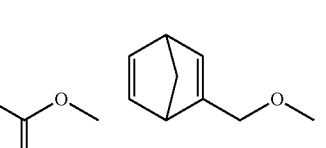
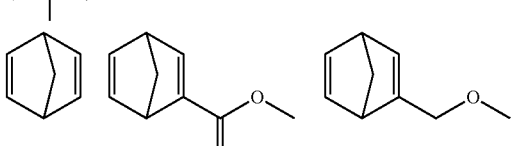
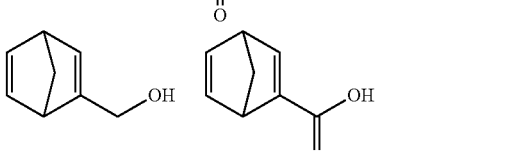
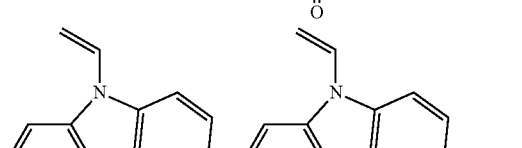

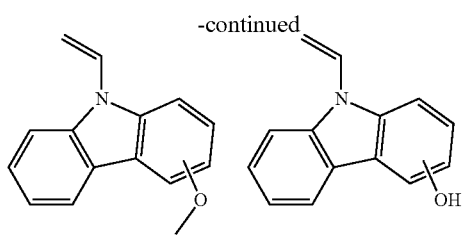

While the polymer as base resin should comprise essentially recurring units (a) of formula (1) and optionally recurring units (b1) to (b7) copolymerized therewith as alluded to above, it may have further copolymerized therein recurring units (c) having an adhesive group. The adhesive group is selected from among hydroxyl, carboxyl, lactone ring, carbonate, thiocarbonate, carbonyl, cyclic acetal, ether, ester, sulfonic acid ester, cyano, amide, —O—C(=O)-G- (wherein G is sulfur or NH), and acid anhydride groups.

Shown below are examples of the monomer from which the recurring units (c) having an adhesive group selected from among hydroxyl, carboxyl, lactone ring, carbonate, thiocarbonate, carbonyl, cyclic acetal, ether, ester, sulfonic acid ester, cyano, amide, —O—C(=O)-G- (wherein G is sulfur or NH) and acid anhydride groups are derived.

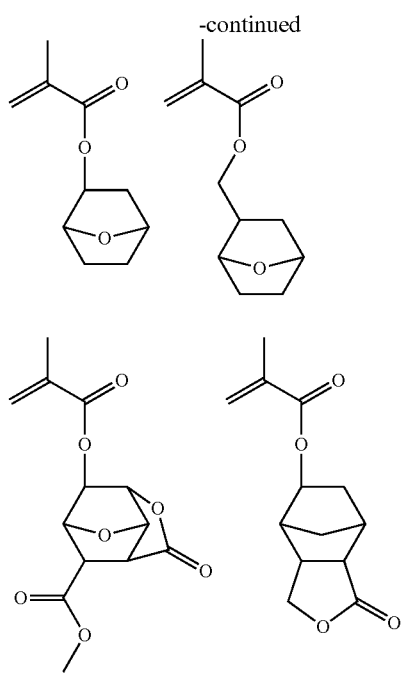

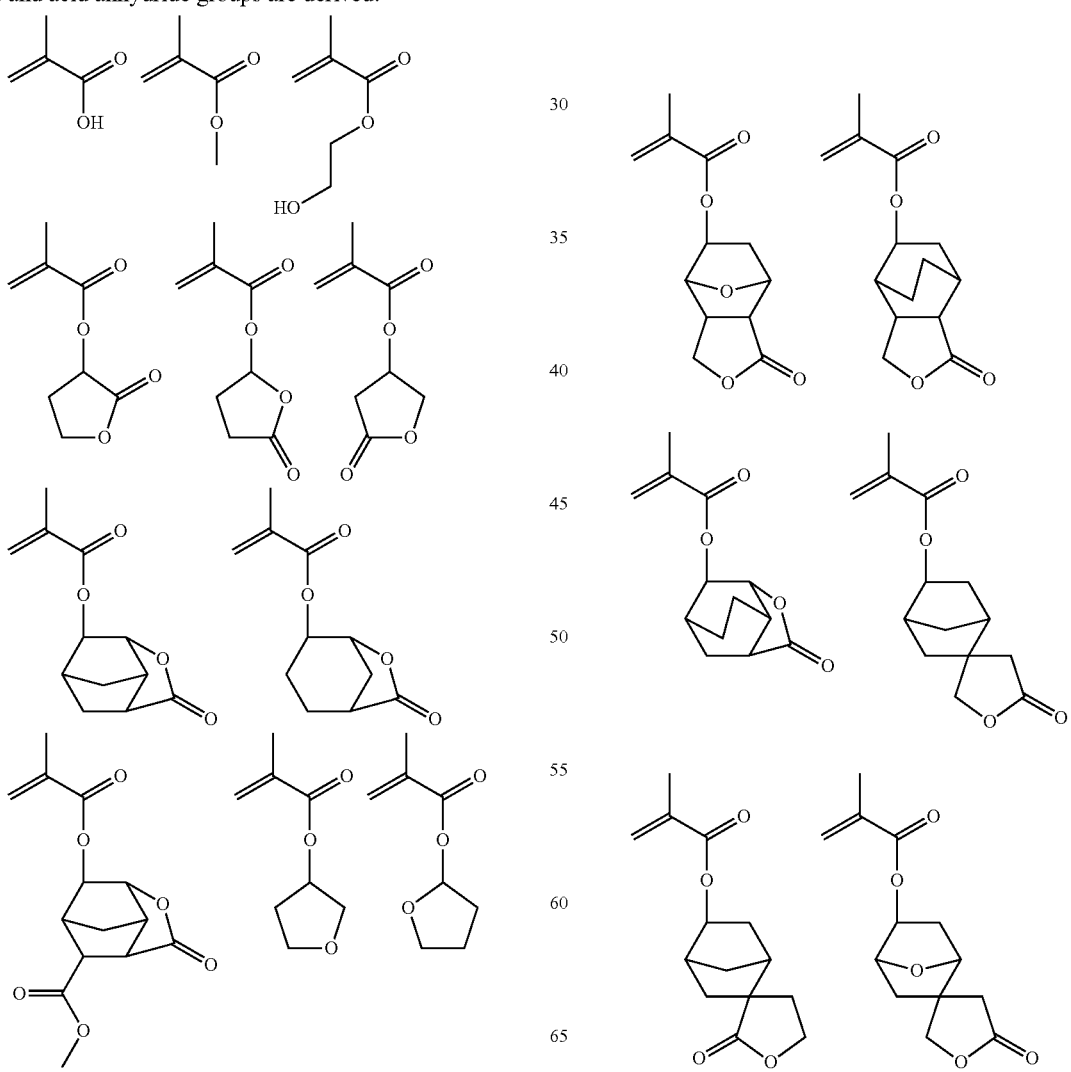

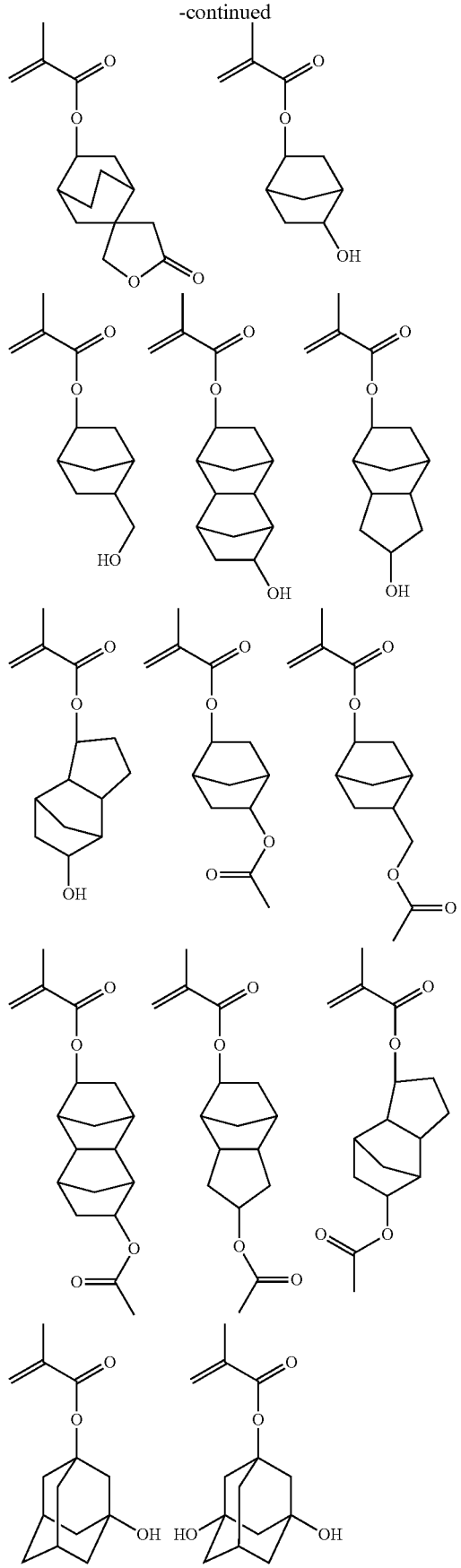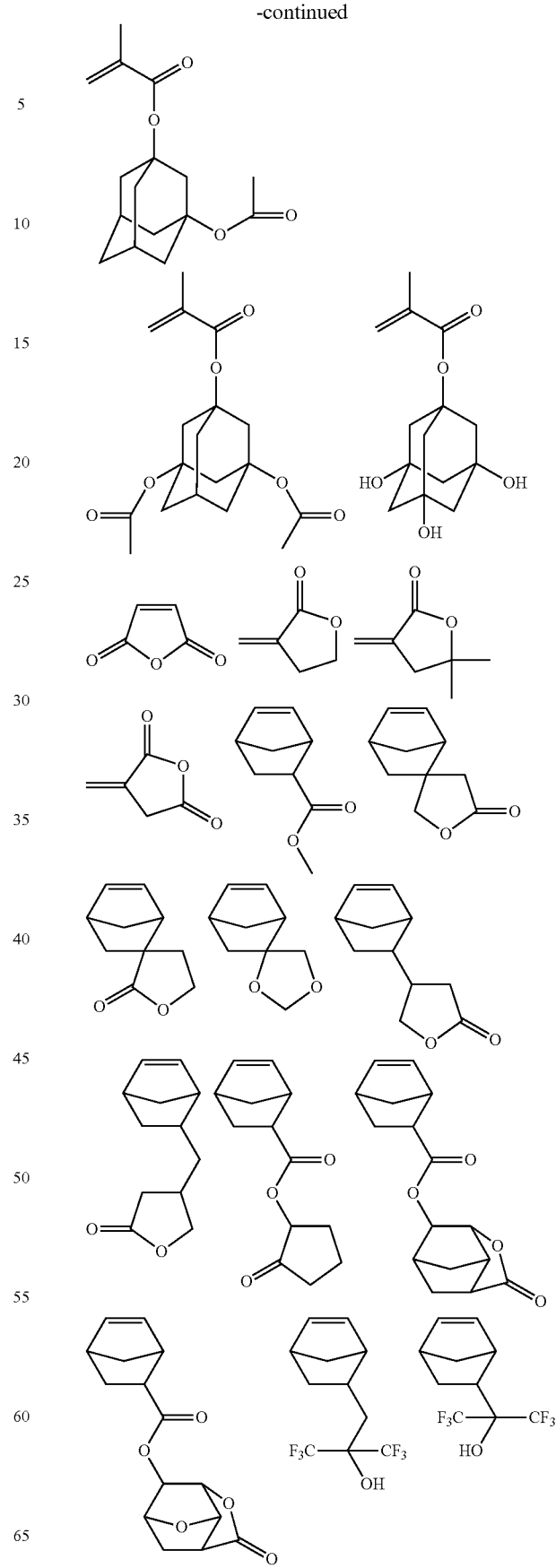

51
-continued
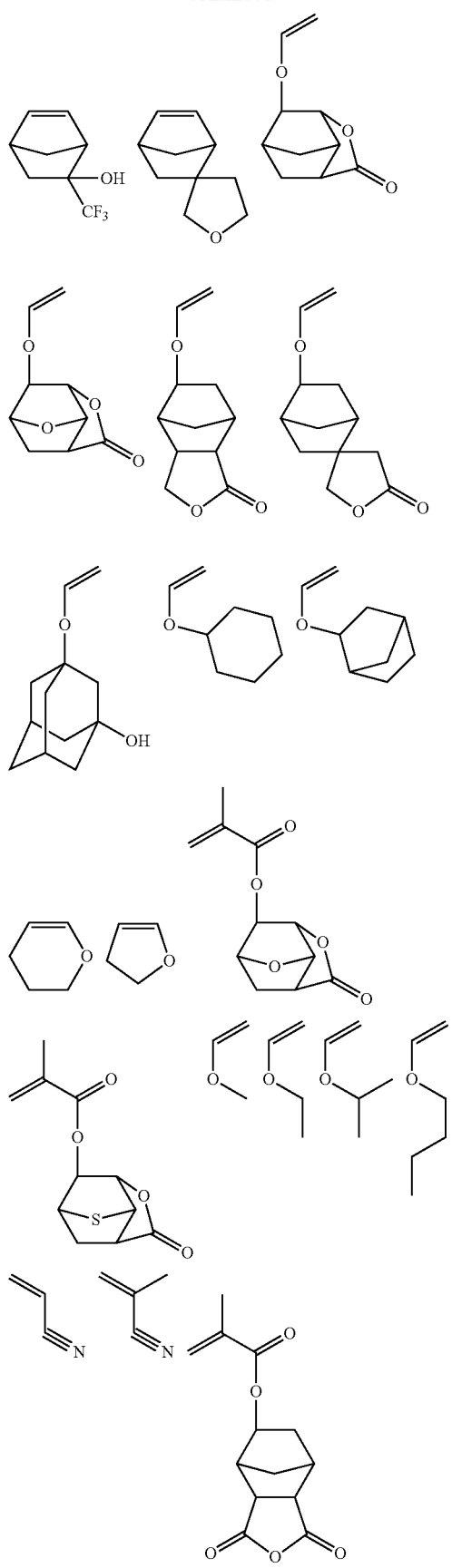
52
-continued
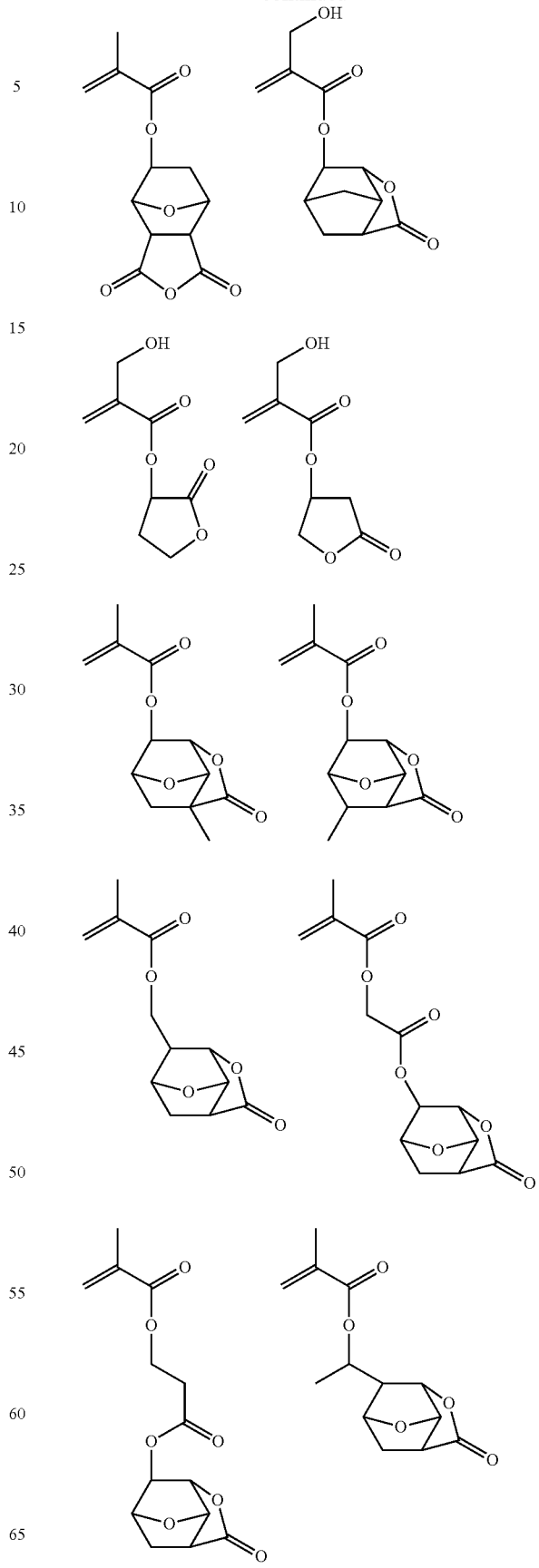

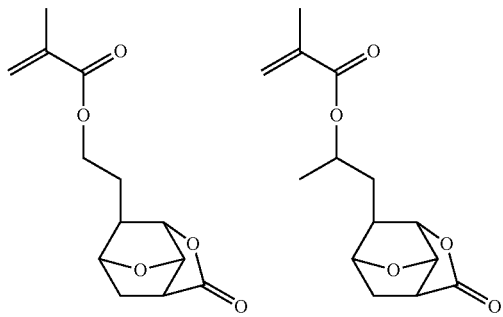
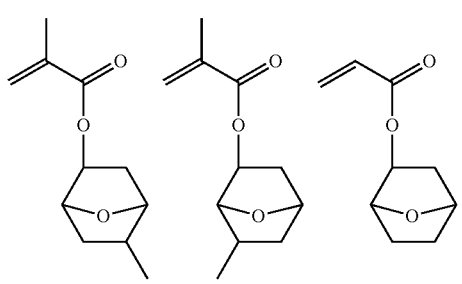
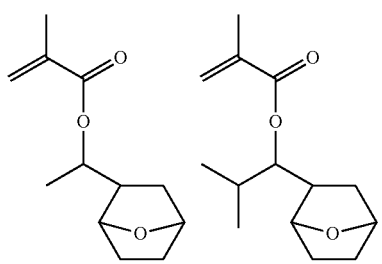
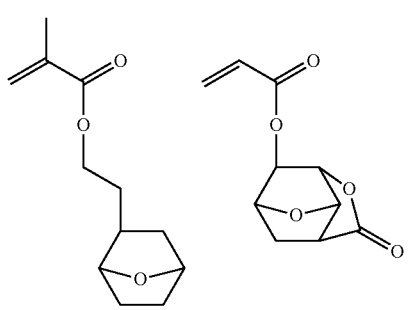
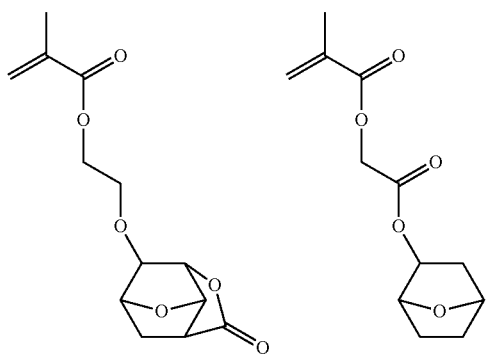
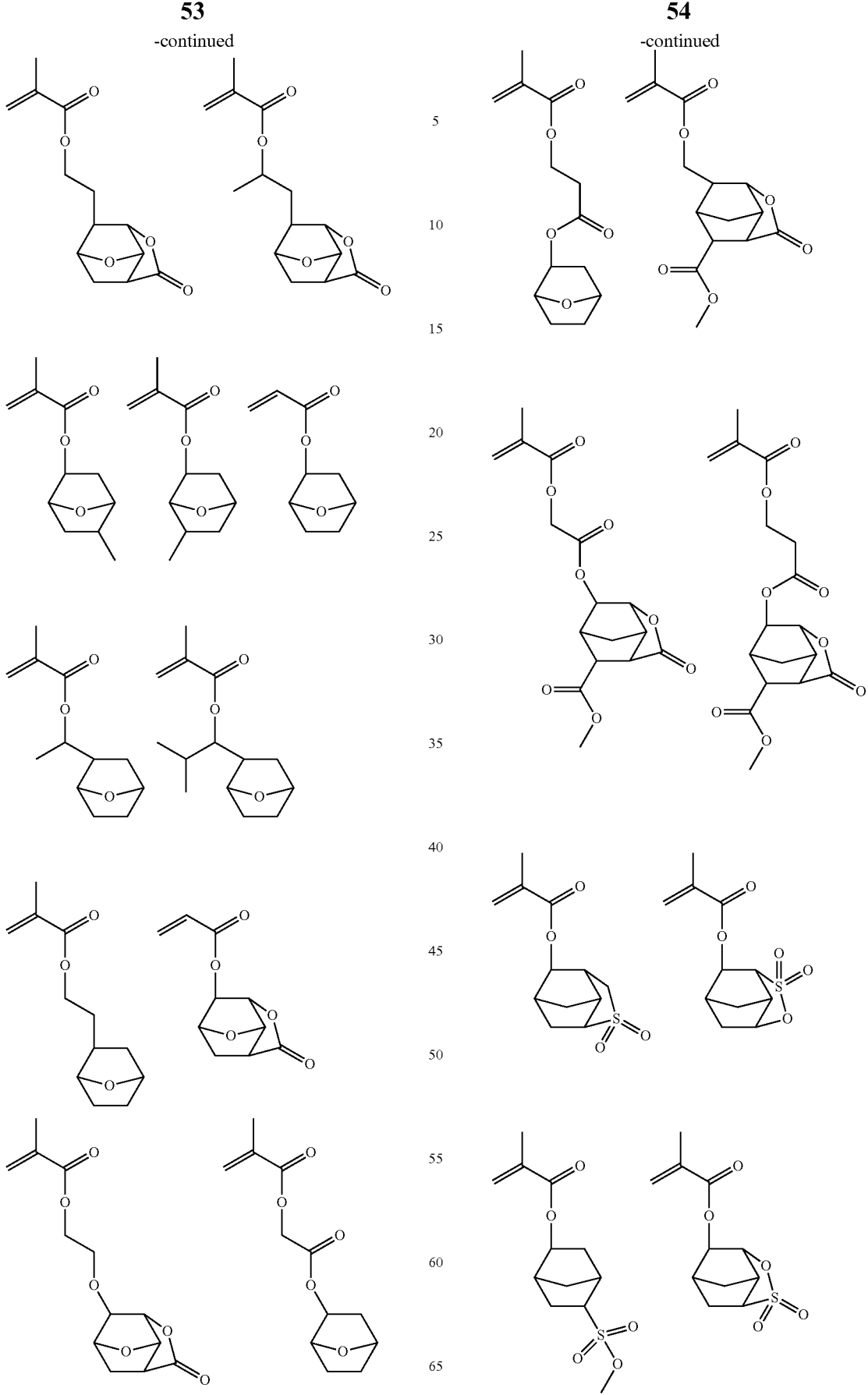

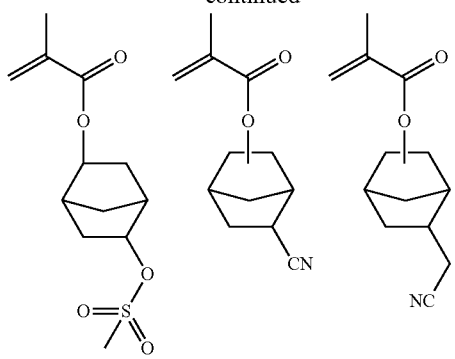
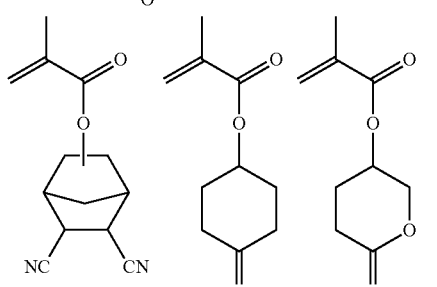
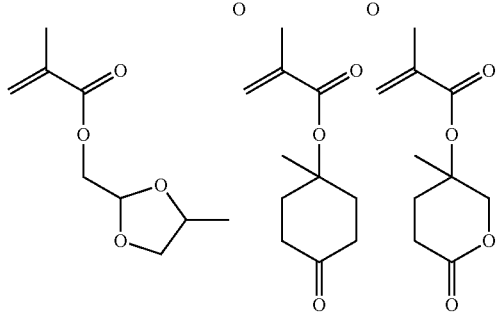
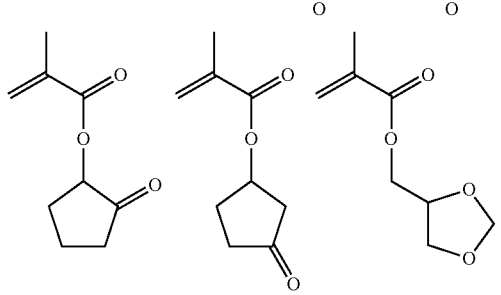
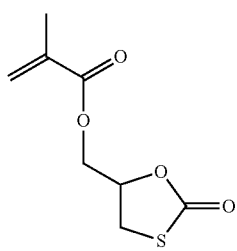
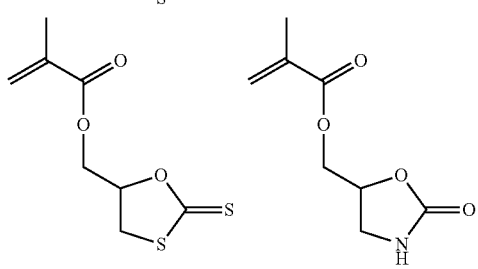
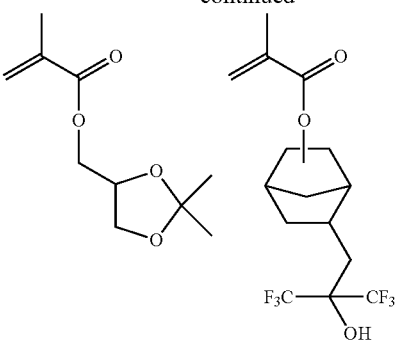
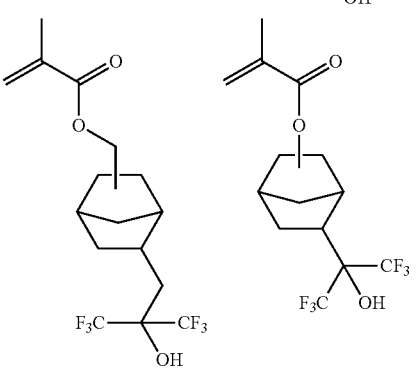
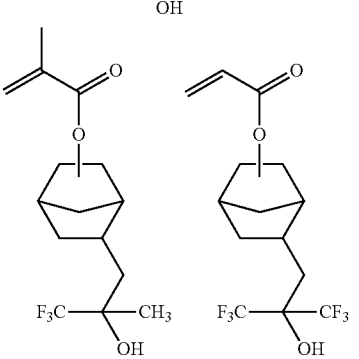
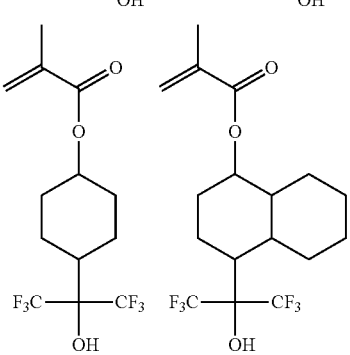
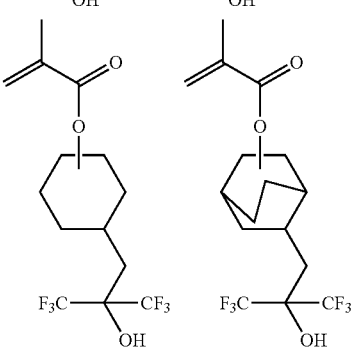

57
-continued
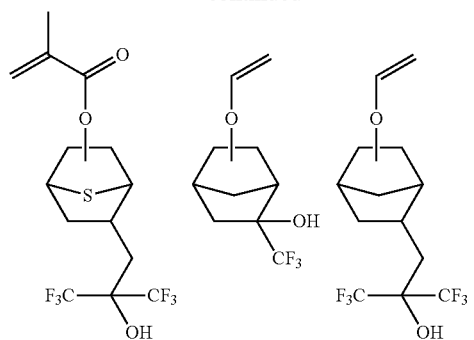
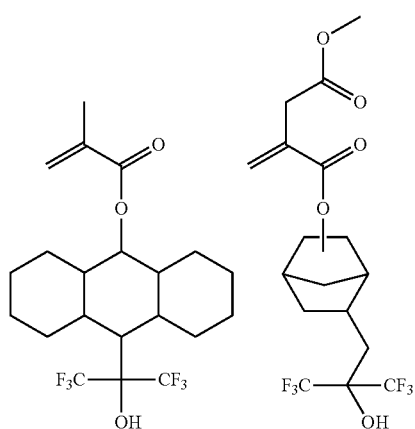
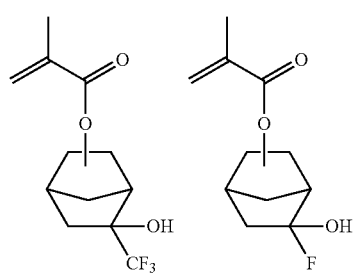
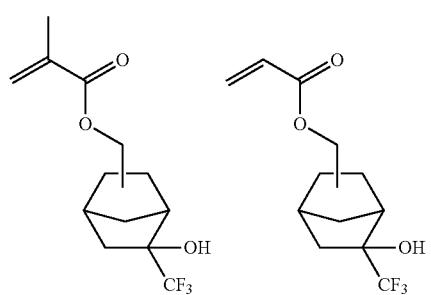
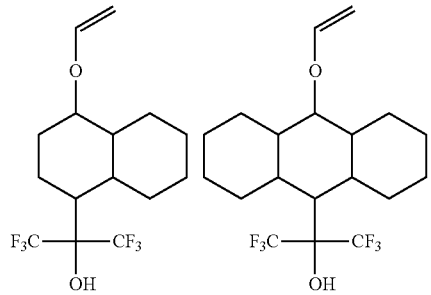
58
-continued
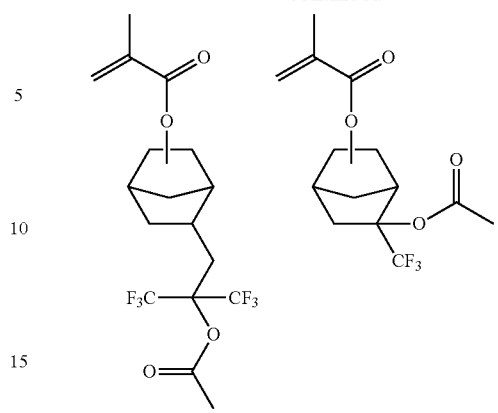
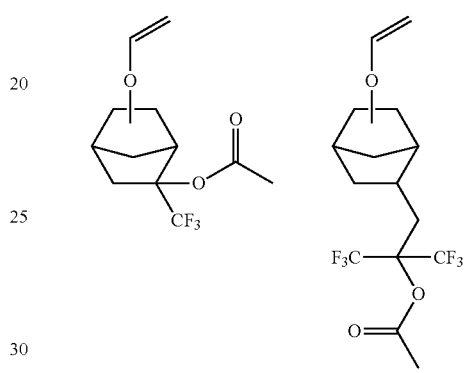
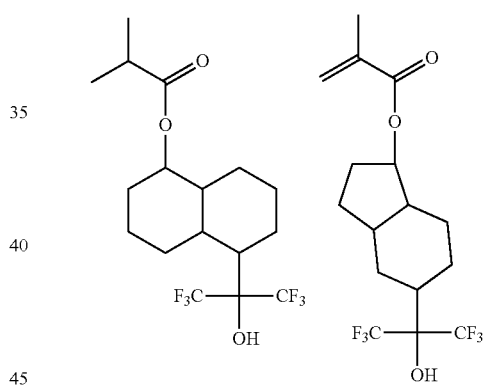
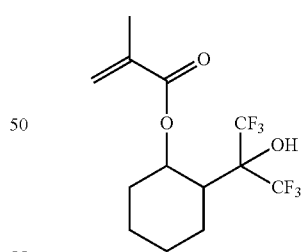
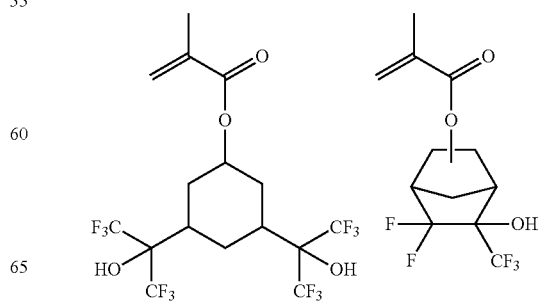

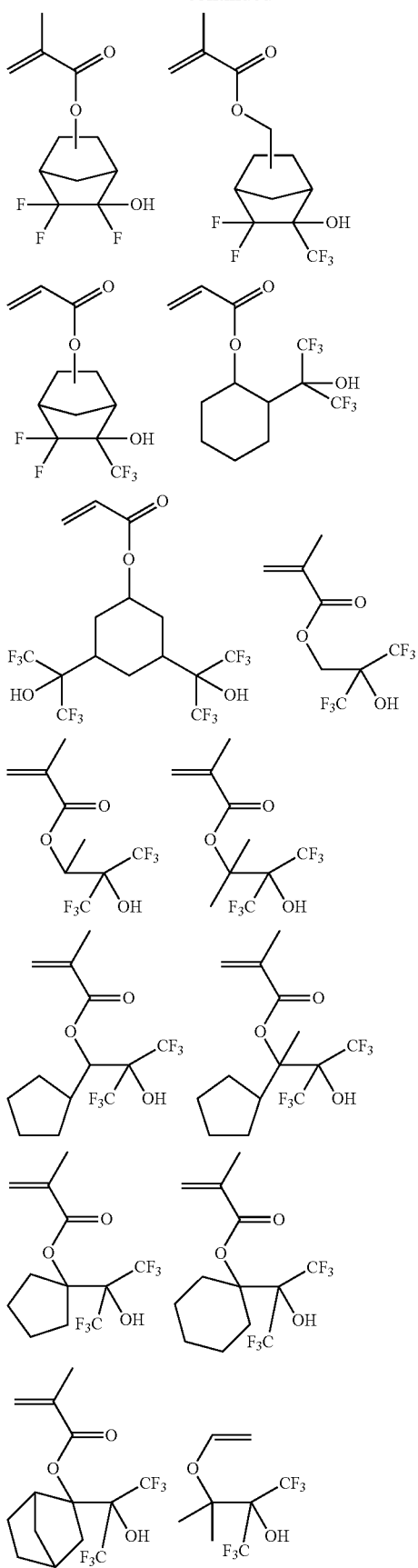
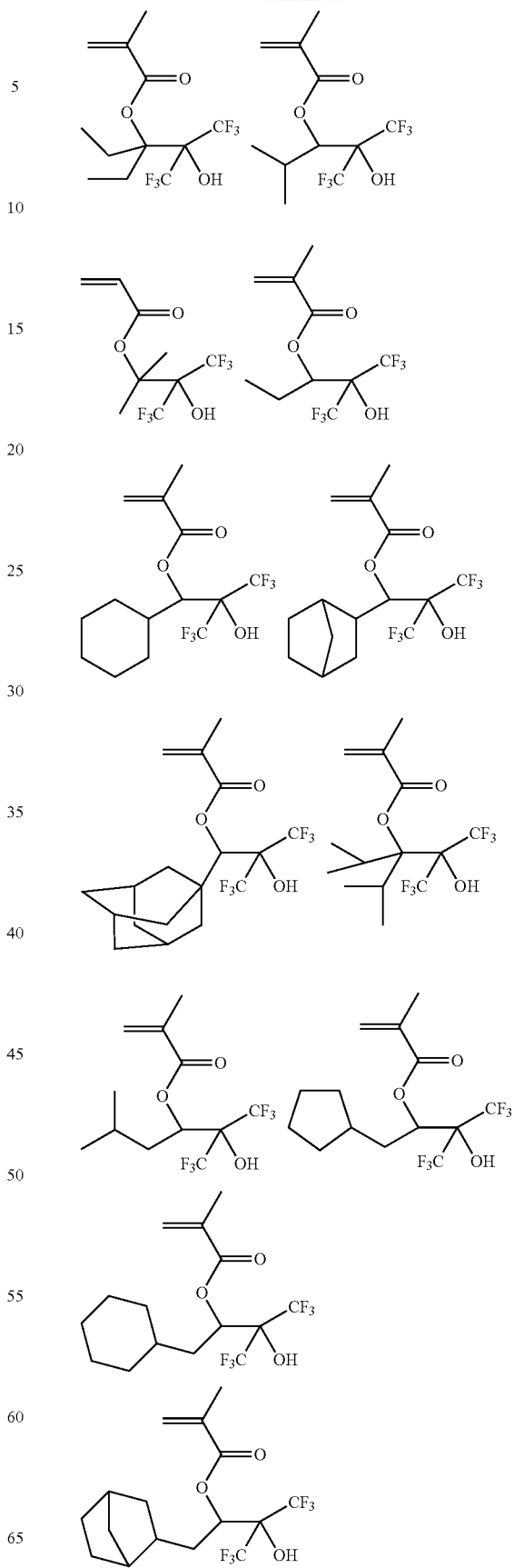

-continued
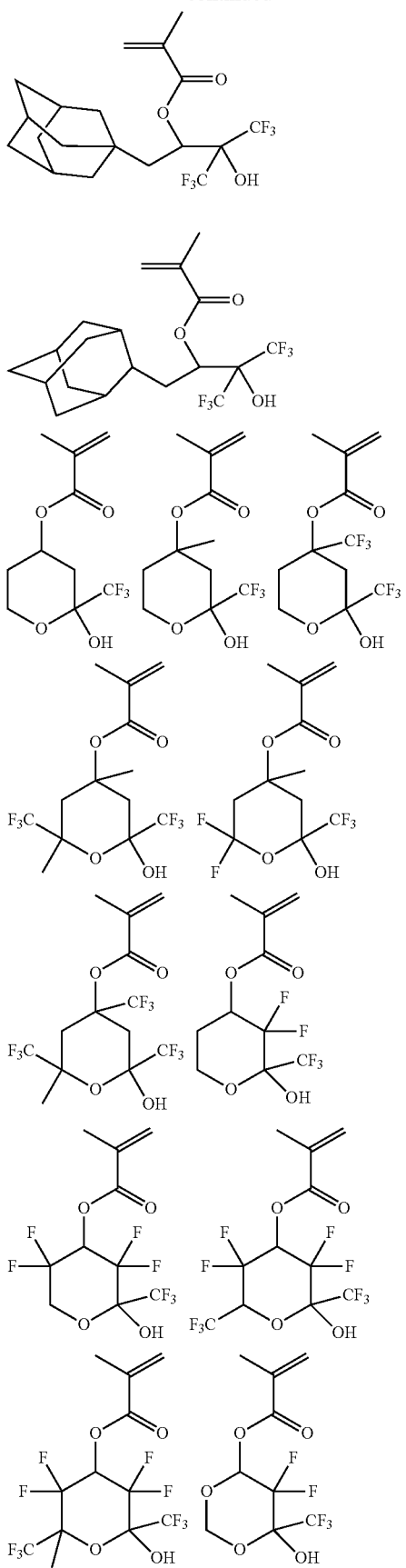
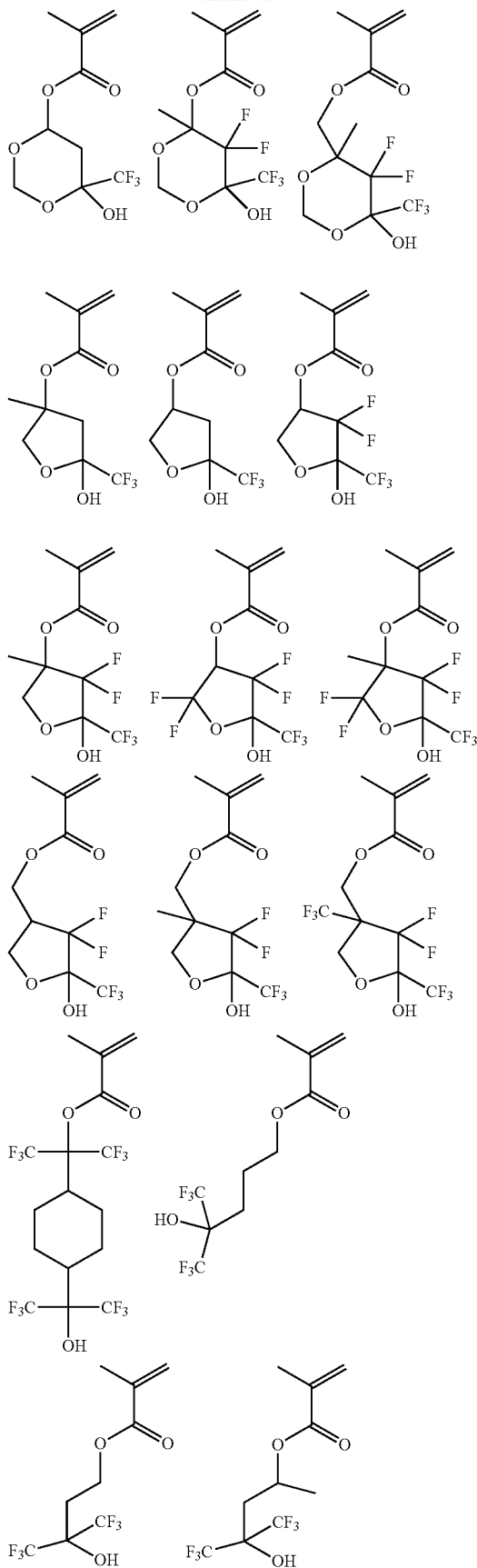

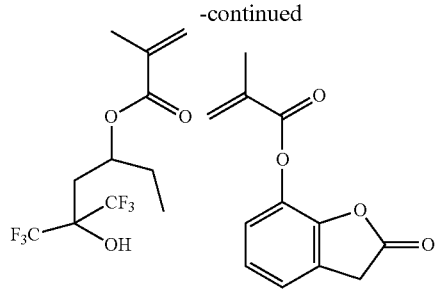
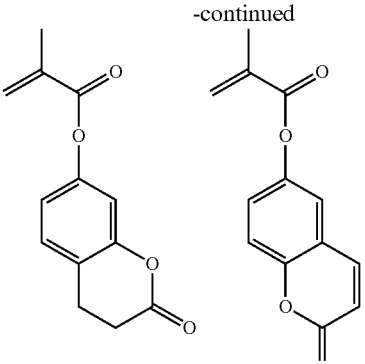
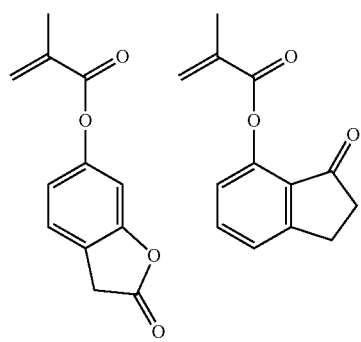
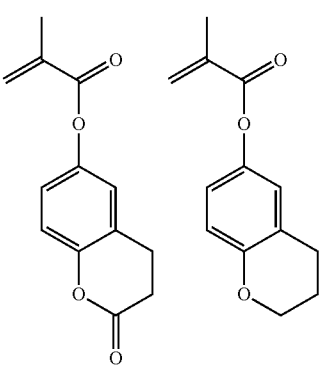
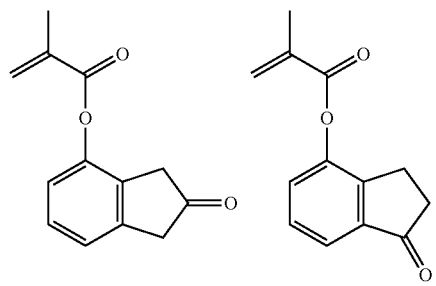
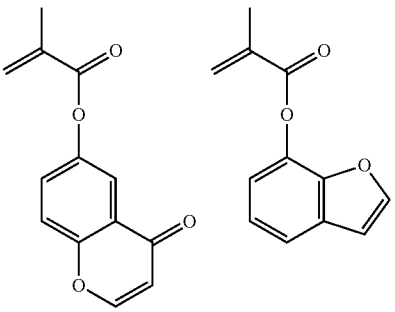
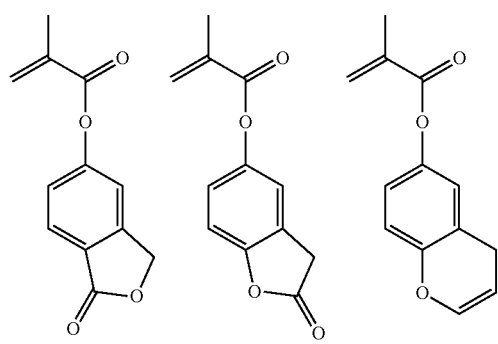
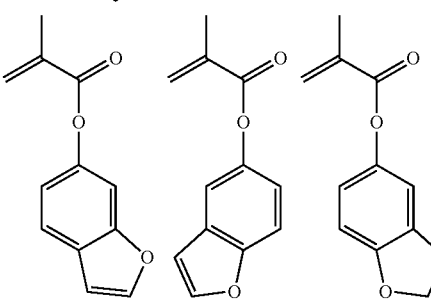
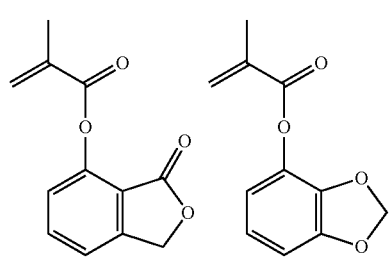
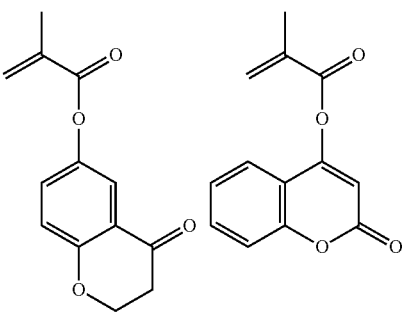

-continued
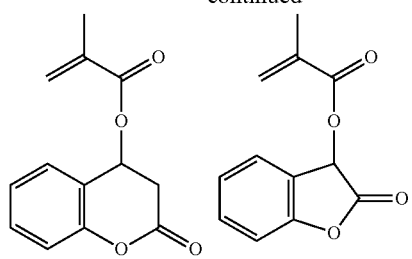
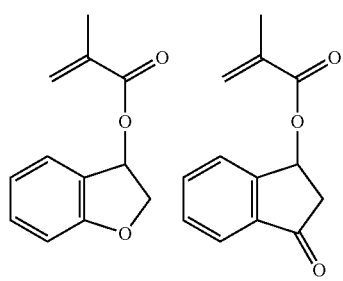
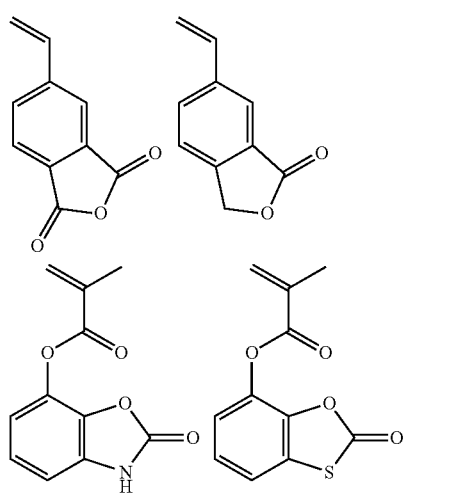
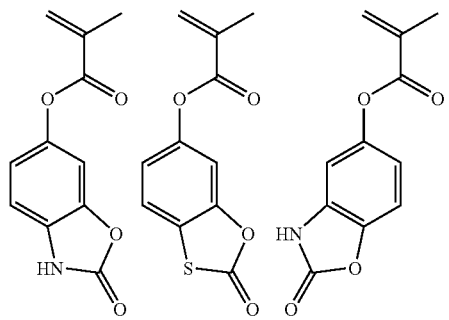
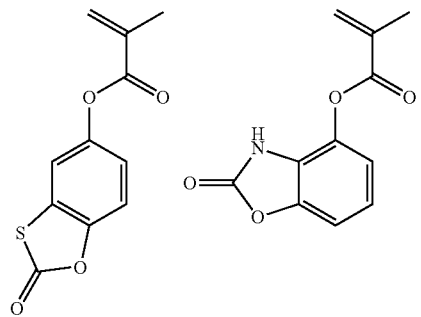
-continued
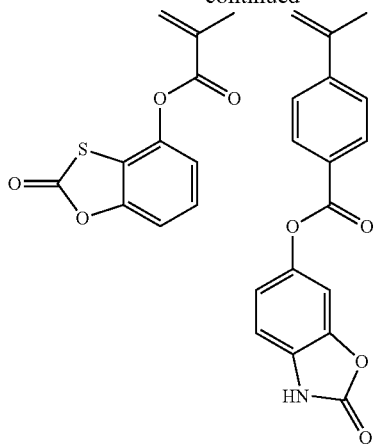
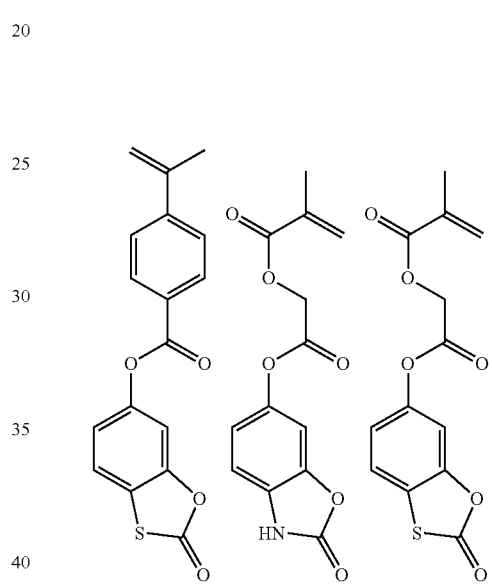
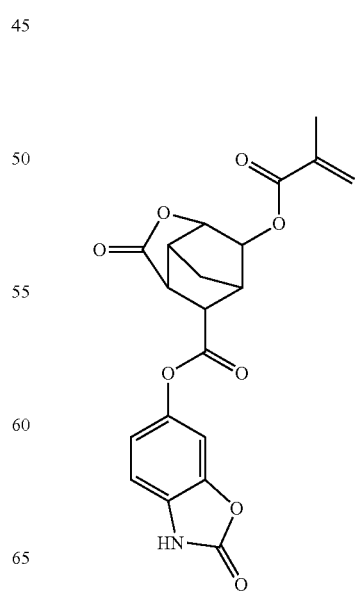

-continued

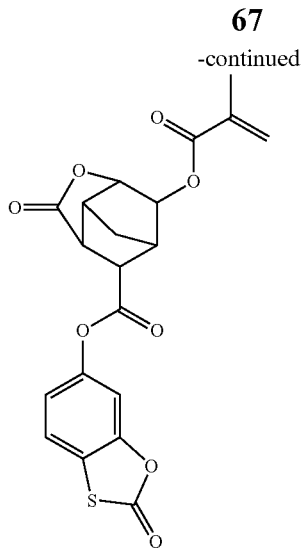

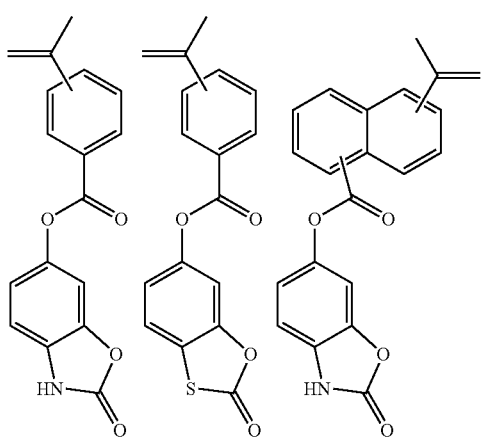

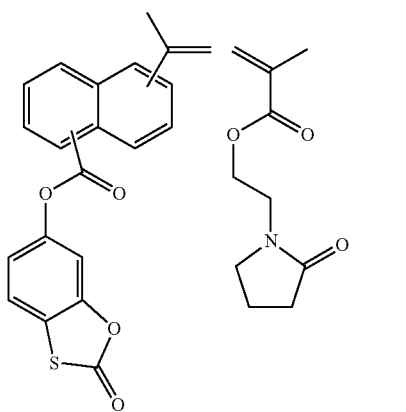

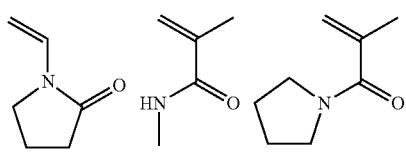

-continued

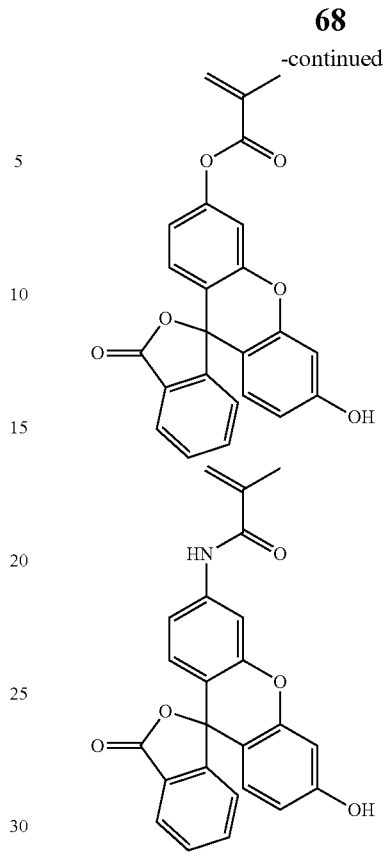

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In a more preferred embodiment, recurring units (d1), (d2) or (d3) having a sulfonium salt as represented by the following general formula (3) may be copolymerized. It is noted that JP-A 2006-045311 discloses a sulfonium or iodonium salt having polymerizable olefin capable of generating a specific sulfonic acid; and JP-A 2006-178317 discloses a sulfonium salt having sulfonic acid directly attached to the main chain.

(3)

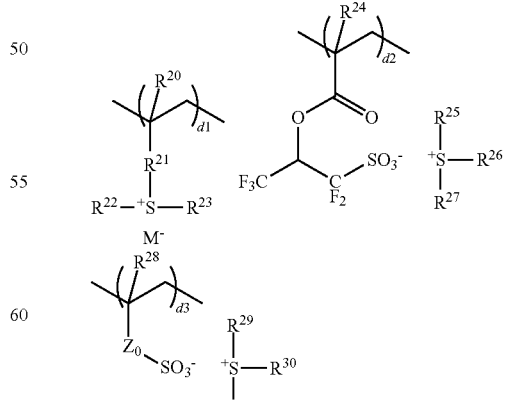

Herein $R^{20}$, $R^{24}$, and $R^{28}$ each are hydrogen or methyl. $R^{21}$ is a single bond, phenylene, —O—R—, or —C(=O)—$Y_0$—

R—. $Y_0$ is oxygen or NH. R is a straight, branched or cyclic $C_1$-$C_6$ alkylene group, alkenylene group or phenylene group, which may contain a carbonyl (—CO—), ester (—COO—), ether (—O—), or hydroxyl moiety. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $Z_0$ is a single bond, methylene, ethylene, phenylene, fluorinated phenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene group or phenylene group, which may contain a carbonyl, ester, ether or hydroxyl moiety. $M^-$ is a non-nucleophilic counter ion.

Binding an acid generator to the polymer backbone is effective for reducing acid diffusion and preventing the resolution from lowering due to blur by acid diffusion. Additionally, edge roughness (LER, LWR) is improved because the acid generator is uniformly dispersed.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

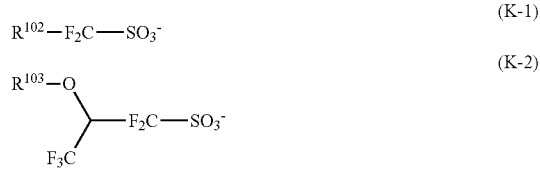

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl moiety or lactone ring.

The polymer defined herein may be synthesized by any desired methods, for example, by dissolving suitable monomers selected from the monomers to form the recurring units (a) to (d) in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

In order to prevent the recurring unit (a) from cyclization as a result of the acid labile group being deprotected by the heat during polymerization, a basic substance may be added to the polymerization system. The basic substance added herein is preferably a weakly basic compound, examples of which include aromatic amine compounds and amide compounds such as pyridine, dimethylaniline and quinoline.

When a hydroxyl-containing monomer such as hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the (co)polymer, recurring units (a) to (d) may be incorporated in the following molar fraction:
$0<a\leq1.0$, $0\leq b1<1.0$, $0\leq b2<1.0$, $0\leq b3<1.0$, $0\leq b4<1.0$, $0\leq b5<1.0$, $0\leq b6<1.0$, $0\leq b7<1.0$, $0\leq b1+b2+b3+b4+b5+b6+b7<1.0$, $0\leq c<1.0$, $0\leq d1\leq0.5$, $0\leq d2\leq0.5$, $0\leq d3\leq0.5$, and $0\leq d1+d2+d3\leq0.5$;
preferably $0.05\leq a\leq1.0$, $0\leq b1\leq0.95$, $0\leq b2\leq0.95$, $0\leq b3\leq0.95$, $0\leq b4\leq0.95$, $0\leq b5\leq0.95$, $0\leq b6\leq0.95$, $0\leq b7\leq0.95$, $0\leq b1+b2+b3+b4+b5+b6+b7\leq0.95$, $0\leq c\leq0.9$, $0\leq d1\leq0.4$, $0\leq d2\leq0.4$, $0\leq d3\leq0.4$, and $0\leq d1+d2+d3\leq0.4$;
more preferably $0.1\leq a\leq1.0$, $0\leq b1\leq0.9$, $0\leq b2\leq0.9$, $0\leq b3\leq0.9$, $0\leq b4\leq0.9$, $0\leq b5\leq0.9$, $0\leq b6\leq0.9$, $0\leq b7\leq0.9$, $0\leq b1+b2+b3+b4+b5+b6+b7\leq0.9$, $0\leq c\leq0.8$, $0\leq d1\leq0.35$, $0\leq d2\leq0.35$, $0\leq d3\leq0.35$, and $0\leq d1+d2+d3\leq0.35$. The more preferred range is $a<1.0$ and $0<b1+b2+b3+b4+b5+b6+b7$.

The polymer for use in the dual-tone resist composition should have a weight average molecular weight (Mw) in the range of 1,000 to 500,000, and preferably 2,000 to 30,000, as measured by gel permeation chromatography (GPC) versus polystyrene standards using tetrahydrofuran as a solvent. With too low a Mw, the resist composition becomes less heat resistant. A polymer with too high a Mw loses alkaline solubility and gives rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable as well as a blend of an inventive polymer and a polymer free of recurring units (a) of formula (1).

The polymer is advantageously used as a base resin in a dual-tone resist composition, typically chemically amplified dual-tone resist composition. Specifically, the polymer is used as a base resin and combined with any desired components including an organic solvent, acid generator, dissolution regulator, basic compound, and surfactant to formulate a dual-tone resist composition. In the exposed region, the dissolution rate of the polymer in developer is accelerated by catalytic reaction, that is, a dual-tone resist composition with a very high sensitivity is obtained. This dual-tone resist composition forms a resist film having a high dissolution contrast, resolution, exposure latitude, and process adaptability, and providing a good pattern profile after exposure, yet better etch resistance, and minimal proximity bias because of controlled acid diffusion. Because of these advantages, the composition is readily implemented in practice and best suited as a VLSI-forming resist material and mask pattern forming material. Particularly when an acid generator is added to the composition to formulate a chemically amplified dual-tone resist composition capable of utilizing acid-catalyzed reaction, the composition has a higher sensitivity and is further improved in the properties described above.

As alluded to previously, a crosslinker may be added to the dual-tone resist composition. Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

The crosslinker may be blended in an amount of 0 to 50 parts, preferably 5 to 50 parts, and more preferably 10 to 30 parts by weight per 100 parts by weight of the base resin. At least 5 parts of the crosslinker achieves a sufficient improvement in resolution. As long as the amount of the crosslinker is not more than 50 parts, there is a minimized risk that resolution is reduced as a result of pattern features merging together. The crosslinkers may be used alone or in admixture.

Addition of a basic compound may be effective in suppressing the diffusion rate of acid in the resist film, achieving a further improvement in resolution. Addition of a surfactant may improve or control the coating characteristics of the resist composition.

The resist composition may include an acid generator in order for the composition to function as a chemically amplified dual-tone resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in JP-A 2008-111103, paragraphs [0122] to [0142] (U.S. Pat. No. 7,537,880). In the embodiment wherein a polymer having recurring units (d1), (d2) or (d3) copolymerized therein is used as the base resin, the PAG may be omitted.

As alluded to above, an organic solvent, basic compound, dissolution regulator, surfactant, and/or acetylene alcohol may be added to the resist composition. Examples of the organic solvent used herein are described in JP-A 2008-111103, paragraphs [0144] to [0145] (U.S. Pat. No. 7,537,880), exemplary basic compounds in paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The dual-tone resist composition, typically chemically amplified dual-tone resist composition comprising a polymer comprising recurring units (a) of formula (1), an acid generator, and a basic compound in an organic solvent is used in the fabrication of various integrated circuits. Pattern formation using the resist composition may be performed by well-known lithography processes. The process generally involves coating of the resist composition on a substrate, prebake, exposure to high-energy radiation, and development in a developer for thereby forming a pattern on the substrate. If necessary, any additional steps may be added.

For instance, the dual-tone resist composition is applied onto a substrate on which an integrated circuit is to be formed (e.g., Si, SiO$_2$, SiN, SiON, TiN, WSi, BPSG, SOG, or organic antireflective coating) or a substrate on which a mask circuit is to be formed (e.g., Cr, CrO, CrON or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick. If desired, a protective film may be formed on the resist film. The protective film is preferably formed of an alkaline developer-soluble composition so that both formation of a resist pattern and stripping of the protective film may be achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100 µC/cm$^2$, more preferably 0.5 to 50 µC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous alkaline solution for 3 seconds to 3 minutes, preferably 5 seconds to 2 minutes by conventional techniques such as dip, puddle or spray techniques. Suitable developers include 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH), and tetrabutylammonium hydroxide (TBAH). The exposed region of resist film is insolubilized whereas the unexposed region of resist film is dissolved in the developer. In this way, the desired dual-tone pattern is formed on the substrate. It is appreciated that the resist composition of the invention is best suited for micropatterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

At the end of development, the resist film is rinsed. Although water is most often used as the rinsing liquid, use may also be made of a rinse liquid having a surfactant added thereto for the purpose of preventing pattern collapse or a rinse liquid having carbonic acid or acidic substance added thereto for the purpose of preventing blob defect formation.

Referring to FIG. 1, the patterning process is illustrated in further detail. FIG. 1 A shows a multilayer structure including a substrate 10 on which a processable layer 20, a hard mask layer 30, and a resist film 40 are formed in the described order. The processable layer 20 may be made of Si, SiO$_2$, SiN, SiON, SiC, TiN, organic BARC, Cr, CrO, CrN, MoSi, or Ta, for example. The hard mask layer 30 may be made of Si, SiO$_2$, SiN, SiON, SOG, spin-on-carbon, or TiN, for example. The resist film 40 is of the dual-tone resist composition. The processable layer and hard mask layer each preferably have a thickness of 0.1 to 10 µm. In FIG. 1 B, the resist film 40 is exposed to radiation, with exposed regions depicted at 50. In FIG. 1 C, the resist film 40 is developed. Of the resist film 40, exposed regions 40a of high dose are not dissolved in the developer, i.e., are left intact whereas exposed regions 60 of intermediate dose are dissolved in the developer. FIG. 1 D shows etching of the hard mask film 30. FIG. 1 E shows etching of the processable layer 20.

Figure 6:
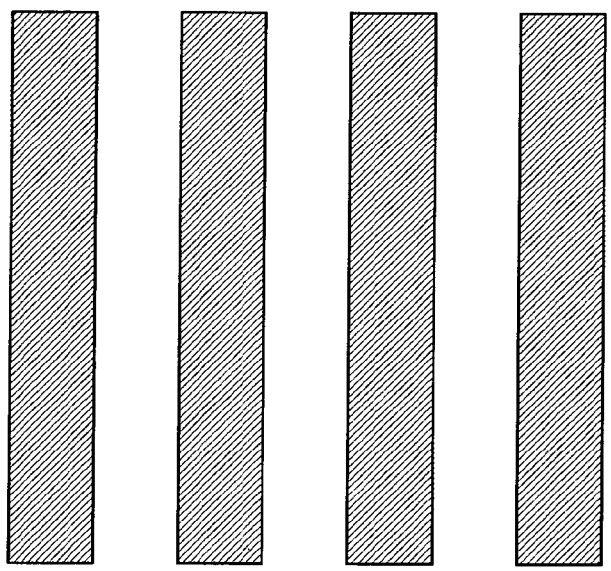
FIG. 6 schematically illustrates a bright line mask pattern.
Figure 7:
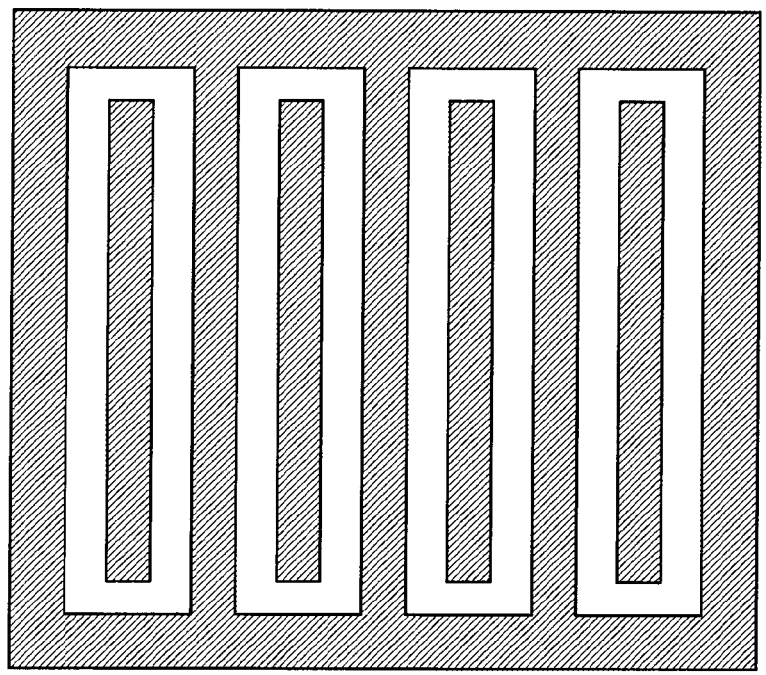
FIG. 7 is a plan view of a pattern as developed, using the bright line mask and a dual-tone resist according to the invention.
Figure 8:
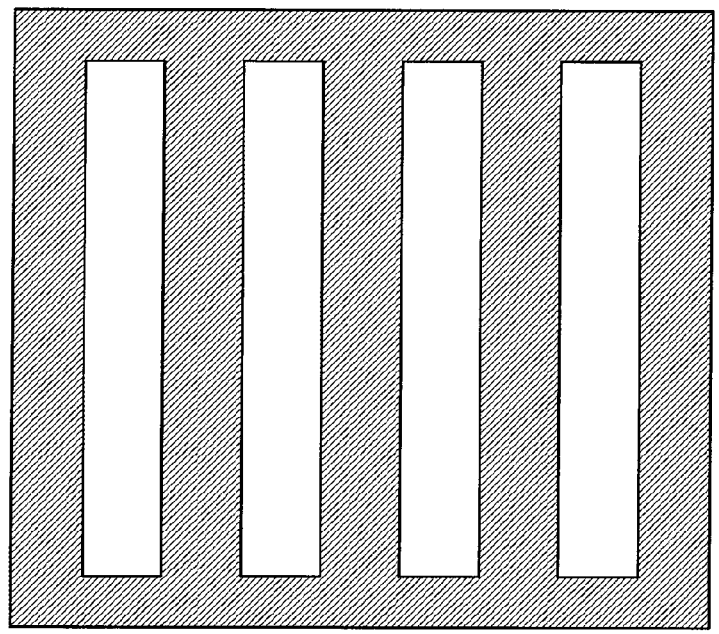
FIG. 8 schematically illustrates a dark trench mask pattern.
Figure 9:
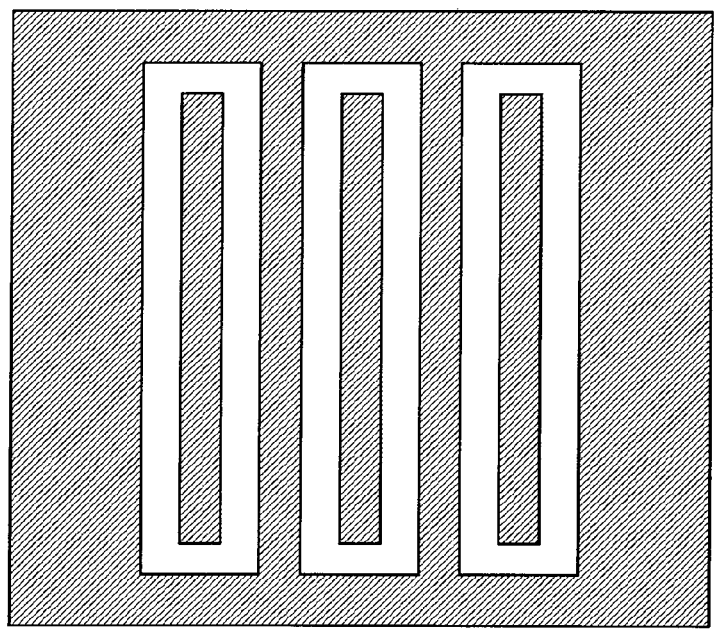
FIG. 9 is a plan view of a pattern as developed, using the dark trench mask and a dual-tone resist according to the invention.

As seen from FIG. 1, the inventive patterning process is successful in doubling a resolution over the conventional process. When a mask pattern of bright lines as shown in FIG. 6 is used, the patterning process of the invention forms doughnut-shaped lines as shown in FIG. 7. When unnecessary end portions of lines are cut off, patterning to this end is necessary. The exposure for end cutting, however, does not require a high resolution. When a mask of dark pattern as shown in FIG. 8 is used, a pattern as shown in FIG. 9 is formed.

Figure 2:
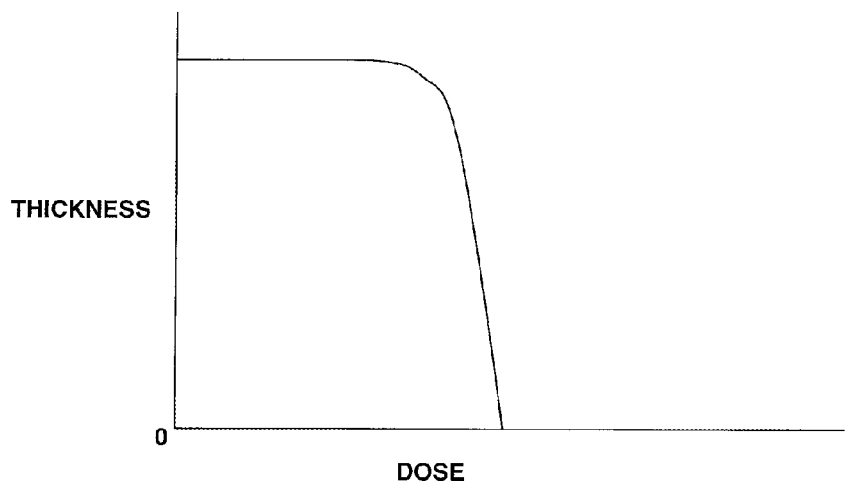
FIG. 2 shows a contrast curve (thickness versus dose) of a prior art positive resist pattern.
Figure 3:
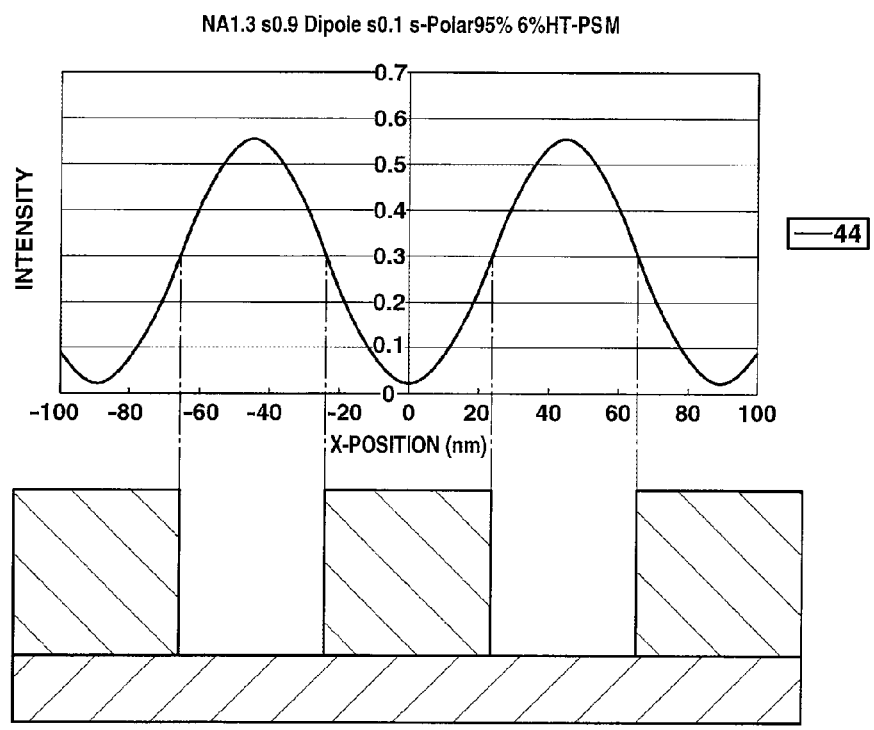
FIG. 3 illustrates an optical image and a cross-sectional shape of a prior art positive resist pattern.

FIG. 2 shows a contrast curve of a prior art positive resist composition. The diagram plots an exposure dose on the abscissa and a film thickness on the ordinate, the right side on the abscissa indicates a high exposure dose, and the upper side on the ordinate indicates an increased thickness. It is seen that as the exposure dose is increased, the film thickness starts decreasing at a certain threshold. When this resist composition is exposed to an optical image as shown in the upper section of FIG. 3, a pattern as shown in the lower section of FIG. 3 is obtained.

Figure 4:
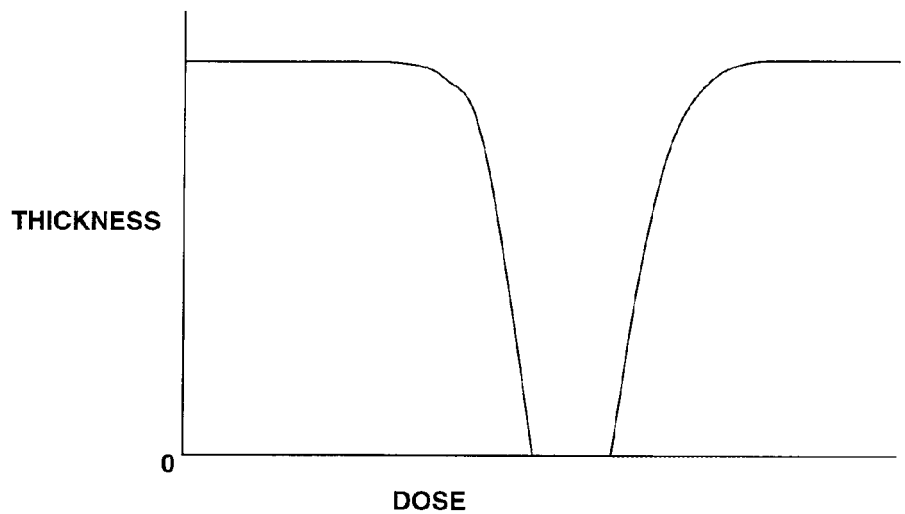
FIG. 4 shows a contrast curve (thickness versus dose) of a dual-tone resist pattern according to the invention.
Figure 5:
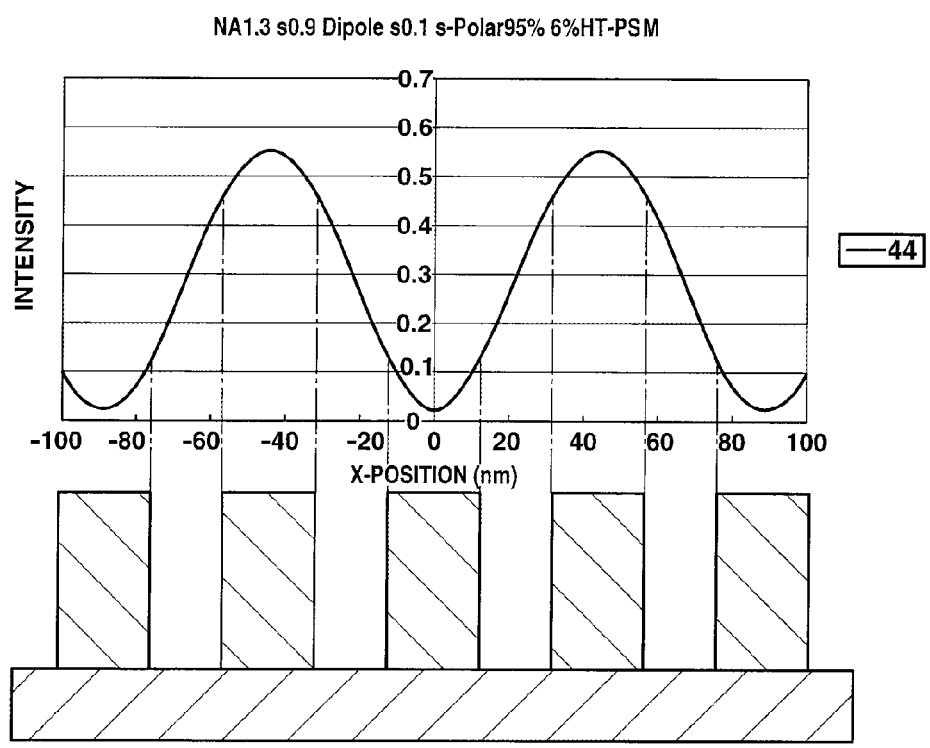
FIG. 5 illustrates an optical image and a cross-sectional shape of a dual-tone resist pattern according to the invention.

FIG. 4 shows a contrast curve of a dual-tone resist composition of the invention. As the exposure dose is increased, dissolution proceeds like a positive resist material until the film thickness reaches zero (0). As the exposure dose is further increased, the film thickness increases like a negative resist material. When the dual-tone resist composition is exposed to an optical image as shown in the upper section of FIG. 5, a pattern as shown in the lower section of FIG. 5 is obtained. As compared with the pattern of FIG. 3, the pattern of FIG. 5 has a half line width. The pattern includes a double number of lines formed at the same pitch.

The resist film is then exposed to a desired pattern of high-energy radiation in a wavelength range of 3 to 450 nm or EB, especially g-line of 430 nm, i-line of 365 nm, KrF excimer laser of 248 nm, EUV of 13.5 nm, or EB.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 10 minutes, preferably at 80 to 120° C. for 1 to 6 minutes (post-exposure baking=PEB).

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle or spray techniques. In this way, a desired resist pattern is formed on the substrate.

Next, using the resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the resist film is removed. Removal of resist film may also be carried out after etching of the intermediate intervening layer of hard mask or the like. It is noted that removal of the resist film may be achieved by dry etching with oxygen or radicals.

EXAMPLE

Examples of the invention are given below by way of illustration and not by way of limitation. For all polymers, Mw and Mn are determined versus polystyrene standards by GPC using tetrahydrofuran solvent. All parts are by weight (pbw).

As used in Synthesis Examples, Monomers 1 to 4, Adhesive Monomers 1 and 2, and PAG Monomer 1 are identified below.

Monomer 1

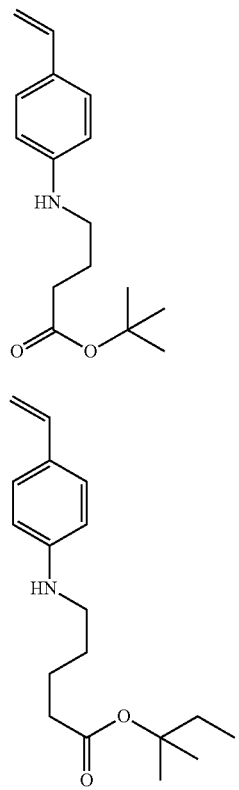

Monomer 2

Monomer 3

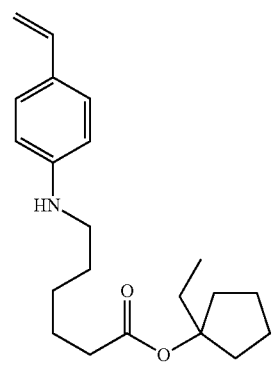

Monomer 4

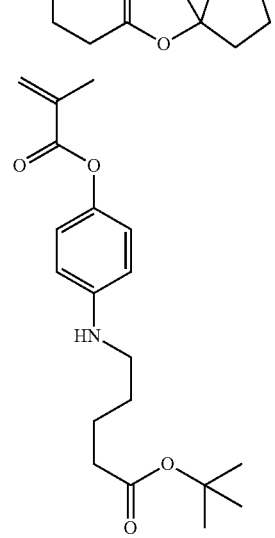

Adhesive Monomer 1

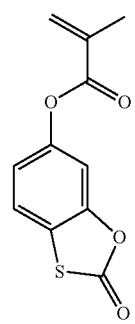

Adhesive Monomer 2

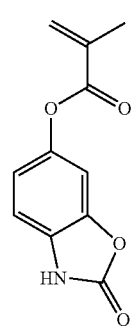

Adhesive Monomer 1: 2-oxo-1,3-benzoxathiol-5-yl methacrylate

Adhesive Monomer 2: 2-oxo-2,3-dihydrobenzoxazol-5-yl methacrylate

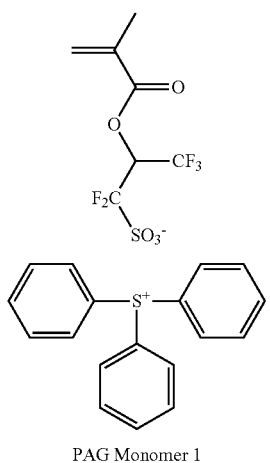

PAG Monomer 1

PAG Monomer 1: triphenylsulfonium 1,1,3,3,3-pentafluoro-2-methacryloyloxypropane-1-sulfonate Synthesis Example 1

A 2-L flask was charged with 4.1 g of Monomer 1, 6.0 g of 4-hydroxystyrene, 3.1 g of styrene, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of azobisisobutyronitrile (AIBN) was added. The reactor was heated at 60° C., whereupon reaction ran for 15 hours. The reaction solution was poured into 1 L of isopropyl alcohol for precipitation. The resulting white solid was collected by filtration and dried at 60° C., yielding a white polymer. The polymer was analyzed by $^{13}$C- and $^{1}$H-NMR and GPC, with the results shown below.

Copolymer Compositional Ratio (Molar Ratio)
Monomer 1:4-hydroxystyrene:styrene=0.30:0.55:0.15
Mw=6,600
Mw/Mn=1.76
This polymer is designated Polymer 1.

Polymer 1

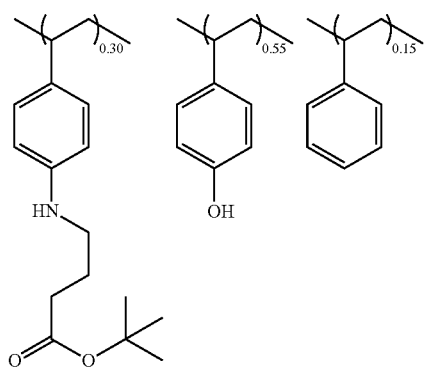

Synthesis Example 2

A 2-L flask was charged with 4.1 g of Monomer 1, 7.2 g of 4-hydroxystyrene, 2.9 g of indene, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}$C- and $^{1}$H-NMR and GPC, with the results shown below.

Copolymer Compositional Ratio (Molar Ratio)
Monomer 1:4-hydroxystyrene:indene=0.30:0.60:0.10
Mw=6,100
Mw/Mn=1.61
This polymer is designated Polymer 2.

Polymer 2

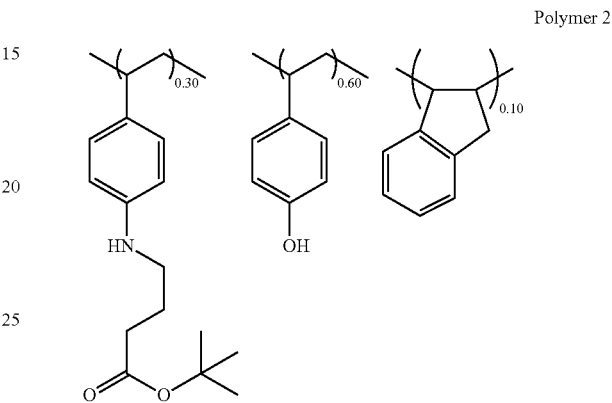

Synthesis Example 3

A 2-L flask was charged with 4.1 g of Monomer 1, 7.2 g of 4-hydroxystyrene, 3.7 g of coumarin, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}$C- and $^{1}$H-NMR and GPC, with the results shown below.

Copolymer Compositional Ratio (Molar Ratio)
Monomer 1:4-hydroxystyrene:coumarin=0.20:0.60:0.20
Mw=6,300
Mw/Mn=1.69
This polymer is designated Polymer 3.

Polymer 3

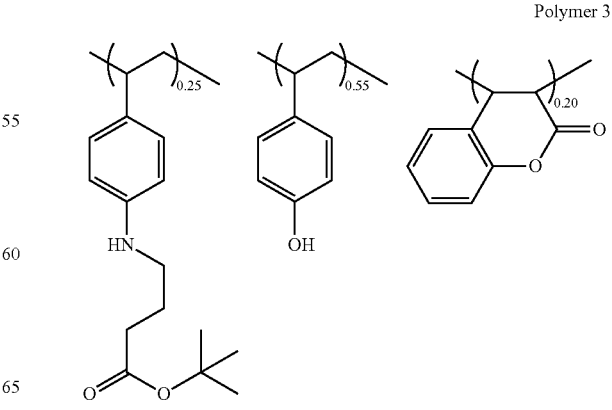

Synthesis Example 4

A 2-L flask was charged with 4.1 g of Monomer 1, 7.2 g of 4-hydroxystyrene, 3.7 g of chromone, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}C$- and $^{1}H$-NMR and GPC, with the results shown below.

Copolymer Compositional Ratio (Molar Ratio)

Monomer 1:4-hydroxystyrene:chromone=0.20:0.60:0.20

Mw=6,100

Mw/Mn=1.67

This polymer is designated Polymer 4.

Polymer 4

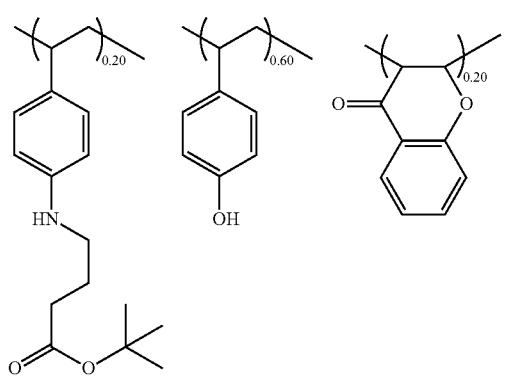

Synthesis Example 5

A 2-L flask was charged with 4.1 g of Monomer 1, 7.2 g of 4-hydroxystyrene, 3.7 g of methyl 2,5-norbornadiene-2-carboxylate, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}C$- and $^{1}H$-NMR and GPC, with the results shown below.

Copolymer Compositional Ratio (Molar Ratio)

Monomer 1:4-hydroxystyrene:methyl 2,5-norbornadiene-2-carboxylate=0.20:0.60:0.20

Mw=5,100

Mw/Mn=1.69

This polymer is designated Polymer 5.

Polymer 5

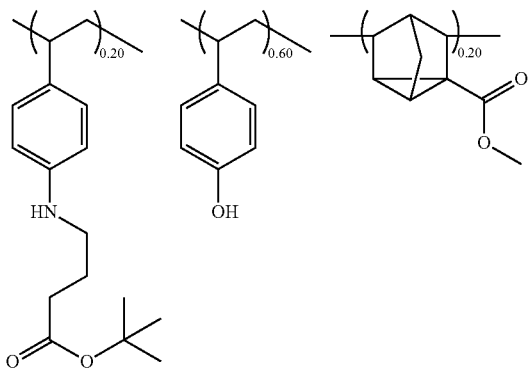

Synthesis Example 6

A 2-L flask was charged with 4.1 g of Monomer 1, 7.2 g of 4-hydroxystyrene, 3.9 g of N-vinylcarbazole, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}C$- and $^{1}H$-NMR and GPC, with the results shown below.

Copolymer Compositional Ratio (Molar Ratio)

Monomer 1:4-hydroxystyrene:N-vinylcarbazole=0.20: 0.60:0.20

Mw=5,600

Mw/Mn=1.77

This polymer is designated Polymer 6.

Polymer 6

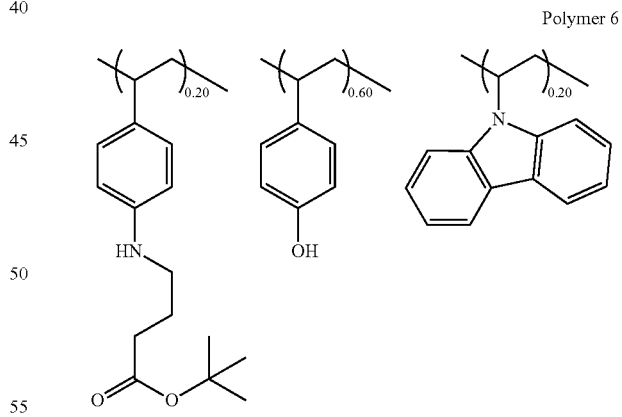

Synthesis Example 7

A 2-L flask was charged with 23.3 g of Monomer 3, 6.7 g of 2-oxooxolan-3-yl methacrylate, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}$C- and $^1$H-NMR and GPC, with the results shown below.

Copolymer Compositional Ratio (Molar Ratio)
Monomer 3:2-oxooxolan-3-yl methacrylate=0.40:0.60
Mw=7,100
Mw/Mn=1.79
This polymer is designated Polymer 7.

Polymer 7

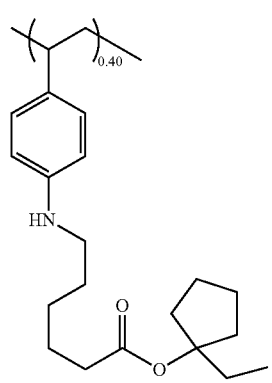

Synthesis Example 8

A 2-L flask was charged with 4.4 g of Monomer 2, 13.5 g of 4-(1,1,1,3,3,3-hexafluoro-2-hydroxypropyl)styrene, 3.1 g of 1-vinylnaphthalene, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}$C- and $^1$H-NMR and GPC, with the results shown below.

Copolymer Compositional Ratio (Molar Ratio)
Monomer 2:4-(1,1,1,3,3,3-hexafluoro-2-hydroxypropyl)styrene:1-vinylnaphthalene=0.20:0.50:0.30
Mw=6,600
Mw/Mn=1.76
This polymer is designated Polymer 8.

Polymer 8

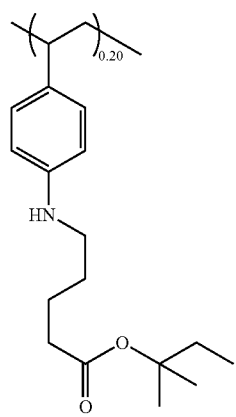

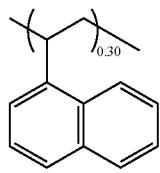

Synthesis Example 9

A 2-L flask was charged with 6.6 g of Monomer 2, 20 g of fluorescein methacrylate, 3 g of acenaphthylene, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and dried at 60° C., yielding a white polymer. The polymer was analyzed by $^{13}$C- and $^1$H-NMR and GPC, with the results shown below.

Copolymer Compositional Ratio (Molar Ratio)
Monomer 2:fluorescein methacrylate:acenaphthylene=0.30:0.50:0.20
Mw=6,500
Mw/Mn=1.86
This polymer is designated Polymer 9.

Polymer 9

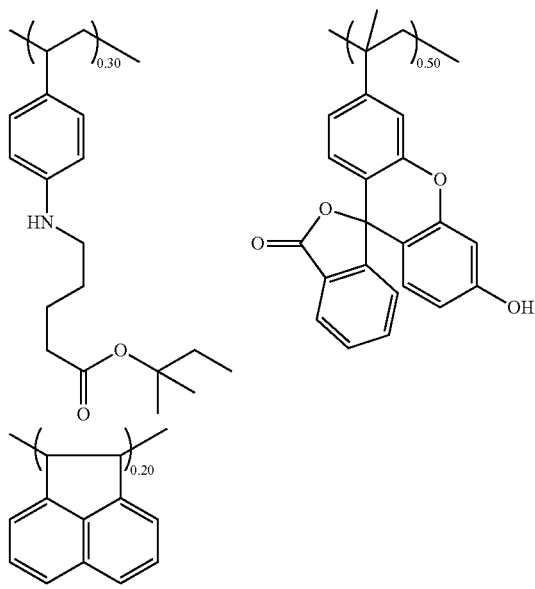

Synthesis Example 10

A 2-L flask was charged with 6.6 g of Monomer 2, 4.1 g of 4-hydroxy-3,5-dimethylphenyl methacrylate, 11.8 g of Adhesive Monomer 1, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and vacuum dried at 60° C., yielding a white polymer. The polymer was analyzed by $^{13}$C- and $^{1}$H-NMR and GPC, with the results shown below.

Copolymer Compositional Ratio (Molar Ratio)
Monomer 2:4-hydroxy-3,5-dimethylphenyl methacrylate: Adhesive Monomer 1=0.30:0.20:0.50
Mw=7,000
Mw/Mn=1.79
This polymer is designated Polymer 10.

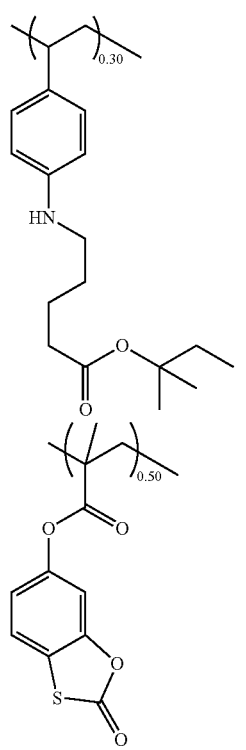

Polymer 10

Synthesis Example 11

A 2-L flask was charged with 6.6 g of Monomer 2, 3.6 g of 4-hydroxyphenyl methacrylate, 6.6 g of Adhesive Monomer 2, 5.6 g of PAG Monomer 1, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and vacuum dried at 60° C., yielding a white polymer. The polymer was analyzed by $^{13}$C- and $^{1}$H-NMR and GPC, with the results shown below.

Copolymer Compositional Ratio (Molar Ratio)
Monomer 2:4-hydroxyphenyl methacrylate:Adhesive Monomer 2:PAG Monomer 1=0.30:0.30:0.30:0.10
Mw=7,900
Mw/Mn=1.70

This polymer is designated Polymer 11.

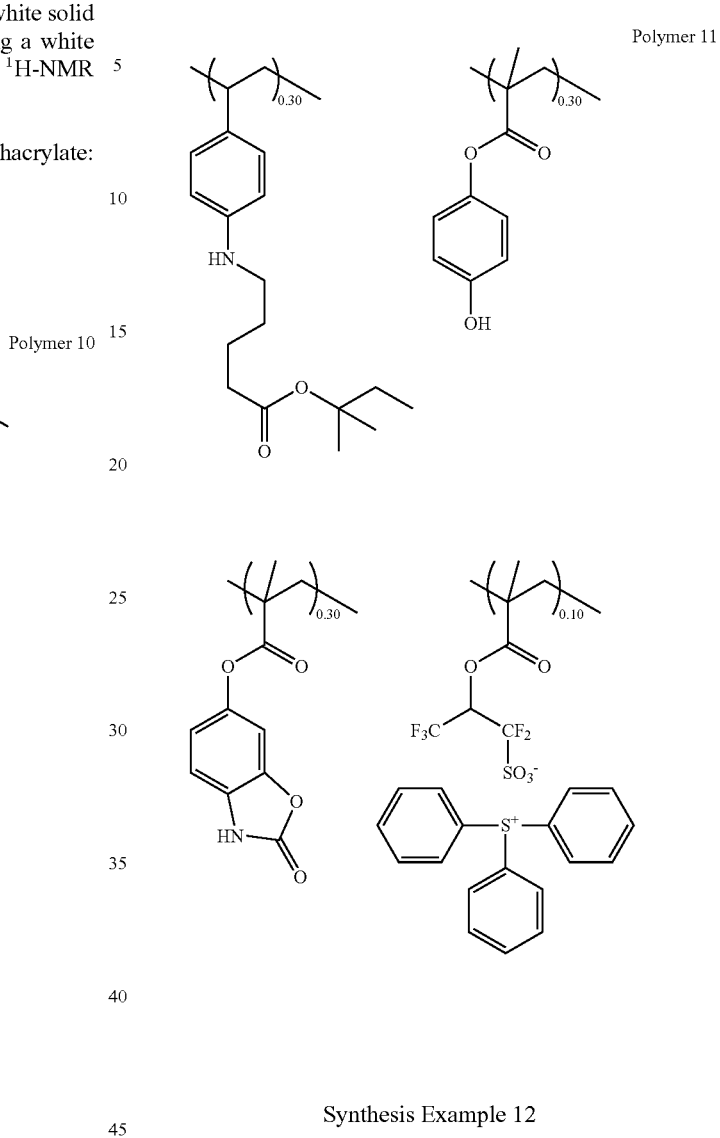

Polymer 11

Synthesis Example 12

A 2-L flask was charged with 6.6 g of Monomer 4, 6.8 g of 5-hydroxynaphthalen-1-yl methacrylate, 6.7 g of 3-oxo-2,7-dioxatricyclo[4.2.1.0$^{4,8}$]nonan-9-yl methacrylate, 5.6 g of PAG Monomer 1, 1 g of pyridine, and 40 g of tetrahydrofuran as solvent. The reactor was cooled at −70° C. in a nitrogen atmosphere, after which vacuum pumping and nitrogen blow were repeated three times. The reactor was warmed up to room temperature, whereupon 1.2 g of AIBN was added. The reactor was heated at 60° C., whereupon reaction ran for 15 hours. The reaction solution was poured into 1 L of isopropyl alcohol for precipitation. The resulting white solid was filtered and vacuum dried at 60° C., yielding a white polymer. The polymer was analyzed by $^{13}$C- and $^{1}$H-NMR and GPC, with the results shown below.

Copolymer Compositional Ratio (Molar Ratio)
Monomer 4:5-hydroxynaphthalen-1-yl methacrylate:3-oxo-2,7-dioxatricyclo[4.2.1.0$^{4,8}$]nonan-9-yl methacrylate:PAG Monomer 1=0.30:0.30:0.30:0.10
Mw=7,800
Mw/Mn=1.77

This polymer is designated Polymer 12.

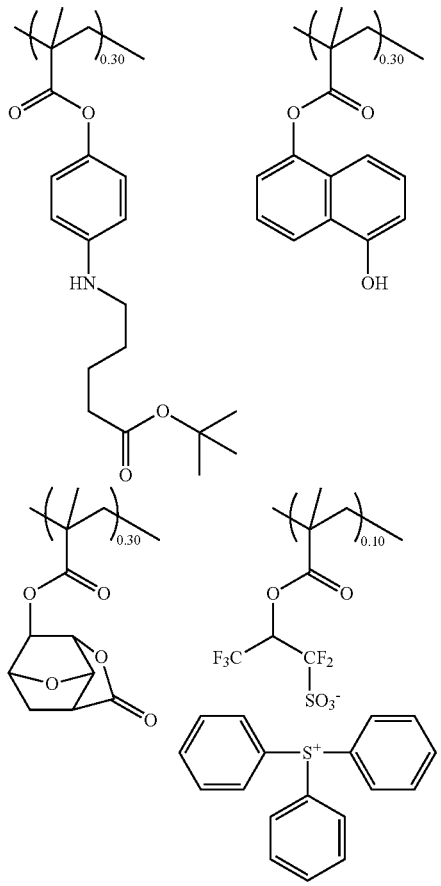

Polymer 12

Comparative Synthesis Example 1

A polymer was synthesized by the same procedure as in the above Synthesis Examples. The polymer was analyzed by $^{13}C$- and $^1H$-NMR and GPC, with the results shown below.

Copolymer Compositional Ratio (Molar Ratio)
4-hydroxystyrene:4-ethoxyethoxystyrene=0.70:0.30
Mw=9,600
Mw/Mn=1.78
This polymer is designated Comparative Polymer 1.

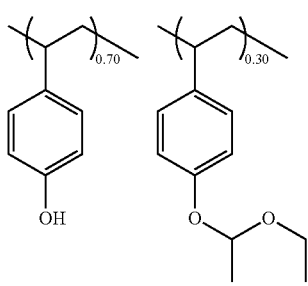

Comparative Polymer 1

Comparative Synthesis Example 2

A polymer was synthesized by the same procedure as in the above Synthesis Examples. The polymer was analyzed by $^{13}C$- and $^1H$-NMR and GPC, with the results shown below.

Copolymer Compositional Ratio (Molar Ratio)
tert-butyl acrylate:hydroxystyrene:styrene=0.30:0.50:0.20
Mw=9,200
Mw/Mn=1.93
This polymer is designated Comparative Polymer 2.

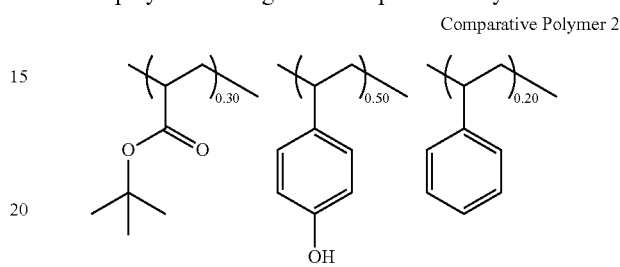

Comparative Polymer 2

Examples and Comparative Examples

A dual-tone resist composition was prepared by dissolving each polymer (Polymers 1 to 12) and other components in a solvent in accordance with the recipe shown in Table 1, and filtering through a filter with a pore size of 0.2 µm. The solvent contained 100 ppm of surfactant FC-4430 (3M-Sumitomo Co., Ltd.).

The components in Table 1 are identified below.
Polymers 1 to 12: Polymers obtained in Synthesis Examples 1 to 12
Comparative Polymers 1 and 2:
  Polymers obtained in Comparative Synthesis Examples 1 and 2
Organic solvent: propylene glycol monomethyl ether acetate (PGMEA)
  propylene glycol monomethyl ether (PGME)
  cyclohexanone (CyH)
  cyclopentanone (CyP)
Acid generator: PAG1 to PAG3 of the structural formula below
Crosslinker: CR1 of the structural formula below
Basic compound: Amine 1 of the structural formula below

PAG1

-continued

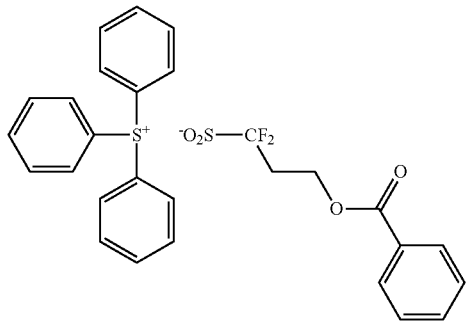

PAG2

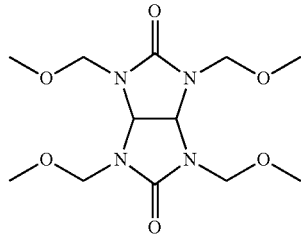

CR1

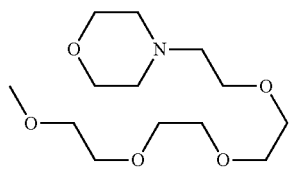

PAG3

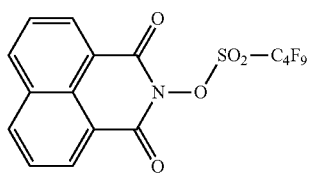

Amine 1

KrF Exposure Test 1

Figure 10:
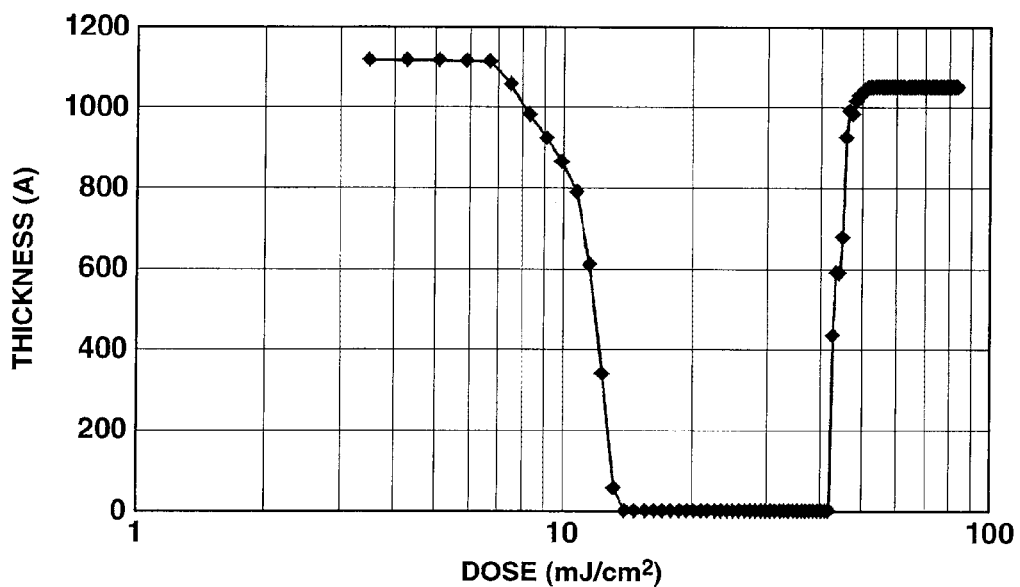
FIG. 10 is a diagram showing thickness versus dose of a resist film of Example Resist 1.
Figure 11:
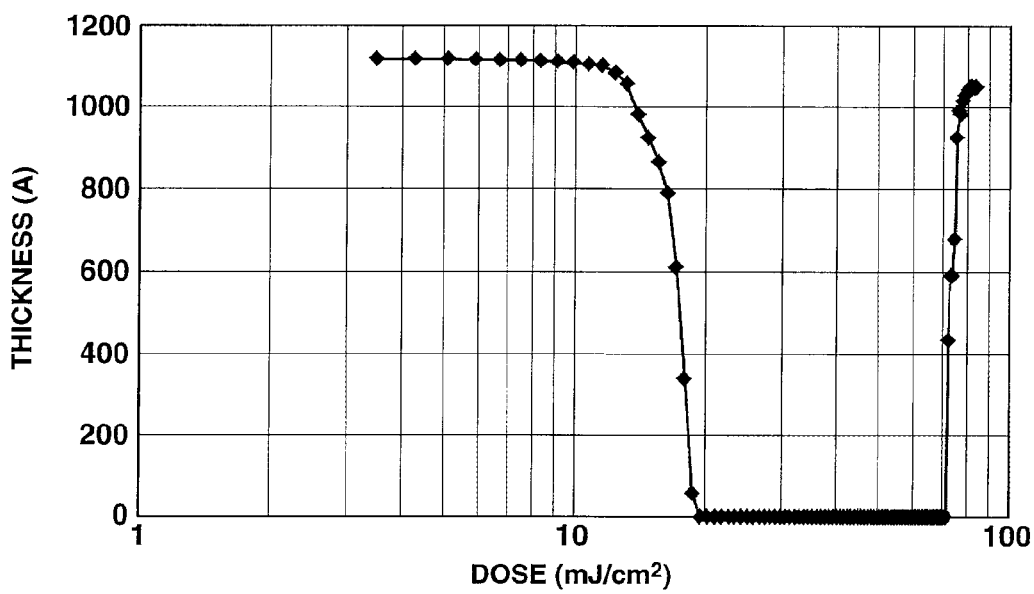
FIG. 11 is a diagram showing thickness versus dose of a resist film of Comparative Example Resist 1.
Figure 12:
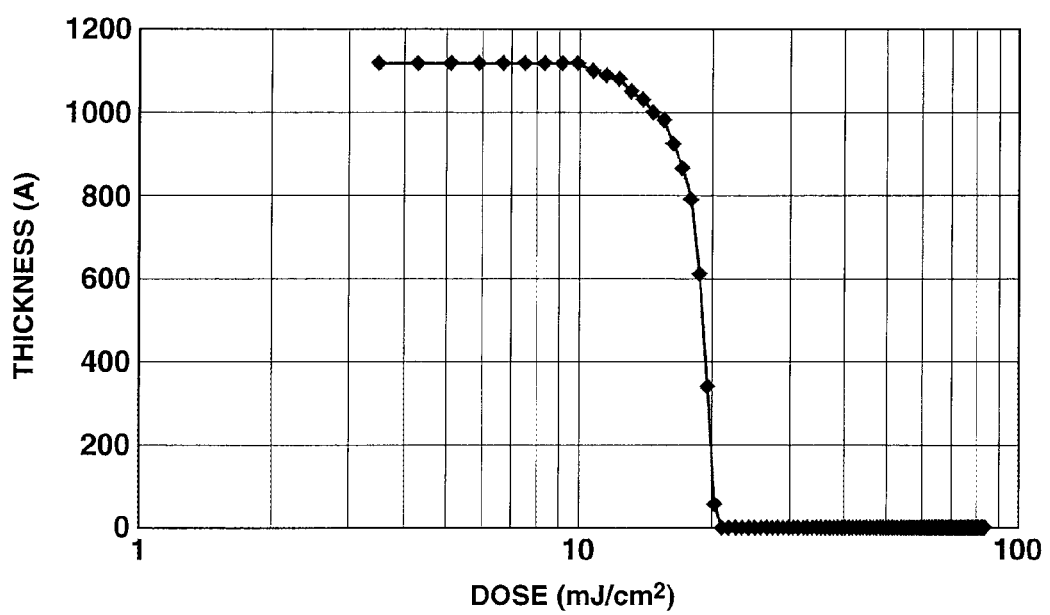
FIG. 12 is a diagram showing thickness versus dose of a resist film of Comparative Example Resist 2.

A silicon substrate of 8-inch diameter was coated with an antireflective coating of 61 nm thick (DUV-42, Nissan Chemical Industries, Ltd.). The resist composition in Table 1 was spin coated on the substrate and prebaked on a hot plate at 110° C. for 60 seconds to form a resist film of 110 nm thick. Using a KrF excimer laser scanner S203B (Nikon Corp., NA 0.68, σ 0.75, ordinary illumination), the wafer was open-frame exposed in a varying dose. This was followed by PEB at the temperature shown in Table 1 and development in a 2.38 wt % TMAH aqueous solution for 30 seconds. The thickness of the resist film as developed was measured. The results of film thickness measurement of Example Resist 1, Comparative Example Resist 1 and Comparative Example Resist 2 are shown in FIGS. 10, 11, and 12, respectively.

TABLE 1

| | Resist | Polymer (pbw) | Acid generator/ crosslinker (pbw) | Basic compound (pbw) | Organic solvent (pbw) | PEB temp. (° C.) |
|---|---|---|---|---|---|---|
| Example 1-1 | Example Resist 1 | Polymer 1 (100) | PAG1 (10) | Amine 1 (1.0) | PGMEA (2,000) | 100 |
| Comparative Example 1-1 | Comparative Example Resist 1 | Comparative Polymer 1 (100) | PAG2 (6) PAG3 (4) CR1 (10) | Amine 1 (1.0) | PGMEA (2,000) | 100 |
| Comparative Example 1-2 | Comparative Example Resist 2 | Comparative Polymer 2 (100) | PAG1 (10) | Amine 1 (1.0) | PGMEA (2,000) | 100 |

KrF Exposure Test 2

A silicon wafer of 8-inch diameter was coated with an antireflective coating of 61 nm thick (DUV-42, Nissan Chemical Industries, Ltd.). The resist composition capable of dual-tone response in Table 1 was spin coated onto the wafer and prebaked on a hot plate at 110° C. for 60 seconds to form a resist film of 110 nm thick. Using a KrF excimer laser scanner S203B (Nikon Corp., NA 0.68, σ 0.75, 2/3 annular illumination), the wafer was exposed through a 6% halftone phase shift mask having a pattern of isolated white lines of 130 nm wide (on-wafer size).

The wafer was baked (PEB) at the temperature shown in Table 2 and developed in a 2.38 wt % TMAH aqueous solution for 30 seconds. When a positive tone resist material was processed by the above-mentioned combination of illumination and mask, a trench pattern was formed. On use of the dual-tone resist composition, a line was formed at the center of one trench and as a result, two trenches were formed. The sensitivity and LWR at which two trenches were formed were measured using CD-SEM S-9200 (Hitachi High-Technologies, Ltd.), with the results shown in Table 2.

TABLE 2

| | Resist | PEB temperature (° C.) | Sensitivity (mJ/cm$^2$) | LWR (nm) |
|---|---|---|---|---|
| Example 2-1 | Example Resist 1 | 100 | 45 | 8.7 |
| Comparative Example 2-1 | Comparative Example Resist 1 | 100 | 55 | 10.5 |

EB Writing Test

A silicon substrate having a diameter of 6 inches was vapor primed with hexamethyldisilazane (HMDS). Using a coater/developer system Clean Track Mark 5 (Tokyo Electron Ltd.), the dual-tone resist composition in Table 3 was spin coated onto the substrate and pre-baked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber under conditions that ensured formation of isolated spaces from positive resist.

Using Clean Track Mark 5, immediately after the imagewise exposure, the resist film was baked (PEB) on a hot plate at the temperature shown in Table 3 for 60 seconds and puddle developed in a 2.38 wt % TMAH aqueous solution for 30 seconds to form a dual-tone pattern including two spaces of 50 nm wide on opposite sides of a center line of 50 nm wide.

The resulting resist pattern was evaluated as follows. The edge roughness (LWR) of the center line was measured under SEM. The sensitivity and resolution on EB lithography are shown in Table 3 together with the formulation of resist composition.

TABLE 3

| | Polymer (pbw) | Acid generator/ crosslinker (pbw) | Basic compound (pbw) | Organic solvent (pbw) | PEB temp. (° C.) | Sensitivity (μC/cm$^2$) | LWR (nm) |
|---|---|---|---|---|---|---|---|
| Example 3-1 | Polymer 1 (100) | PAG1 (15) | Amine 1 (1.0) | PGMEA(1,500) CyH(200) | 90 | 44 | 6.7 |
| Example 3-2 | Polymer 2 (100) | PAG1 (15) CR1 (5) | Amine 1 (1.0) | PGMEA(1,500) CyH(200) | 85 | 47 | 6.8 |
| Example 3-3 | Polymer 3 (100) | PAG1 (15) | Amine 1 (1.0) | PGMEA(1,500) CyH(200) | 95 | 49 | 6.9 |
| Example 3-4 | Polymer 4 (100) | PAG1 (15) | Amine 1 (1.0) | PGMEA(1,500) CyH(200) | 90 | 46 | 6.8 |
| Example 3-5 | Polymer 5 (100) | PAG1 (15) | Amine 1 (1.0) | PGMEA(1,500) CyH(200) | 95 | 46 | 6.4 |
| Example 3-6 | Polymer 6 (100) | PAG1 (15) | Amine 1 (1.0) | PGMEA(1,500) CyH(200) | 95 | 48 | 6.6 |
| Example 3-7 | Polymer 7 (100) | PAG1 (15) | Amine 1 (1.0) | PGMEA(1,500) CyH(200) | 90 | 46 | 7.3 |
| Example 3-8 | Polymer 8 (100) | PAG1 (15) | Amine 1 (1.0) | PGMEA(1,500) CyH(200) | 90 | 46 | 6.7 |
| Example 3-9 | Polymer 9 (100) | PAG1 (15) | Amine 1 (1.0) | PGMEA(1,500) CyH(200) | 95 | 43 | 7.0 |
| Example 3-10 | Polymer 10 (100) | PAG1 (15) | Amine 1 (1.0) | PGMEA(1,500) CyH(200) | 90 | 34 | 6.5 |
| Example 3-11 | Polymer 11 (100) | — | Amine 1 (1.0) | PGMEA(300) CyH(1,450) CyP(250) | 100 | 38 | 5.3 |
| Example 3-12 | Polymer 12 (100) | — | Amine 1 (1.0) | PGMEA(500) CyH(1,450) PGME(50) | 100 | 39 | 5.5 |
| Comparative Example 3-1 | Comparative Polymer 1 (100) | PAG2 (10) PAG3 (4) CR1 (10) | Amine 1 (1.0) | PGMEA(1,500) CyH(200) | 95 | 54 | 8.9 |

As seen from Tables 1 to 3, the resist composition within the scope of the invention is a dual-tone resist material displaying both positive and negative tone responses, meets satisfactory resolution, sensitivity and edge roughness surpassing the prior art dual-tone resist material having a crosslinker added thereto. Using a copolymer having an acid generator copolymerized therein, the resolution and edge roughness are significantly improved.

Japanese Patent Application No. 2013-245663 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a polymer comprising recurring units (a) of the general formula (1) and having a weight average molecular weight of 1,000 to 500,000 as base resin, an organic solvent and an acid generator,

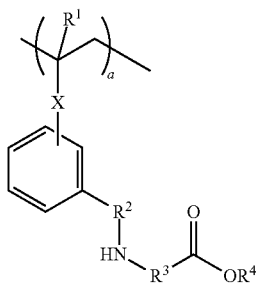

(1)

wherein $R^1$ is hydrogen or methyl, X is a single bond or —C(=O)—O—$R^5$—, $R^2$ is a single bond or $C_1$-$C_4$ alkylene group, $R^3$ is a linear $C_3$-$C_8$ alkylene group, $R^4$ is an acid labile group, $R^5$ is a single bond or $C_1$-$C_4$ alkylene group, and a is in the range: 0<a≤1.0, said acid labile group being selected from among substituent groups of the following formulae (A-1) to (A-3):

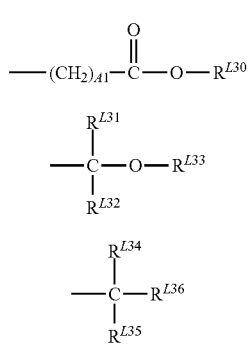

wherein $R^{L30}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (A-3), letter A1 is an integer of 0 to 6, $R^{L31}$ and $R^{L32}$ are hydrogen or straight, branched or cyclic alkyl groups of 1 to 18 carbon atoms, $R^{L33}$ is a monovalent hydrocarbon group of 1 to 18 carbon atoms which may contain a heteroatom, or a pair of $R^{L31}$ and $R^{L32}$, $R^{L31}$ and $R^{L33}$, or $R^{L32}$ and $R^{L33}$ may bond together to form a ring having 3 to 10 carbon atoms with the carbon and oxygen atoms to which they are attached, and $R^{L34}$, $R^{L35}$ and $R^{L36}$ each are a straight, branched or cyclic $C_1$-$C_{20}$ alkyl group or straight, branched or cyclic $C_2$-$C_{20}$ alkenyl group which may contain a heteroatom, or a pair of $R^{L34}$ and $R^{L35}$, $R^{L34}$ and $R^{L36}$, or $R^{L35}$ and $R^{L36}$ may bond together to form a $C_3$-$C_{20}$ aliphatic ring with the carbon atom to which they are attached.

2. The resist composition of claim 1 wherein the polymer further comprises recurring units of at least one type selected from the group consisting of a vinylnaphthalene (b1), indene (b2), acenaphthylene (b3), chromone (b4), coumarin (b5), norbornadiene (b6), and vinylcarbazole (b7), as represented by the general formula (2):

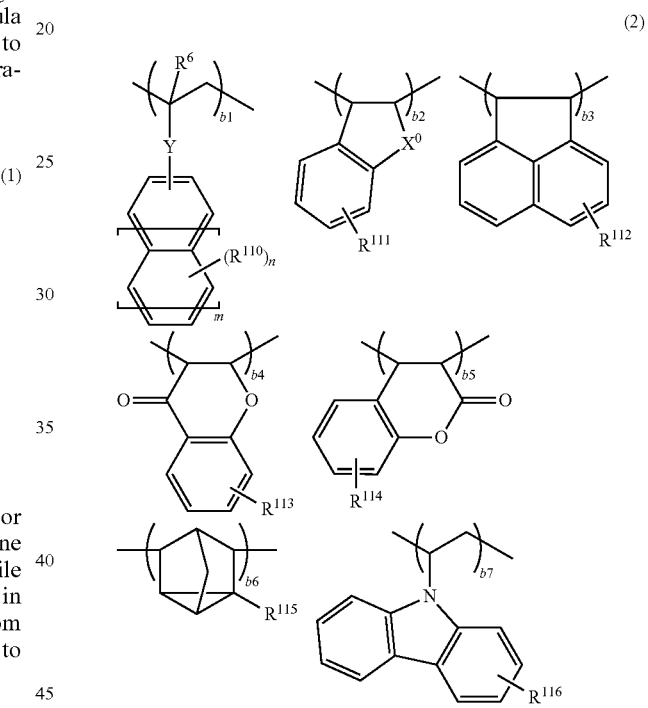

(2)

wherein $R^6$ is hydrogen or methyl, m is an integer of 0 to 2, n is an integer of 0 to 5, $R^{110}$ to $R^{116}$ are each independently hydrogen, $C_1$-$C_{30}$ alkyl, partially or entirely halo-substituted alkyl the alkyl and halo-substituted alkyl optionally having an alkyl-substituted or unsubstituted hydroxyl or carboxyl group, hydroxyl, $C_1$-$C_4$ alkoxy, acyl, acyloxy, alkoxycarbonyl, $C_6$-$C_{10}$ aryl, halogen, or 1,1,1,3,3,3-hexafluoro-2-propanol group, Y is a single bond, —O—, —S—, —C(=O)—O—$R^7$—, or —C(=O)—NH—$R^7$—, $R^7$ is a single bond or $C_1$-$C_4$ alkylene group, $X^0$ is methylene, oxygen or sulfur atom; b1 to b7 are numbers in the range: 0≤b1<1.0, 0≤b2<1.0, 0≤b3<1.0, 0≤b4<1.0, 0≤b5<1.0, 0≤b6<1.0, 0≤b7<1.0, 0<b1+b2+b3+b4+b5+b6+b7<1.0, 0<a<1.0, and 0<a+b1+b2+b3+b4+b5+b6+b7≤1.0.

3. The resist composition of claim 1, further comprising a basic compound and/or a surfactant.

4. The resist composition of claim 1 which forms a resist film which is subjected to exposure and development, the composition displaying both positive and negative tone responses, that is, being of dual-tone type in that an intermediate dose region of the resist film is dissolved in a developer, but low and high dose regions of the resist film are left after development.

5. A pattern forming process comprising the steps of applying the resist composition of claim 1 onto a substrate, prebaking the composition to form a resist film, exposing the resist film to high-energy radiation, and developing in a developer.

6. The pattern forming process of claim 5 wherein the high-energy radiation is g-line of wavelength 430 nm, i-line of 365 nm, KrF excimer laser of 248 nm, EB, or soft X-ray in a wavelength range of 3 to 15 nm.

7. The pattern forming process of claim 5 wherein the developer is an alkaline developer.

8. A chemically amplified resist composition comprising a polymer comprising recurring units (a) of the general formula (1) and recurring units (d1), (d2) or (d3) of the general formula (3) and having a weight average molecular weight of 1,000 to 500,000 as base resin, and an organic solvent,

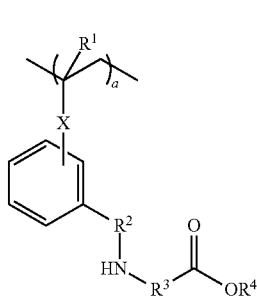

(1)

wherein $R^1$ is hydrogen or methyl, X is a single bond or —C(=O)—O—$R^5$—, $R^2$ is a single bond or $C_1$-$C_4$ alkylene group, $R^3$ is a linear $C_3$-$C_8$ alkylene group, $R^4$ is an acid labile group, $R^5$ is a single bond or $C_1$-$C_4$ alkylene group, and a is in the range: 0<a<1.0, said acid labile group being selected from among substituent groups of the following formulae (A-1) to (A-3):

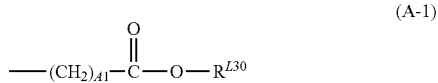

(A-1)

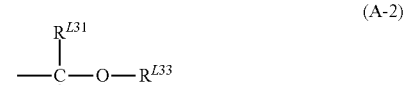

(A-2)

(A-3)

wherein $R^{L30}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (A-3), letter A1 is an integer of 0 to 6, $R^{L31}$ and $R^{L32}$ are hydrogen or straight, branched or cyclic alkyl groups of 1 to 18 carbon atoms, $R^{L33}$ is a monovalent hydrocarbon group of 1 to 18 carbon atoms which may contain a heteroatom, or a pair of $R^{L31}$ and $R^{L32}$, $R^{L31}$ and $R^{L33}$, or $R^{L32}$ and $R^{L33}$ may bond together to form a ring having 3 to 10 carbon atoms with the carbon and oxygen atoms to which they are attached, and $R^{L34}$, $R^{L35}$ and $R^{L36}$ each are a straight, branched or cyclic $C_1$-$C_{20}$ alkyl group or straight, branched or cyclic $C_2$-$C_{20}$ alkenyl group which may contain a heteroatom, or a pair of $R^{L34}$ and $R^{L35}$, $R^{L34}$ and $R^{L36}$, or $R^{L35}$ and $R^{L36}$ may bond together to form a $C_3$-$C_{20}$ aliphatic ring with the carbon atom to which they are attached,

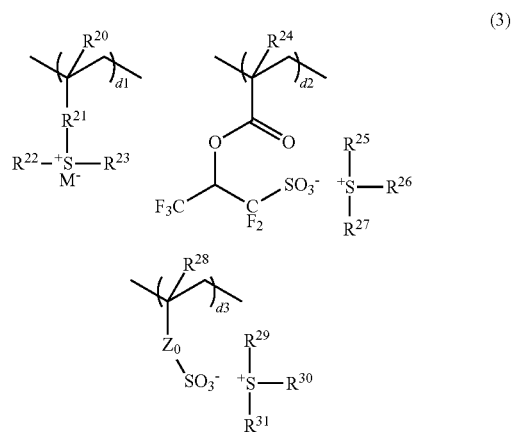

(3)

wherein $R^{20}$, $R^{24}$, and $R^{28}$ each are hydrogen or methyl, $R^{21}$ is a single bond, phenylene, —O—R—, or —C(=O)—$Y_0$—R—, $Y_0$ is oxygen or NH, R is a straight, branched or cyclic $C_1$-$C_6$ alkylene group, alkenylene group or phenylene group, which may contain a carbonyl (—CO—), ester (—COO—), ether (—O—), or hydroxyl moiety, $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $Z_0$ is a single bond, methylene, ethylene, phenylene, fluorinated phenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene group, alkenylene group or phenylene group, which may contain a carbonyl, ester, ether or hydroxyl moiety, and $M^-$ is a non-nucleophilic counter ion.

9. The resist composition of claim 8 wherein the polymer further comprises recurring units of at least one type selected from the group consisting of a vinylnaphthalene (b1), indene (b2), acenaphthylene (b3), chromone (b4), coumarin (b5), norbornadiene (b6), and vinylcarbazole (b7), as represented by the general formula (2):

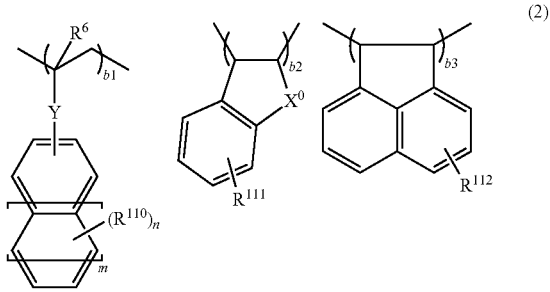

(2)

-continued

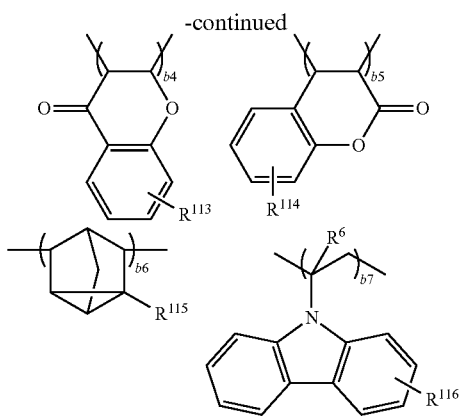

wherein $R^6$ is hydrogen or methyl, m is an integer of 0 to 2, n is an integer of 0 to 5, $R^{110}$ to $R^{116}$ are each independently hydrogen, $C_1$-$C_{30}$ alkyl, partially or entirely halo-substituted alkyl (the alkyl and halo-substituted alkyl optionally having an alkyl-substituted or unsubstituted hydroxyl or carboxyl group), hydroxyl, $C_1$-$C_4$ alkoxy, acyl, acyloxy, alkoxycarbonyl, $C_6$-$C_{10}$ aryl, halogen, or 1,1,1,3,3,3-hexafluoro-2-propanol group, Y is a single bond, —O—, —S—, —C(=O)—O—$R^7$—, or —C(=O)—NH—$R^7$—, $R^7$ is a single bond or $C_1$-$C_4$ alkylene group, $X^0$ is methylene, oxygen or sulfur atom; b1 to b7 are numbers in the range: $0 \le b1 < 1.0$, $0 \le b2 < 1.0$, $0 \le b3 < 1.0$, $0 \le b4 < 1.0$, $0 \le b5 < 1.0$, $0 \le b6 < 1.0$, $0 \le b7 < 1.0$, $0 < b1+b2+b3+b4+b5+b6+b7 < 1.0$, $0 < a < 1.0$, and $0 < a+b1+b2+b3+b4+b5+b6+b7 \le 1.0$.

10. The resist composition of claim 8, further comprising a basic compound and/or a surfactant.

11. The resist composition of claim 8 which forms a resist film which is subjected to exposure and development, the composition displaying both positive and negative tone responses, that is, being of dual-tone type in that an intermediate dose region of the resist film is dissolved in a developer, but low and high dose regions of the resist film are left after development.

12. A pattern forming process comprising the steps of applying the resist composition of claim 8 onto a substrate, prebaking the composition to form a resist film, exposing the resist film to high-energy radiation, and developing in a developer.

13. The pattern forming process of claim 12 wherein the high-energy radiation is g-line of wavelength 430 nm, i-line of 365 nm, KrF excimer laser of 248 nm, EB, or soft X-ray in a wavelength range of 3 to 15 nm.

14. The pattern forming process of claim 12 wherein the developer is an alkaline developer.

* * * * *